US009947408B2

(12) United States Patent
Shano et al.

(10) Patent No.: US 9,947,408 B2
(45) Date of Patent: Apr. 17, 2018

(54) SEMICONDUCTOR MEMORY DEVICE THAT APPLIES SAME VOLTAGE TO TWO ADJACENT WORD LINES FOR ACCESS

(71) Applicant: Toshiba Memory Corporation, Tokyo (JP)

(72) Inventors: Toshifumi Shano, Fujisawa Kanagawa (JP); Masanobu Shirakawa, Chigasaki Kanagawa (JP); Tokumasa Hara, Kawasaki Kanagawa (JP)

(73) Assignee: Toshiba Memeory Corporation, Tokyo (JP)

( * ) Notice: Subject to any disclaimer, the term of this patent is extended or adjusted under 35 U.S.C. 154(b) by 0 days.

(21) Appl. No.: 15/055,232

(22) Filed: Feb. 26, 2016

(65) Prior Publication Data

US 2016/0260483 A1 Sep. 8, 2016

(30) Foreign Application Priority Data

Mar. 2, 2015 (JP) .................................. 2015-040714

(51) Int. Cl.
*G11C 16/26* (2006.01)
*G11C 16/10* (2006.01)
(Continued)

(52) U.S. Cl.
CPC .............. *G11C 16/08* (2013.01); *G11C 7/106* (2013.01); *G11C 7/1087* (2013.01);
(Continued)

(58) Field of Classification Search
CPC ...... G11C 29/804; G11C 29/82; G11C 29/848
See application file for complete search history.

(56) References Cited

U.S. PATENT DOCUMENTS 5,548,557 A * 8/1996 Futatsuya .............. G11C 16/08
365/185.09
5,602,778 A * 2/1997 Futatsuya .............. G11C 16/08
365/185.09
(Continued)

FOREIGN PATENT DOCUMENTS

JP H0798996 A 4/1995
JP H1196781 A 4/1999
(Continued)

OTHER PUBLICATIONS

Japanese Office Action dated Oct. 31, 2017, filed in Japanese counterpart Application No. 2015-040714, 11 pages (with translation).

Primary Examiner — Huan Hoang
Assistant Examiner — Roberto Mancera, Jr.
(74) Attorney, Agent, or Firm — Patterson & Sheridan, LLP

(57) ABSTRACT

A semiconductor memory device includes a block of memory cells including first, second, and third memory cells, a first word line electrically connected to a gate of the first memory cell, a second word line electrically connected to a gate of the second memory cell, a third word line electrically connected to a gate of the third memory cell, and a control circuit configured to access the block in one of at least first and second modes to perform an operation thereon. When the control circuit accesses the block in the first mode, the same voltage is applied to the first and second word lines throughout the operation, and when the control circuit accesses the block in the second mode, the same voltage is applied to the second and third word lines throughout the operation.

16 Claims, 38 Drawing Sheets

(51) Int. Cl.
  *G11C 16/34* (2006.01)
  *G11C 16/08* (2006.01)
  *G11C 16/16* (2006.01)
  *G11C 29/00* (2006.01)
  *G11C 7/10* (2006.01)
  *G11C 16/04* (2006.01)

(52) U.S. Cl.
  CPC .......... *G11C 16/0483* (2013.01); *G11C 16/10* (2013.01); *G11C 16/16* (2013.01); *G11C 16/26* (2013.01); *G11C 16/3445* (2013.01); *G11C 29/804* (2013.01); *G11C 29/82* (2013.01); *G11C 29/848* (2013.01)

(56) References Cited

U.S. PATENT DOCUMENTS

| | | | |
|---|---|---|---|
| 8,526,241 B2 * | 9/2013 | Shirakawa | G11C 16/0483 365/185.11 |
| 8,902,657 B2 * | 12/2014 | Iwai | H01L 27/1157 365/185.11 |
| 9,355,735 B1 * | 5/2016 | Chen | G11C 8/14 |
| 9,627,077 B2 | 4/2017 | Shirakawa | |
| 2010/0008150 A1 | 1/2010 | Hazama | |
| 2012/0069655 A1 | 3/2012 | Hishida et al. | |
| 2012/0243309 A1 | 9/2012 | Asaoka et al. | |
| 2014/0218999 A1 | 8/2014 | Sasago et al. | |

FOREIGN PATENT DOCUMENTS

| | | | |
|---|---|---|---|
| JP | 2011-258289 A | 12/2011 | |
| JP | 2014186761 A | 10/2014 | |

\* cited by examiner

FIG. 4

| Page address | FNG No. | WL No. | Page  |
|--------------|---------|--------|-------|
| 00           | 0       | 0      | Lower |
| 01           | 0       | 0      | Upper |
| 02           | 1       | 0      | Lower |
| 03           | 1       | 0      | Upper |
| 04           | 0       | 1      | Lower |
| 05           | 0       | 1      | Upper |
| 06           | 1       | 1      | Lower |
| 07           | 1       | 1      | Upper |
| 08           | 0       | 2      | Lower |
| 09           | 0       | 2      | Upper |
| 10           | 1       | 2      | Lower |
| 11           | 1       | 2      | Upper |
| 12           | 0       | 3      | Lower |
| 13           | 0       | 3      | Upper |
| 14           | 1       | 3      | Lower |
| 15           | 1       | 3      | Upper |
| 16           | 0       | 4      | Lower |
| 17           | 0       | 4      | Upper |
| 18           | 1       | 4      | Lower |
| 19           | 1       | 4      | Upper |
| 20           | 0       | 5      | Lower |
| 21           | 0       | 5      | Upper |
| 22           | 1       | 5      | Lower |
| 23           | 1       | 5      | Upper |
| 24           | 0       | 6      | Lower |
| 25           | 0       | 6      | Upper |
| 26           | 1       | 6      | Lower |
| 27           | 1       | 6      | Upper |
| 28           | 0       | 7      | Lower |
| 29           | 0       | 7      | Upper |
| 30           | 1       | 7      | Lower |
| 31           | 1       | 7      | Upper |
| 32           | 0       | 8      | Lower |
| 33           | 0       | 8      | Upper |
| 34           | 1       | 8      | Lower |
| 35           | 1       | 8      | Upper |
| 36           | 0       | 9      | Lower |
| 37           | 0       | 9      | Upper |
| 38           | 1       | 9      | Lower |
| 39           | 1       | 9      | Upper |
| 40           | 0       | 10     | Lower |
| 41           | 0       | 10     | Upper |
| 42           | 1       | 10     | Lower |
| 43           | 1       | 10     | Upper |
| 44           | 0       | 11     | Lower |
| 45           | 0       | 11     | Upper |
| 46           | 1       | 11     | Lower |
| 47           | 1       | 11     | Upper |
| 48           | 0       | 12     | Lower |
| 49           | 0       | 12     | Upper |
| 50           | 1       | 12     | Lower |
| 51           | 1       | 12     | Upper |
| 52           | 0       | 13     | Lower |
| 53           | 0       | 13     | Upper |
| 54           | 1       | 13     | Lower |
| 55           | 1       | 13     | Upper |
| 56           | 0       | 14     | Lower |
| 57           | 0       | 14     | Upper |
| 58           | 1       | 14     | Lower |
| 59           | 1       | 14     | Upper |
| 60           | 0       | 15     | Lower |
| 61           | 0       | 15     | Upper |
| 62           | 1       | 15     | Lower |
| 63           | 1       | 15     | Upper |
| 64           | 0       | 16     | Lower |
| 65           | 0       | 16     | Upper |
| 66           | 1       | 16     | Lower |
| 67           | 1       | 16     | Upper |
| 68           | 0       | 17     | Lower |
| 69           | 0       | 17     | Upper |
| 70           | 1       | 17     | Lower |
| 71           | 1       | 17     | Upper |
| 72           | 0       | 18     | Lower |
| 73           | 0       | 18     | Upper |
| 74           | 1       | 18     | Lower |
| 75           | 1       | 18     | Upper |
| 76           | 0       | 19     | Lower |
| 77           | 0       | 19     | Upper |
| 78           | 1       | 19     | Lower |
| 79           | 1       | 19     | Upper |
| 80           | 0       | 20     | Lower |
| 81           | 0       | 20     | Upper |
| 82           | 1       | 20     | Lower |
| 83           | 1       | 20     | Upper |
| 84           | 0       | 21     | Lower |
| 85           | 0       | 21     | Upper |
| 86           | 1       | 21     | Lower |
| 87           | 1       | 21     | Upper |
| 88           | 0       | 22     | Lower |
| 89           | 0       | 22     | Upper |
| 90           | 1       | 22     | Lower |
| 91           | 1       | 22     | Upper |
| 92           | 0       | 23     | Lower |
| 93           | 0       | 23     | Upper |
| 94           | 1       | 23     | Lower |
| 95           | 1       | 23     | Upper |

FIG. 6

| Page address | FNG No. | WL No. | Page |
|---|---|---|---|
| 00 | 0 | 0 and 1 | Lower |
| 01 | 0 | 0 and 1 | Upper |
| 02 | 1 | 0 and 1 | Lower |
| 03 | 1 | 0 and 1 | Upper |
| 04 | 0 | 2 and 3 | Lower |
| 05 | 0 | 2 and 3 | Upper |
| 06 | 1 | 2 and 3 | Lower |
| 07 | 1 | 2 and 3 | Upper |
| 08 | 0 | 4 and 5 | Lower |
| 09 | 0 | 4 and 5 | Upper |
| 10 | 1 | 4 and 5 | Lower |
| 11 | 1 | 4 and 5 | Upper |
| 12 | 0 | 6 and 7 | Lower |
| 13 | 0 | 6 and 7 | Upper |
| 14 | 1 | 6 and 7 | Lower |
| 15 | 1 | 6 and 7 | Upper |
| 16 | 0 | 8 and 9 | Lower |
| 17 | 0 | 8 and 9 | Upper |
| 18 | 1 | 8 and 9 | Lower |
| 19 | 1 | 8 and 9 | Upper |
| 20 | 0 | 10 and 11 | Lower |
| 21 | 0 | 10 and 11 | Upper |
| 22 | 1 | 10 and 11 | Lower |
| 23 | 1 | 10 and 11 | Upper |
| 24 | 0 | 12 and 13 | Lower |
| 25 | 0 | 12 and 13 | Upper |
| 26 | 1 | 12 and 13 | Lower |
| 27 | 1 | 12 and 13 | Upper |
| 28 | 0 | 14 and 15 | Lower |
| 29 | 0 | 14 and 15 | Upper |
| 30 | 1 | 14 and 15 | Lower |
| 31 | 1 | 14 and 15 | Upper |
| 32 | 0 | 16 and 17 | Lower |
| 33 | 0 | 16 and 17 | Upper |
| 34 | 1 | 16 and 17 | Lower |
| 35 | 1 | 16 and 17 | Upper |
| 36 | 0 | 18 and 19 | Lower |
| 37 | 0 | 18 and 19 | Upper |
| 38 | 1 | 18 and 19 | Lower |
| 39 | 1 | 18 and 19 | Upper |
| 40 | 0 | 20 and 21 | Lower |
| 41 | 0 | 20 and 21 | Upper |
| 42 | 1 | 20 and 21 | Lower |
| 43 | 1 | 20 and 21 | Upper |
| 44 | 0 | 22 and 23 | Lower |
| 45 | 0 | 22 and 23 | Upper |
| 46 | 1 | 22 and 23 | Lower |
| 47 | 1 | 22 and 23 | Upper |

FIG. 8

| Page address | FNG No. | WL No. | Page |
|---|---|---|---|
| 00 | 0 | 1 and 2 | Lower |
| 01 | 0 | 1 and 2 | Upper |
| 02 | 1 | 1 and 2 | Lower |
| 03 | 1 | 1 and 2 | Upper |
| 04 | 0 | 3 and 4 | Lower |
| 05 | 0 | 3 and 4 | Upper |
| 06 | 1 | 3 and 4 | Lower |
| 07 | 1 | 3 and 4 | Upper |
| 08 | 0 | 5 and 6 | Lower |
| 09 | 0 | 5 and 6 | Upper |
| 10 | 1 | 5 and 6 | Lower |
| 11 | 1 | 5 and 6 | Upper |
| 12 | 0 | 7 and 8 | Lower |
| 13 | 0 | 7 and 8 | Upper |
| 14 | 1 | 7 and 8 | Lower |
| 15 | 1 | 7 and 8 | Upper |
| 16 | 0 | 9 and 10 | Lower |
| 17 | 0 | 9 and 10 | Upper |
| 18 | 1 | 9 and 10 | Lower |
| 19 | 1 | 9 and 10 | Upper |
| 20 | 0 | 11 and 12 | Lower |
| 21 | 0 | 11 and 12 | Upper |
| 22 | 1 | 11 and 12 | Lower |
| 23 | 1 | 11 and 12 | Upper |
| 24 | 0 | 13 and 14 | Lower |
| 25 | 0 | 13 and 14 | Upper |
| 26 | 1 | 13 and 14 | Lower |
| 27 | 1 | 13 and 14 | Upper |
| 28 | 0 | 15 and 16 | Lower |
| 29 | 0 | 15 and 16 | Upper |
| 30 | 1 | 15 and 16 | Lower |
| 31 | 1 | 15 and 16 | Upper |
| 32 | 0 | 17 and 18 | Lower |
| 33 | 0 | 17 and 18 | Upper |
| 34 | 1 | 17 and 18 | Lower |
| 35 | 1 | 17 and 18 | Upper |
| 36 | 0 | 19 and 20 | Lower |
| 37 | 0 | 19 and 20 | Upper |
| 38 | 1 | 19 and 20 | Lower |
| 39 | 1 | 19 and 20 | Upper |
| 40 | 0 | 21 and 22 | Lower |
| 41 | 0 | 21 and 22 | Upper |
| 42 | 1 | 21 and 22 | Lower |
| 43 | 1 | 21 and 22 | Upper |
| 44 | 0 | 23 | Lower |
| 45 | 0 | 23 | Upper |
| 46 | 1 | 23 | Lower |
| 47 | 1 | 23 | Upper |

FIG. 10

| BLK0 | "00" | ← NORMAL BLOCK |
|------|------|----------------|
| BLK1 | "01" | ← A-TYPE BLOCK |
| BLK2 | "10" | ← B-TYPE BLOCK |
| BLK3 | "11" | ← BAD BLOCK |
| ⋮ | ⋮ | |

VREAD≧VSG

VREAD≧VSG

SEMICONDUCTOR MEMORY DEVICE THAT APPLIES SAME VOLTAGE TO TWO ADJACENT WORD LINES FOR ACCESS

CROSS-REFERENCE TO RELATED APPLICATION

This application is based upon and claims the benefit of priority from Japanese Patent Application No. 2015-040714, filed Mar. 2, 2015, the entire contents of which are incorporated herein by reference.

FIELD

Embodiments described herein relate generally to a semiconductor memory device and a memory system.

BACKGROUND

A NAND type flash memory in which memory cells are arranged three dimensionally is known.

DESCRIPTION OF THE DRAWINGS

FIG. 4 is a table indicating a method of allocating page addresses in a normal block included in the semiconductor memory device according to the first embodiment.

FIG. 6 is a table indicating a method of allocating page addresses in an A-type block included in the semiconductor memory device according to the first embodiment.

FIG. 8 is a table indicating a method of allocating page addresses in a B-type block included in the semiconductor memory device according to the first embodiment.

FIG. 10 is a conceptual representation of a block table included in the semiconductor memory device according to the first embodiment.

DETAILED DESCRIPTION

Figure 1:
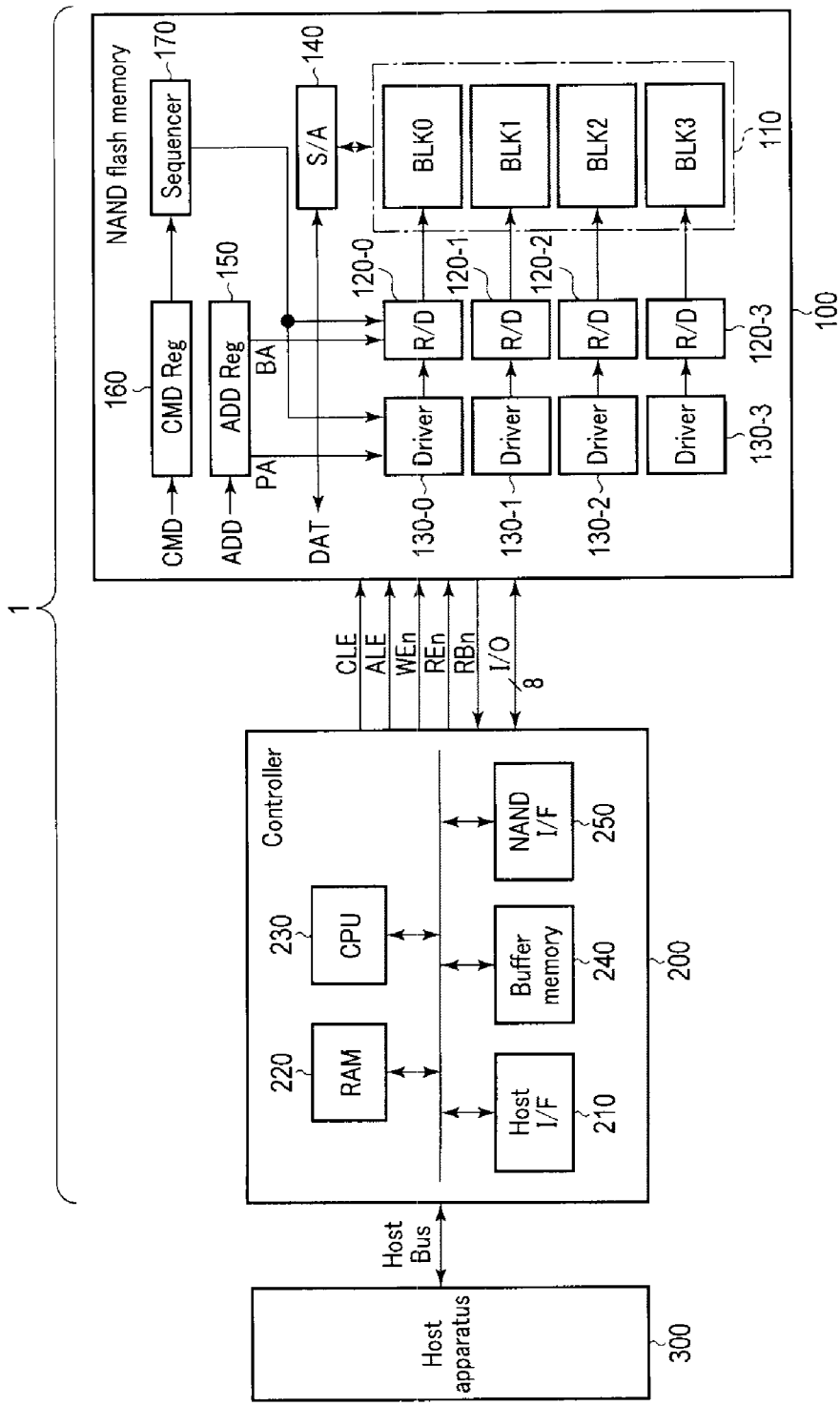
FIG. 1 is a block diagram illustrating a memory system according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor memory device and a memory system which are capable of efficiently reducing defects.

According to the exemplary embodiment, a semiconductor memory device includes a block of memory cells including first, second, and third memory cells, a first word line electrically connected to a gate of the first memory cell, a second word line electrically connected to a gate of the second memory cell, a third word line electrically connected to a gate of the third memory cell, and a control circuit configured to access the block in one of at least first and second modes to perform an operation thereon. When the control circuit accesses the block in the first mode, the same voltage is applied to the first and second word lines throughout the operation, and when the control circuit accesses the block in the second mode, the same voltage is applied to the second and third word lines throughout the operation.

Hereinafter, embodiments will be described with reference to the drawings. Note that, components which have the same function and configuration are denoted by the same reference numerals in the following description.

1. First Embodiment

A semiconductor memory device and a memory system according to the first embodiment will be described. In the following description, as a semiconductor memory device, a three-dimensional stacked NAND type flash memory in which memory cells are three-dimensionally stacked on a semiconductor substrate is depicted.

1.1 Configuration 1.1.1 Entire Configuration of Memory System

First, the entire configuration of a memory system which includes the semiconductor memory device according to the embodiment is schematically described with reference to FIG. 1. FIG. 1 is a block diagram illustrating the memory system according to the embodiment.

As illustrated in FIG. 1, the memory system 1 includes a NAND type flash memory 100 and a controller 200. The NAND type flash memory 100 and the controller 200 may be integrated as one semiconductor device, for example.

Examples thereof include a memory card such as SD™ card, and a solid state drive (SSD).

The NAND type flash memory 100 includes a plurality of memory cells, and stores data in a non-volatile manner. The controller 200 is connected to the NAND type flash memory 100 via a NAND bus, and connected to a host apparatus 300 via a host bus. In addition, the controller 200 controls the NAND type flash memory 100, and accesses the NAND type flash memory 100 in response to a command received from the host apparatus 300. The host apparatus 300 is, for example, a digital camera, a personal computer, or the like, and the host bus is, for example, an SD™ interface bus.

The NAND bus transmits signals to and from an NAND interface. Specifically, examples of this signal include an address latch enable signal ALE, a command latch enable signal CLE, a write enable signal WEn, a read enable signal REn, ready/busy signals RBn, and input and output signals I/O.

The signals CLE and ALE are signals notifying the NAND type flash memory 100 that each of the input signals I/O which is transmitted to the NAND type flash memory 100 is respectively a command and an address. The signal WEn is a signal which is asserted at a low level, and is for inputting the input signal I/O into the NAND type flash memory 100. The signal REn is also asserted at the low level, and is for reading out the output signal I/O from the NAND type flash memory 100. The ready/busy signal RBn represents whether the NAND type flash memory 100 is in a ready state (in a state of receiving a command from the controller 200) or a busy state (in a state in which a command cannot be received from the controller 200), and a low level represents a busy state. The input and output signals I/O are, for example, 8-bit signals. In addition, the input and output signals I/O represent data which is transmitted and received between the NAND type flash memory 100 and the controller 200, and examples thereof include a command, an address, write data, and read data.

1.1.2 Configuration of Controller 200

Subsequently, the configuration of the controller 200 will be described in detail with reference to FIG. 1. As illustrated in FIG. 1, the controller 200 includes a host interface circuit 210, an internal memory (RAM) 220, a processor (CPU) 230, a buffer memory 240, and an NAND interface circuit 250.

The host interface circuit 210 is connected to the host apparatus 300 via the host bus, and transmits the command and data which are received from the host apparatus 300 to each of the processor 230 and the buffer memory 240. In addition, data in the buffer memory 240 is transmitted to the host apparatus 300 in response to the command of the processor 230.

The processor 230 controls the entire operation of the controller 200. For example, when receiving a write command from the host apparatus 300, in response to the reception, the processor 230 issues the write command through the NAND interface circuit 250. The same is true for a case of reading and erasing operations. In addition, the processor 230 performs various processes such as wear leveling so as to manage the NAND type flash memory 100.

The NAND interface circuit 250 is connected to the NAND type flash memory 100 via the NAND bus, and communicates with the NAND type flash memory 100. In addition, the signals ALE, CLE, WEn, and REn are output to the NAND type flash memory 100 based on the command received from the processor 230. In addition, at the time of the writing operation, a write command issued by the processor 230, and the write data in the buffer memory 240 is transmitted to the NAND type flash memory 100 as the input and output signals I/O. Further, at the time of the reading operation, a read command issued by the processor 230 is transmitted to the NAND type flash memory 100 as the input and output signal I/O, and the data read from the NAND type flash memory 100 is received through the NAND interface circuit 250 as the input and output signals I/O and transmitted to the buffer memory 240.

The buffer memory 240 temporarily stores the write data or the read data.

The internal memory 220 is, for example, a semiconductor memory such as DRAM, and used as a working memory of the processor 230. In addition, the internal memory 220 stores firmware or various management tables in order to manage the NAND type flash memory 100.

1.1.3 Configuration of NAND Type Flash Memory 100

1.1.3.1 Entire Configuration of NAND Type Flash Memory 100

Next, the configuration of the NAND type flash memory 100 will be described. As illustrated in FIG. 1, the NAND type flash memory 100 includes a memory cell array 110, row decoders 120 (120-0 to 120-3), driver circuits 130 (130-0 to 130-3), a sense amplifier 140, an address register 150, a command register 160, and a sequencer 170.

The memory cell array 110 includes a plurality of non-volatile memory cells, each of which is associated with a row and a column, and grouped into, for example, four blocks BLK (BLK0 to BLK3). In addition, the memory cell array 110 stores data transmitted from the controller 200.

The row decoders 120-0 to 120-3 are provided corresponding to each of blocks BLK0 to BLK3, and select a row direction in the corresponding block BLK.

The driver circuits 130-0 to 130-3 are provided so as to be associated with each of the row decoders 120-0 to 120-3, and output a voltage to each of the blocks BLK0 to BLK3 via the corresponding row decoders 120-0 to 120-3.

The sense amplifier 140 senses data read from the memory cell array 110, and outputs data DAT to the controller 200 at the time of reading data. At the time of writing data, write data DAT received from the controller 200 is transmitted to the memory cell array 110.

The address register 150 retains an address ADD received from the controller 200. The command register 160 retains a command CMD received from the controller 200.

The sequencer 170 controls the entire operation of the NAND type flash memory 100 based on the command CMD which is retained in the command register 160.

1.1.3.2 Configuration of Block BLK

Figure 2:
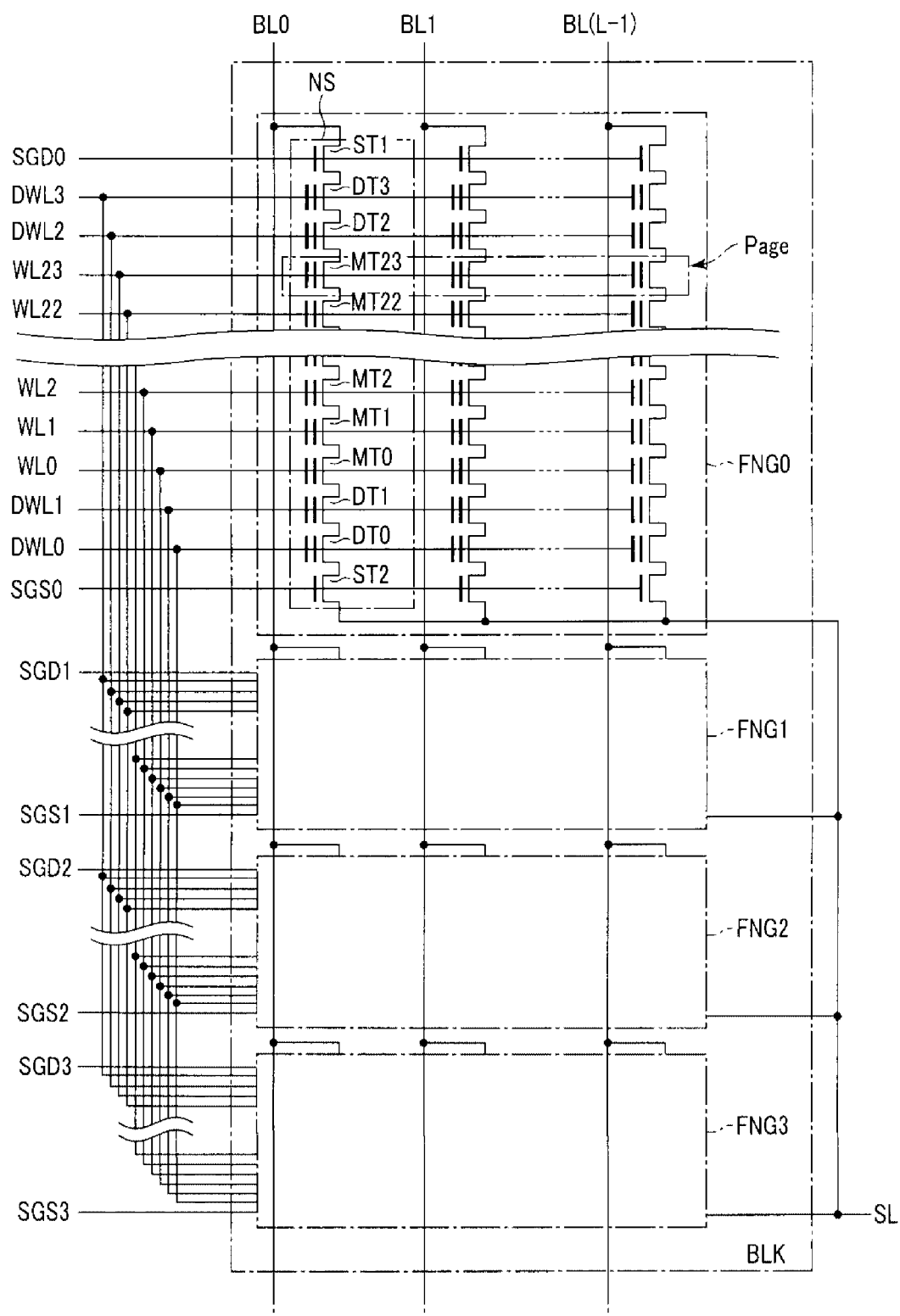
FIG. 2 is a circuit diagram illustrating a block included in a semiconductor memory device according to the first embodiment.

Next, the configuration of the block BLK will be described with reference to FIG. 2. FIG. 2 is a circuit diagram of the block BLK.

As illustrated in FIG. 2, the block BLK includes, for example, four fingers FNG (FNG0 to FNG3). In addition, each of the fingers FNG includes a plurality of NAND strings NS.

Each of the NAND strings includes, for example, 24 memory cell transistors MT (MT0 to MT23), dummy transistors DT (DT0 to DT3), and select transistors ST1 and ST2. The memory cell transistor MT includes a control gate and a charge storage layer, and stores data in a non-volatile manner. In addition, the memory cell transistors MT are connected to each other in series between a source of the select transistor ST1 and a drain of the select transistor ST2. Although the dummy transistor DT has the same configuration as that of the memory cell transistor MT, the dummy transistor DT does not store data, but simply functions as a current path during an operation. In addition, the dummy transistors DT0 and DT1 are connected to each other between the drain of the select transistor ST2 and a source of the memory cell transistor MT0, and the dummy transistors DT3 and DT2 are connected to each other between the source of the select transistor ST1 and a drain of the memory cell transistor MT23.

A gate of the select transistor ST1 in each of the fingers FNG0 to FNG3 is commonly connected to each of the select gate lines SGD0 to SGD3. In the same way, a gate of the select transistor ST2 in each of the fingers FNG0 to FNG3 is commonly connected to each of the select gate lines SGS0 to SGS3. Meanwhile, the select gate lines SGS0 to SGS3 may be combined into one. In addition, each of the control gates of the memory cell transistors MT0 to MT23 in the same block BLK are commonly connected to each of word lines WL0 to WL23.

Further, the respective drains of the select transistor ST1 of the NAND string NS which are in the same row in the memory cell array 110 are commonly connected to bit lines BL (BL0 to BL (L−1) ((L−1) is a nature number of 1 or more). That is, the bit line BL is commonly connected to the NAND string NS across a plurality of blocks BLK. Further, sources of a plurality of the select transistors ST2 are commonly connected to a source line SL.

In other words, the fingers FNG are connected to the bit lines BL which are different from one another, and are an assembly of the NAND strings NS and are connected to the same select gate line SGD. In addition, the block BLK is an assembly of the plurality of fingers FNG which employ a common set of word lines WL. Also, the memory cell array 110 is an assembly of the plurality of blocks BLK which employ a common set of bit lines BL.

The writing of data and the reading of data are collectively performed with respect to the memory cell transistor MT which is connected to any one of the word lines WL in any one of the fingers FNG. This unit is referred to as a "page". In the example, it is assumed that one memory cell transistor MT may retain 2-bit data. In this case, the writing of data is separately performed for lower-bit data and upper-bit data of 2-bit data. Accordingly, an assembly of lower-bit data is referred to as a "lower page", and an assembly of upper-bit data is referred to as an "upper page".

In addition, it is possible to erase data in units of the block BLK, or in units smaller than that of the block BLK. A method of erasing data is disclosed in, for example, "NON-VOLATILE SEMICONDUCTOR MEMORY DEVICE" of U.S. patent application Ser. No. 13/235,389, filed on Sep. 18, 2011, "NON-VOLATILE SEMICONDUCTOR STORAGE DEVICE" of U.S. patent application Ser. No. 12/694,690, filed on Jan. 27, 2010, and "NON-VOLATILE SEMICONDUCTOR MEMORY DEVICE AND DATA ERASE METHOD THEREOF" of U.S. patent application Ser. No. 13/483,610, filed on May 30, 2012. The entire contents of these applications are incorporated herein by reference.

Figure 3:
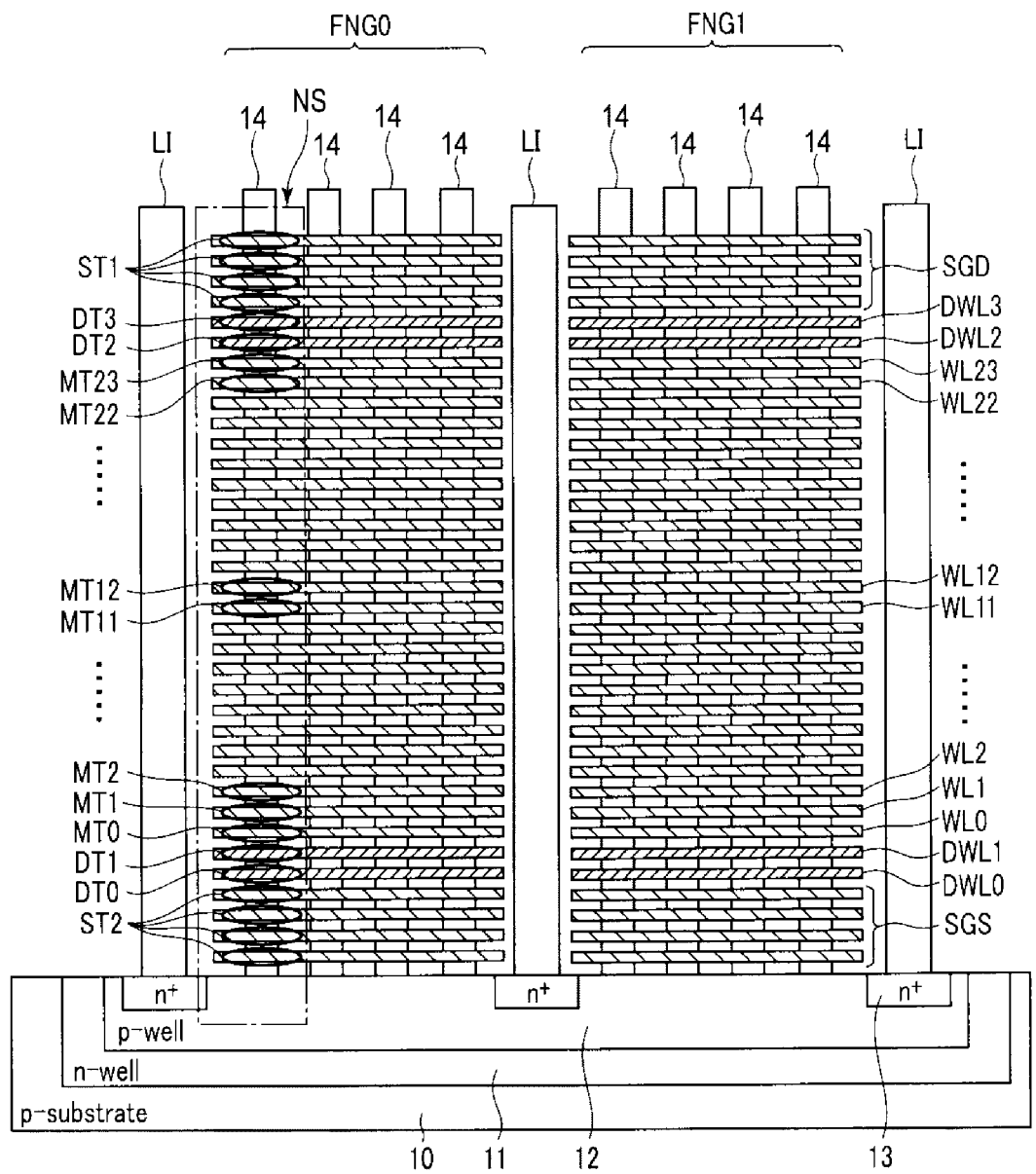
FIG. 3 is a sectional view illustrating the block included in the semiconductor memory device according to the first embodiment.

FIG. 3 is a sectional view of a region of the block BLK. As illustrated in FIG. 3, an n-type well region 11 is formed on a surface region of a p-type semiconductor substrate 10, and a p-type well region 12 is formed on the surface region of the n-type well region 11. In addition, the plurality of NAND strings NS are formed on the well region 12. That is, for example, four wiring layers which function as the select gate line SGS, two wiring layers which function as dummy word lines DWL0 and DWL1, 24 wiring layers which function as the word lines WL0 to WL23, two wiring layers which function as the dummy word lines DWL2 and DWL3, and four wiring layers which function as the select gate line SGD are sequentially stacked on the well region 12.

In addition, a pillar-shaped semiconductor 14 which reaches the well region 12 bypassing through the wiring layers described above is formed. A gate insulating layer, a charge storage layer (an insulating layer), and a block insulating layer, which are not illustrated in the drawings, are sequentially formed on the side surface of the semiconductor 14 and these form the memory cell transistor MT, the dummy transistor DT, and the select transistors ST1 and ST2. The semiconductor 14 functions as a current path of the NAND string NS, and corresponds to a region on which a channel in each of the transistors is formed. An upper end of the semiconductor 14 is connected to a bit line BL (not illustrated). An example of FIG. 3 illustrates four NAND strings NS for one finger FNG, which are connected to each of the bit lines BL which are different from one another.

An $n^+$-type impurity diffusion layer 13 is formed on the surface region of the well region 12. A contact plug LI is formed on the diffusion layer 13, and the contact plug LI is connected to a source line SL (not illustrated).

The above-described configurations are arranged in the depth direction of a sheet on which FIG. 3 is illustrated, and the fingers FNG are formed by assembling the plurality of NAND strings NS which are arranged in the depth direction.

Meanwhile, the configuration of a memory cell array 111 may employ another configuration. The other configuration of the memory cell array 111 is disclosed in, for example, "THREE-DIMENSIONAL STACKED NONVOLATILE SEMICONDUCTOR MEMORY" of U.S. patent application Ser. No. 12/407,403, filed on Mar. 18, 2009, "THREE-DIMENSIONAL STACKED NONVOLATILE SEMICONDUCTOR MEMORY" of U.S. patent application Ser. No. 12/406,524, filed on Mar. 19, 2010, "NON-VOLATILE SEMICONDUCTOR MEMORY DEVICE AND MANUFACTURING METHOD THEREOF" of U.S. patent application Ser. No. 12/679,991, filed on Mar. 25, 2010, and "SEMICONDUCTOR MEMORY AND MANUFACTURING METHOD THEREOF" of U.S. patent application Ser. No. 12/532,030, filed on Mar. 23, 2009. The entire contents of these applications are incorporated herein by reference.

1.1.3.3 Type of Block BLK and Allocation of Address

Next, the type of the block BLK and a physical address (a page address) which is allocated to each page will be described.

The type of block BLK is one of a normal block, an A-type block, a B-type block, and a bad block. A method of allocating page addresses will be changed depending on the type of the block BLK (for example, the type selected among the normal block (or the bad block), the A-type block, and the B-type block). The respective block types described above will be described. In the following description, for the sake of simple description, a case in which the number of fingers FNG included in one block BLK is two will be described as an example.

Normal Block

First, the normal block is described with reference to the FIG. 4 and FIG. 5. FIG. 4 is a table indicating a relationship of the finger FNG, the word line WL, and the upper page and the lower page with respect to the page address, and FIG. 5 is a circuit diagram schematically illustrating FIG. 4.

In the normal block, the page address is allocated to each of the word lines WL1 in each of the fingers FNG. Since the lower page and the upper page are is allocated to each of the word lines WL, two page addresses of the lower page address and the upper page the address are is allocated to each of the word lines WL1 in each of the fingers FNG.

Figure 5:
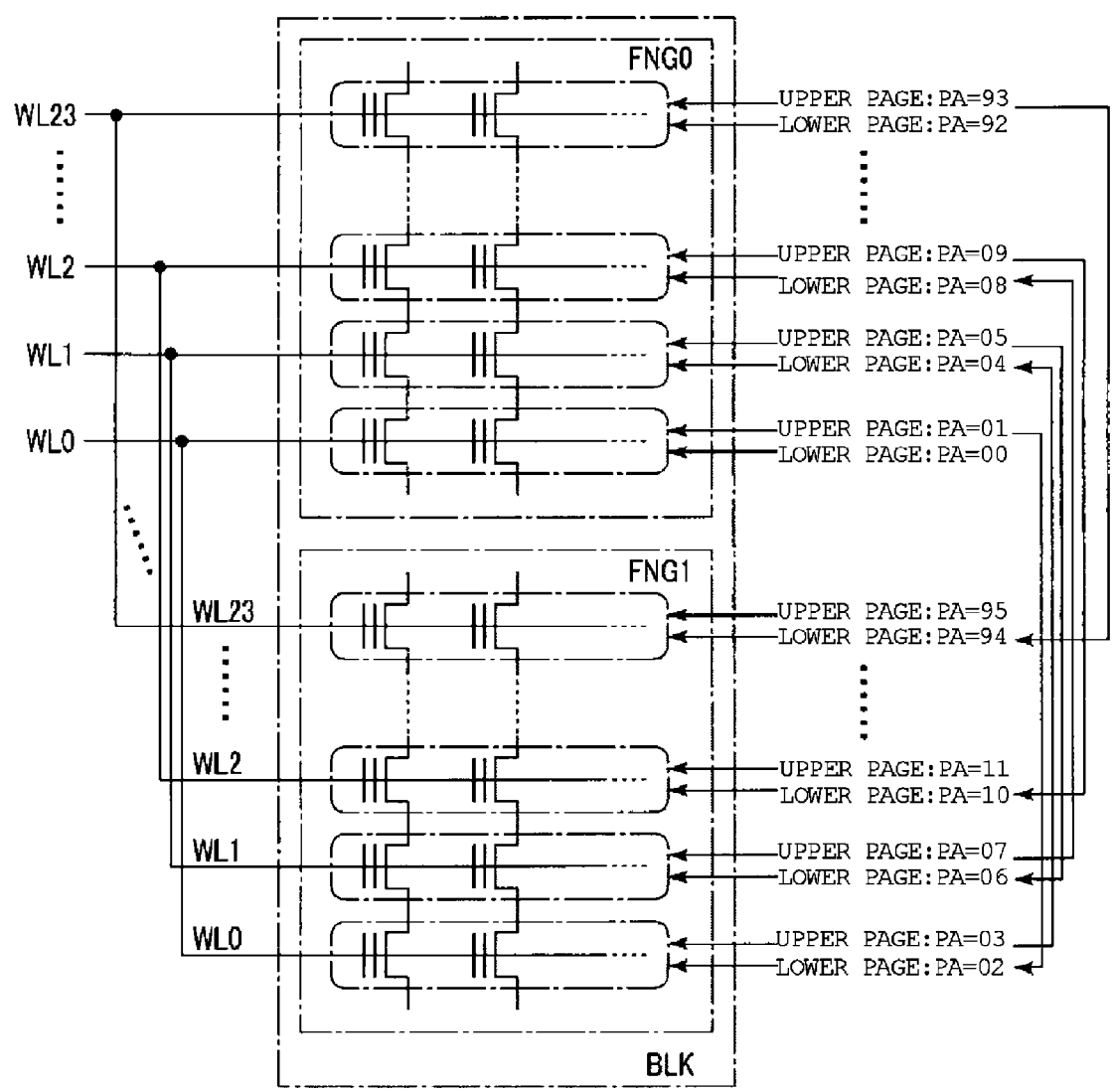
FIG. 5 is a circuit diagram conceptually illustrating a the method of allocating page addresses in the normal block included in the semiconductor memory device according to the first embodiment.

More specifically, as illustrated in FIG. 4 and FIG. 5, first, a first page address "00 (indicated by a decimal digit)" and the next page address "01" of this block BLK are respectively allocated to the lower page and the upper page which correspond to the word line WL0 in the finger FNG0. Next, the next page addresses "02" and "03" are respectively allocated to the lower page and the upper page which correspond to the word line WL0 in the finger FNG1.

Subsequently, the next page addresses "04" and "05" are allocated to the lower page and the upper page which correspond to the word line WL1 in the finger FNG0. Further, the next page address "06" and "07" are allocated to the lower page and the upper page which correspond to the word line WL1 in the finger FNG1.

In addition, the page address "94" and the last page address "95" are allocated to the lower page and the upper page which correspond to the final word line WL23 in the finger FNG1.

As described above, in the normal block, two pages are allocated with respect to each of the word lines WL in each of the fingers FNG. Accordingly, the total page numbers of the block BLK including two fingers FNG0 and FNG1 are 96 pages, and the page addresses "00" to "95" are allocated to each page.

A-Type Block

Figure 7:
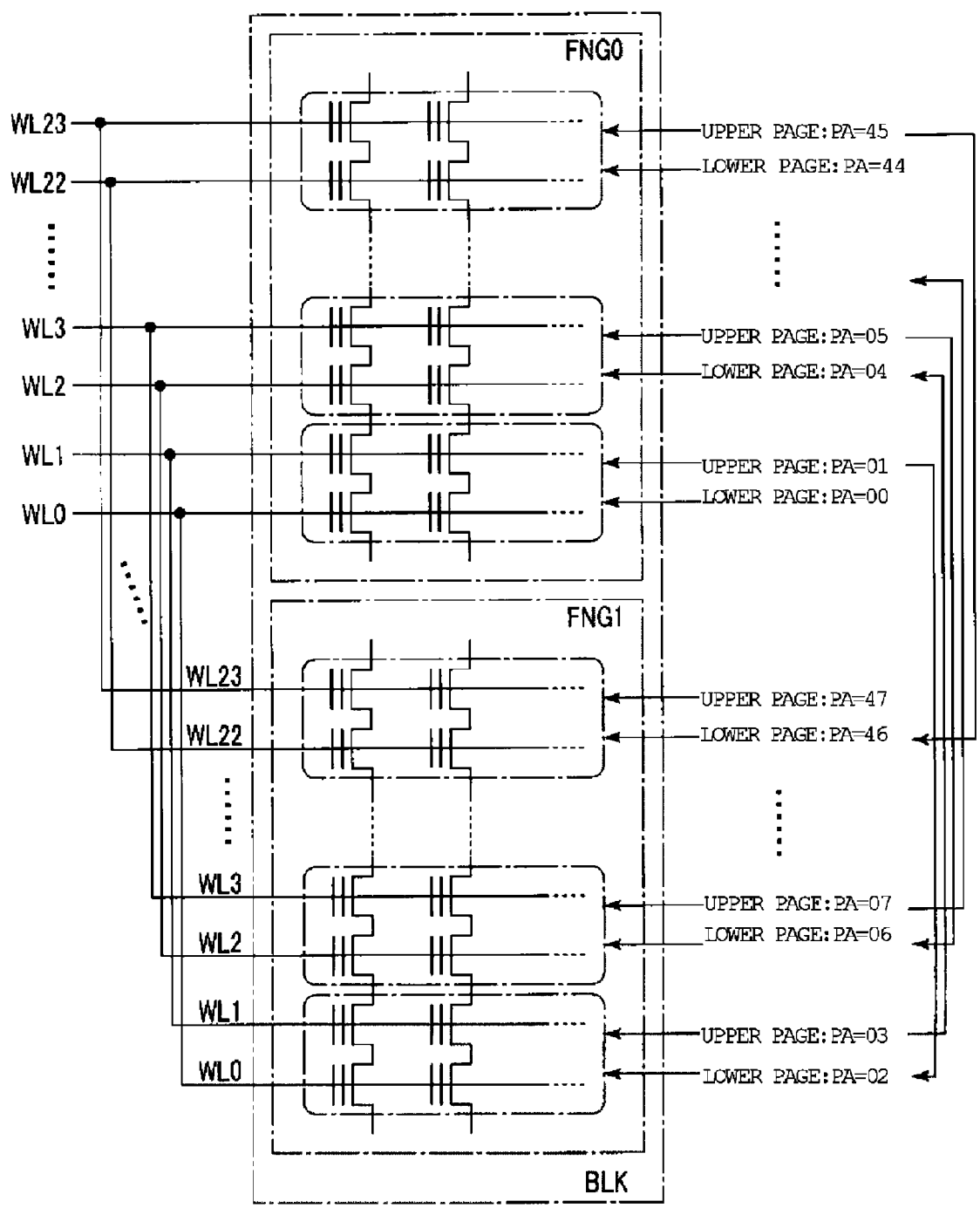
FIG. 7 is a circuit diagram conceptually illustrating the method of allocating page addresses in the A-type block included in the semiconductor memory device according to the first embodiment.

Next, the A-type block will be described with reference to FIG. 6 and FIG. 7. FIG. 6 and FIG. 7 illustrate an example of the A-type block, and correspond to FIG. 4 and FIG. 5 illustrated in the normal block.

In the A-type block, the upper page address and the lower page address are allocated to every two word lines in each of the fingers FNG. That is, in a case of the A-type block, two word lines WL are selected by one page address.

More specifically, as illustrated in FIG. 6 and FIG. 7, first, the first page address "00" and the next page address "01" of this block BLK are allocated to the lower page the upper page which correspond to the word lines WL0 and WL1 in the finger FNG0. Next, the next page addresses "02" and "03" are allocated to the lower page and the upper page which correspond to the word lines WL0 and WL1 in the finger FNG1.

Subsequently, the next page address "04" and "05" are allocated to the lower page and the upper page which correspond to the word line WL2 and the word line WL3 in the finger FNG0. Further, the next page addresses "06" and "07" are allocated to the lower page and the upper page which correspond to the word line WL2 and the word line WL3 in the finger FNG1.

In addition, the page address "46" and the last page address "47" are allocated to the lower page and the upper page which correspond to the word line WL22 and the final word line WL23 in the finger FNG1.

As described above, in the A-type block, two pages are allocated with respect to a set of two word lines WL(2$i$) and WL(2$i$+1) in each of the fingers FNG (here, i is an integer between 0 and 11). Accordingly, the total page numbers of the A-type block including two fingers FNG0 and FNG1 are 48 pages which are half in the case of the normal block, and the page addresses "00" to "47" are allocated to each page.

B-Type Block

Figure 9:
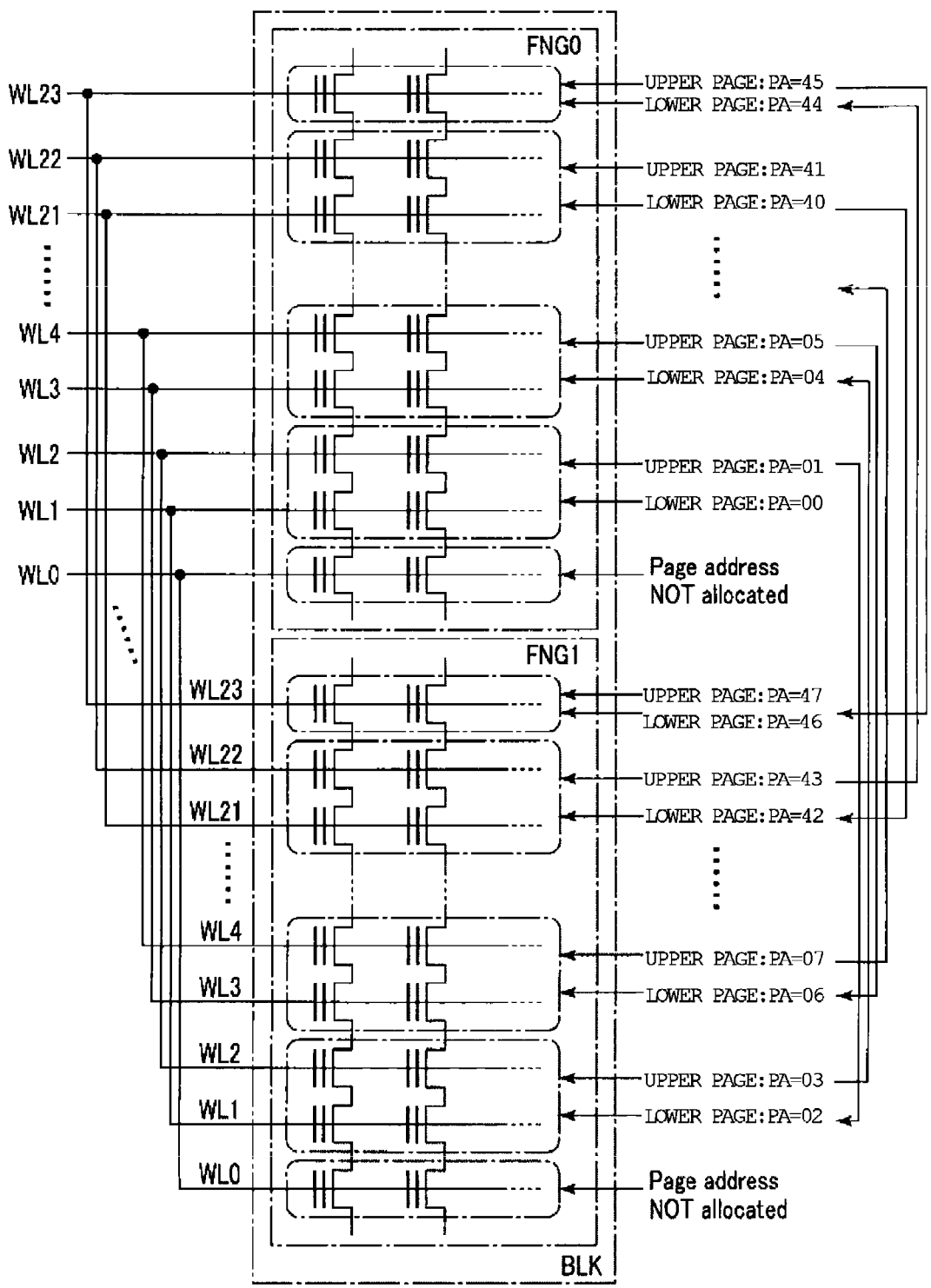
FIG. 9 is a circuit diagram conceptually illustrating the method of allocating page addresses in the B-type block included in the semiconductor memory device according to the first embodiment.

Next, the B-type block will be described with reference to FIG. 8 and FIG. 9. FIG. 8 and FIG. 9 illustrate an example of the B-type block, and correspond to FIG. 4 and FIG. 5 illustrated in the normal block.

Similar to the case of the A-type block, in the B-type block, the upper page address and the lower page address are allocated to for every two word lines in each of the fingers FNG. The B-type block is different from the A-type block in a point that, in the case of the B-type block, two word lines WL(2$i$+1) and WL(2$i$+2) (i is an integer between 0 and 10) are allocated to the page address as a set.

More specifically, as illustrated in FIG. 8 and FIG. 9, first, the first page address "00" and the next page address "01" of this block BLK are allocated to the lower page and the upper page which correspond to the word lines WL1 and WL2 in the finger FNG0. Next, the next page addresses "02" and "03" are allocated to the lower page and the upper page which correspond to the word lines WL1 and WL2 in the finger FNG1.

Subsequently, the next page address "04" and "05" are allocated to the lower page and the upper page which correspond to the word line WL3 and the word line WL4 in the finger FNG0. Further, the next page addresses "06" and "07" are allocated to the lower page and the upper page which correspond to the word line WL3 and the word line WL4 in the finger FNG1.

In addition, the page address "42" and the last page address "43" are allocated to the lower page and the upper page which correspond to the word line WL21 and the word line WL22 in the finger FNG1.

Meanwhile, in the example, the page address is allocated to with respect to the final word line WL23 in the same method of the normal block. That is, the page addresses "44" and "45" are respectively allocated to the lower page and the upper page which correspond to the word line WL23 in the finger FNG0, and the page address "46" and the last page address "47" are respectively allocated to the lower page and the upper page which correspond to the word line WL23 in the finger FNG1. The page address is not allocated to the word line WL0.

However, a case of the word lines WL0 and WL23 which are respectively adjacent to the select gate lines SGD and SGS is not limited the above description. That is, the page address may be allocated to both of the word line WL0 and WL23. Alternatively, the page address may be allocated to the word line WL0 in the same method of the normal block, in which case the page address is not allocated to the word line WL23. Here, when the page address is allocated to any one of the word line WL0 and WL23 in the same method of the normal block, it is possible to make the number of pages in one block BLK be the same as that in the A-type block. In this case, the memory cell transistor MT which is connected to the word line WL to which the page address is not allocated functions as a dummy transistor serving as a current path only.

Bad Block

The bad block is an unavailable block BLK that cannot be used due to, for example, defects which are found at the time of the pre-shipment test for the NAND type flash memory 100. In the bad block, the page address may be allocated or may not be allocated, but when the page address is allocated, the same method of the normal block may be used to allocate the page address.

Block Table

Information which indicates the types of each block BLK is retained, for example, in a ROM fuse block as a table (this is referred to as a block table).

FIG. 10 is a conceptual representation of the block table. The block table retains block information indicating the types of blocks by using 2 bit-data. In an example of FIG. 10, "00" indicates the normal block, "01" indicates the A-type block, "10" indicates the B-type block, and "11" indicates the bad block. Accordingly, in the example of FIG. 10, the block BLK0 is the normal block, the block BLK1 is the A-type block, the block BLK2 is the B-type block, and the block BLK3 is the bad block.

The block table is read by, for example, the sense amplifier 140 with other pieces of information (information required to operate the NAND type flash memory 100, for example, column redundancy information and trim information) retained in the ROM fuse block, when the power of the NAND type flash memory 100 is turned on. This is referred to as power-on read, and the information is automatically read, without the read command being issued by the controller 200, for example, by using the sequencer 170 in the NAND type flash memory 100. In addition, the sequencer 170 sets the block information in the block decoder in the row decoder 120 based on the block table.

1.1.3.4 Configuration of Row Decoder 120

Figure 11:
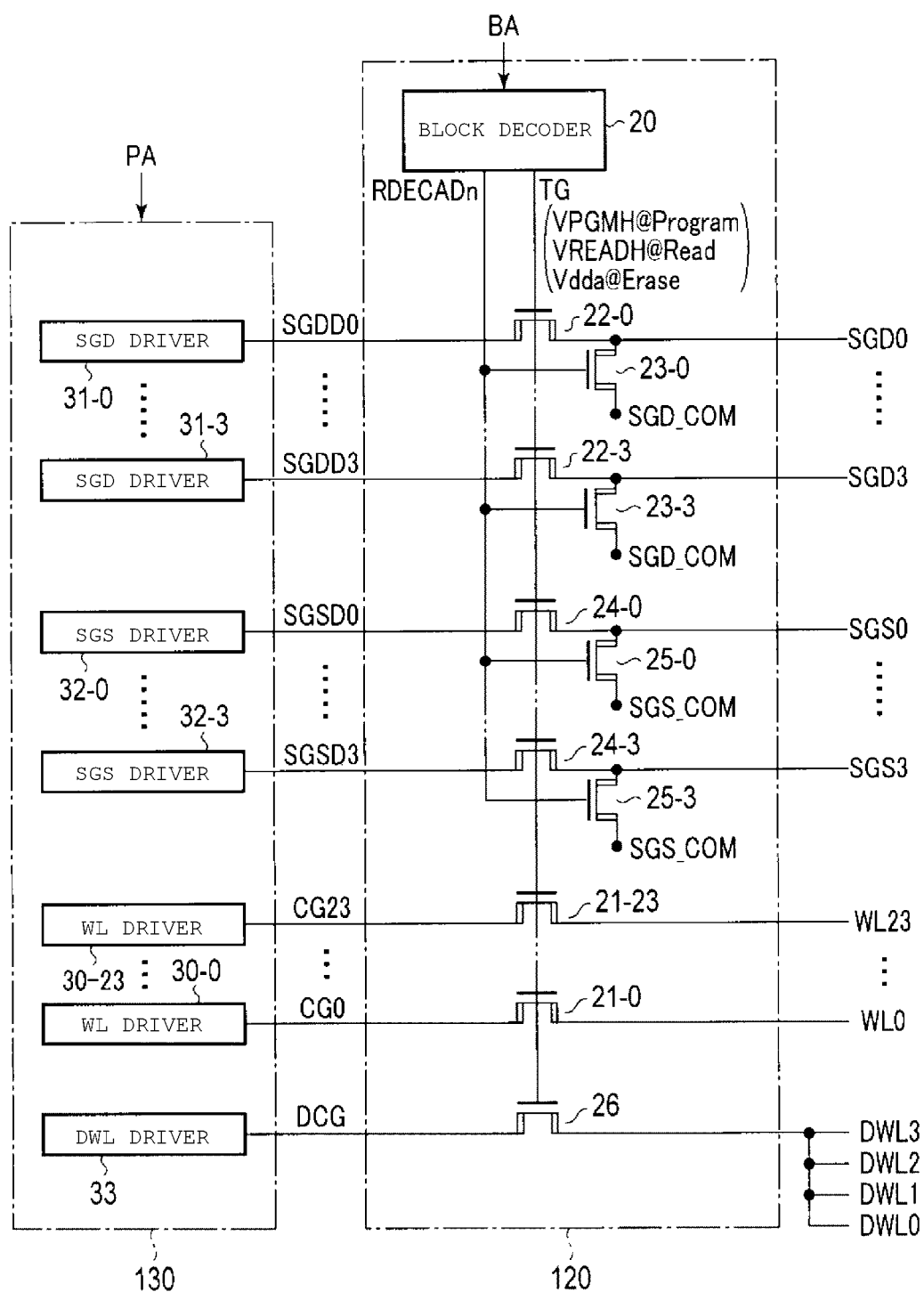
FIG. 11 is a circuit diagram illustrating a row decoder and a driver circuit included in the semiconductor memory device according to the first embodiment.

Next, the configuration of the row decoder 120 will be described with reference to FIG. 11. FIG. 11 is a circuit diagram illustrating the row decoder 120 and the driver circuit 130.

The row decoder 120 functions as a switch transmitting a voltage output from the corresponding driver circuit 130 to the corresponding wires WL, DWL, SGD, and SGS.

As illustrated in FIG. 11, the row decoder 120 includes the block decoder 20 and high-voltage n-channel MOS transistors 21 to 25 (21-0 to 21-23, 22-0 to 22-3, 23-0 to 23-3, 24-0 to 24-3, and 25-0 to 25-3), and 26.

The transistor 21 transmits the voltage to the word line WL of the corresponding block BLK. That is, one of the source and the drain in each of the transistors 21-0 to 21-23 is connected to each of the word lines WL0 to WL23 of the corresponding block BLK, and the other is connected to each of the signal lines CG0 to CG23, and the gate is commonly connected to a signal line TG.

The transistors 22 and 23 transmit the voltage to the select gate line SGD. That is, one of the source and the drain in each of the transistors 22-0 to 22-3 is connected to each of the select gate lines SGD0 to SGD3 of the corresponding block BLK, the other is connected to each of the signal lines SGDD0 to SGDD3, and the gate is commonly connected to the signal line TG. In addition, one of the source and the drain in each of the transistors 23-0 to 23-3 is connected to each of the select gate lines SGD0 to SGD3 of the corresponding block BLK, the other is connected to the node SGD_COM, and the signal RDECADn is imparted to the gate. For example, 0 V of a voltage which makes the select transistor ST1 be turned off is applied to the node SGD_COM.

The transistors 24 and 25 transmit a voltage to the select gate line SGS. Then, the connection is equivalent to the case in which in the transistors 22 and 23, the select gate line SGD is replaced with SGS, the signal line SGDD is replaced with SGSD, and the node SGD_COM is replaced with SGS_COM.

The transistor 26 transmits the voltage to the dummy word line DWL. That is, one of the source and the drain in the transistor 26 is commonly connected to the dummy word lines DWL0 to DWL3 of the corresponding block BLK, the other is connected to the signal line DCG, and the gate is commonly connected to the signal line TG.

The block decoder 20 decodes a block address BA imparted from the address register 150. In addition, the block decoder 20 retains the block information illustrated in FIG. 10. In addition, the block decoder 20 applies the voltage to the signal line TG and RDECADn, and makes the transistors 21, 22, 24, and 26, or the transistors 23 and 25 be turned on, based on the decoded result and block information of the block address BA.

Figure 12:
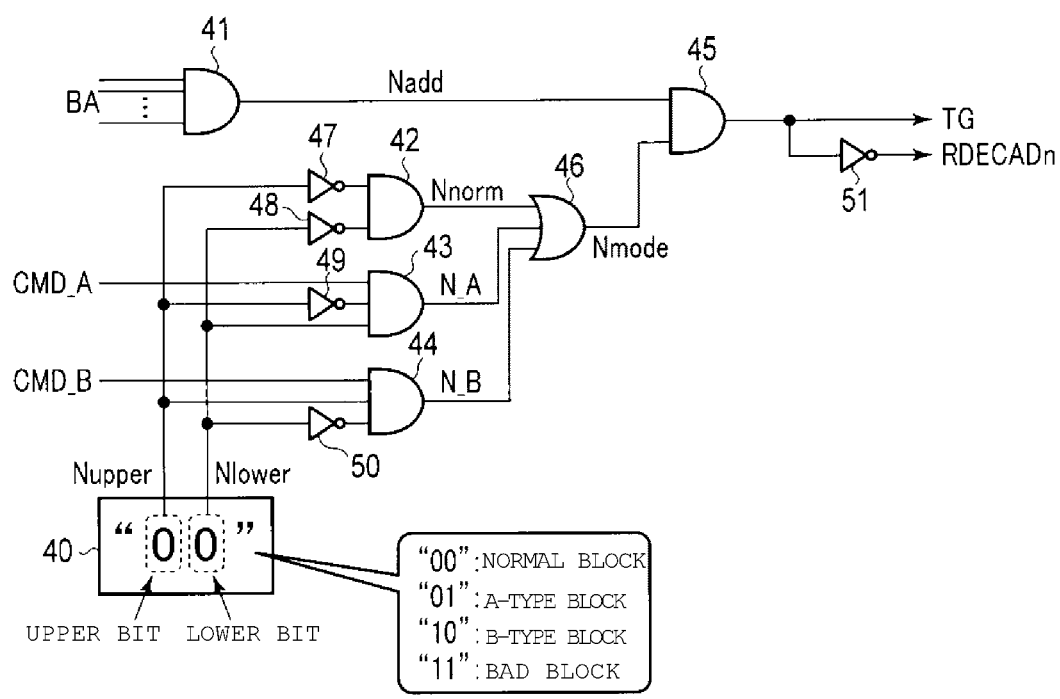
FIG. 12 is a circuit diagram illustrating a block decoder included in the semiconductor memory device according to the first embodiment.

FIG. 12 is a circuit diagram illustrating a configuration example of the block decoder 20. As illustrated in FIG. 12, the block decoder 20 includes a latch circuit 40, AND gates 41 to 45, an OR gate 46, and inverters 47 to 51.

The latch circuit 40 retains block information of the corresponding block BLK (in an example of FIG. 12, "00" is retained). The latch circuit 40 outputs "L" level to a node Nlower when a lower bit of the block information is "0", and outputs "H" level to the node Nlower when the lower bit of the block information is "1". In addition, the latch circuit 40 outputs "L" level to an node Nupper when an upper bit of the block information is "0", and outputs "H" level to an node Nupper when the upper bit of the block information is "1". The latch circuit 40 stores, as described above, the block information at the time of a power-on read operation.

The inverters 47 and 49 invert the signal of the node Nupper. In addition, the inverters 48 and 50 invert the signal of the node Nlower.

The AND gate 42 performs an AND operation of the outputs of the inverter 47 and 48, and outputs the operation result to a node Nnorm. The AND gate 43 performs the AND operation of the output of the inverter 49, the signal of the node Nlower, and a signal CMD_A, and outputs the operation result to a node N_A. The AND gate 44 performs the AND operation of the output of the inverter 50, the signal of the node Nupper, and a signal CMD_B, and outputs the operation result to a node N_B. The signals CMD_A and CMD_B are signals which are asserted ("H" level in the example) by the sequencer 170 when each of the access target blocks is the A-type block and the B-type block.

The OR gate 46 perform an OR operation of the signals of the nodes Nnorm, N_A, and N_B, and outputs the operation result to the node Nmode.

The AND gate 41 performs an AND operation of the block address BA, and outputs the operation result to a node Nadd. More specifically, the operation result is the "H" level when the block address BA which is imparted from the address register 150 is the same as the block address which is allocated to the corresponding block BLK, and the operation result is the "L" level when the block address BA which is imparted from the address register 150 is different from the block address which is allocated to the corresponding block BLK.

The AND gate 45 performs the AND operation of the signal in nodes Nadd and Nmode, and outputs the operation result to the signal line TG. In addition, the inverter 51 inverts the signal of the signal line TG, and the result is imparted to the signal line RDECADn.

Meanwhile, the configuration of the block decoder 20 is not limited to the description made in FIG. 12, but may be a configuration in which the operations described in "1.2 Operation" may be performed.

1.1.3.5 Configuration of Driver Circuit 130

Next, the configuration of the driver circuit 130 will be described with reference to FIG. 11. The driver circuit 130 decodes a page address PA imparted from the address register 150. In addition, in response to the decoded result of the page address PA, the voltage, which is required for writing, reading, and erasing data, is transmitted to each of the signal lines CG0 to CG23, SGDD0 to SGDD3, SGSD0 to SGSD3, and DCG.

As illustrated in FIG. 11, the driver circuit 130 includes WL drivers 30 (30-0 to 30-23), SGD drivers 31 (31-0 to 31-3), SGS drivers 32 (32-0 to 32-3) and DWL driver 33.

Each of the WL drivers 30-0 to 30-23 transmits the required voltage to the signal lines CG0 to CG23. Then, any one of the signal lines CG is selected based on the decoded result of the page address PA, and a predetermined voltage is applied to a select signal line CG and a non-select signal line CG. Accordingly, in the driver circuit 130 corresponding to the normal block, one signal line CG (that is, the word line WL) is selected by one WL driver 30, and other signal lines CG are not selected. On the other hand, in the driver circuit 130 corresponding to the A-type block, two signal lines CG are selected by two WL drivers 30. In addition, in the driver circuit 130 corresponding to the B-type block, one or two signal lines CG are selected in response to the page address PA.

Each of the SGD drivers 31-0 to 31-3 transmits the required voltage to the signal lines SGDD0 to SGDD3 in response to the decoded result of the page address PA. Each of the SGS drivers 32-0 to 32-3 transmits the required voltage to the signal lines SGSD0 to SGSD3 in response to the decoded result of the page address PA. That is, any one of the fingers FNG0 to FNG3 is selected by the SGD drivers 31-0 to 31-3 and SGS drivers 31-0 to 31-3.

The DWL driver 33 transmits the required voltage to the signal line DCG.

1.2 Operation

Next, an operation of the memory system 1 having the above-described configuration will be described.

1.2.1 Operation Flow

Figure 13:
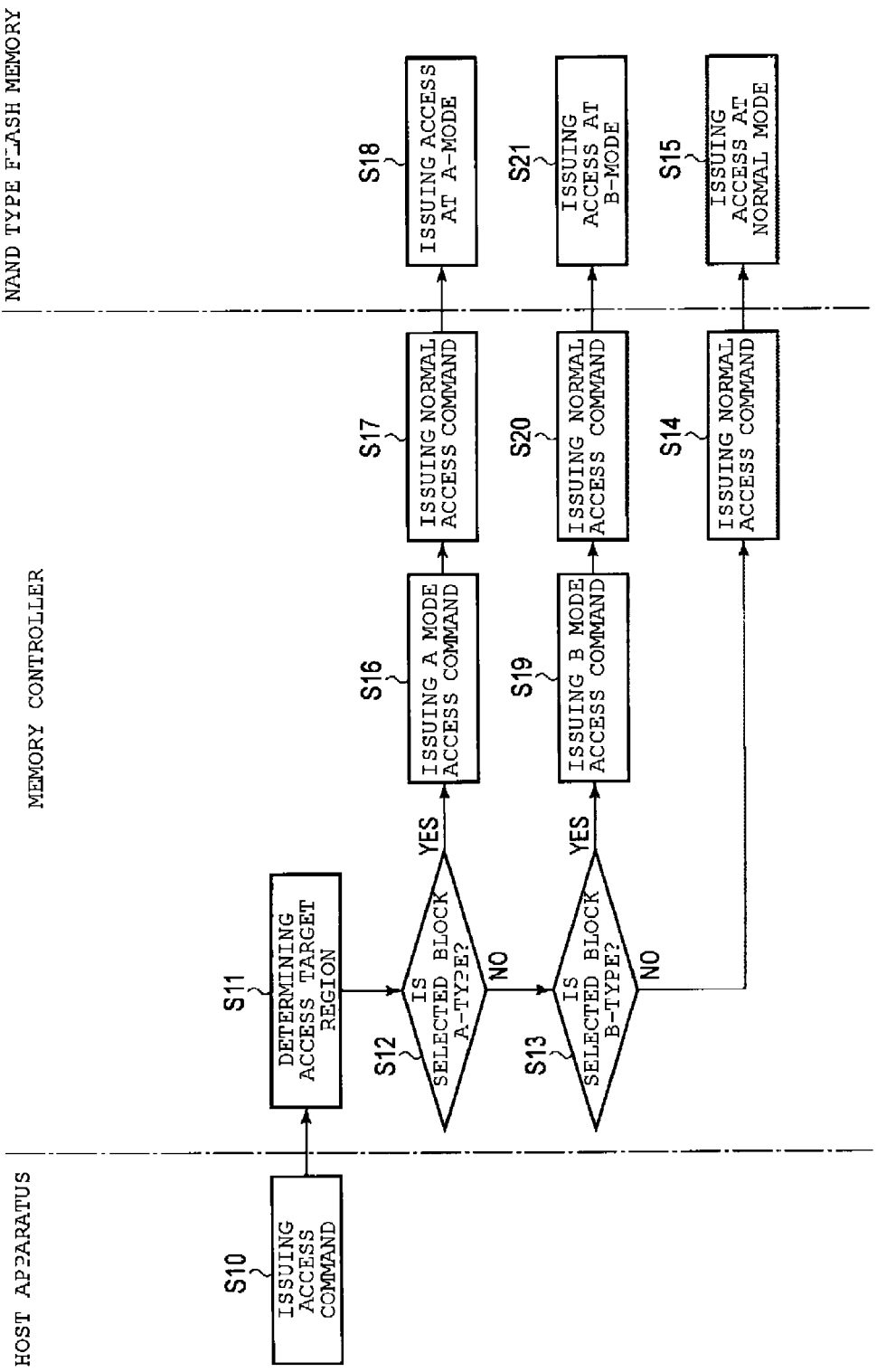
FIG. 13 is a flow chart illustrating an operation of the memory system according to the first embodiment.

FIG. 13 is a flow chart schematically illustrating the operation of the memory system 1. As illustrated in FIG. 13, first, the host apparatus 300 issues an access command (step S10). In response to the access command, the processor 230 of the controller 200 determines a region that is an access target in the NAND type flash memory 100 (step S11).

In a case where the region that is the access target (the selected block BLK) is the normal block (NO in step S12 and NO in step S13), in response to the command of the processor 230, the NAND interface circuit 250 issues the normal access command to the NAND type flash memory 100 (step S14). In the NAND type flash memory 100, based on the fact that the normal access command is retained in the address register 150, the sequencer 170 performs access at the normal mode with respect to the normal block (step S15). The access at the normal mode means access based on the page address allocation as illustrated in FIG. 4 and FIG. 5.

In a case where the access target block is the A-type block (YES in step S12), the NAND interface circuit 250 issues an A mode access command to the NAND type flash memory 100 in response to the command of the processor 230 (step S16), and subsequently issues the normal access command (step S17). In the NAND type flash memory 100, based on the fact that not only the normal access command but also the A mode access command are retained in the address register 150, the sequencer 170 performs access at the A mode with respect to the A-type block (step S18). The access at the A mode means access based on the page address allocation as illustrated in FIG. 6 and FIG. 7.

When the access target block is the B-type block (NO in step S12, and YES in step S13), a B mode access command is imparted to the NAND type flash memory 100 by the processor 230 (step S19), and subsequently the normal access command is imparted to the NAND type flash memory 100 by the processor 230 (step S20). In the NAND type flash memory 100, access at the B mode is performed with respect to the B-type block (step S21). The access at the B mode means access based on the page address allocation as illustrated in FIG. 8 and FIG. 9.

Hereinbelow, the operation will be described in detail.

1.2.2 Writing Operation

First, a writing operation will be described.

Writing Operation with Respect to Normal Block

Figure 14:
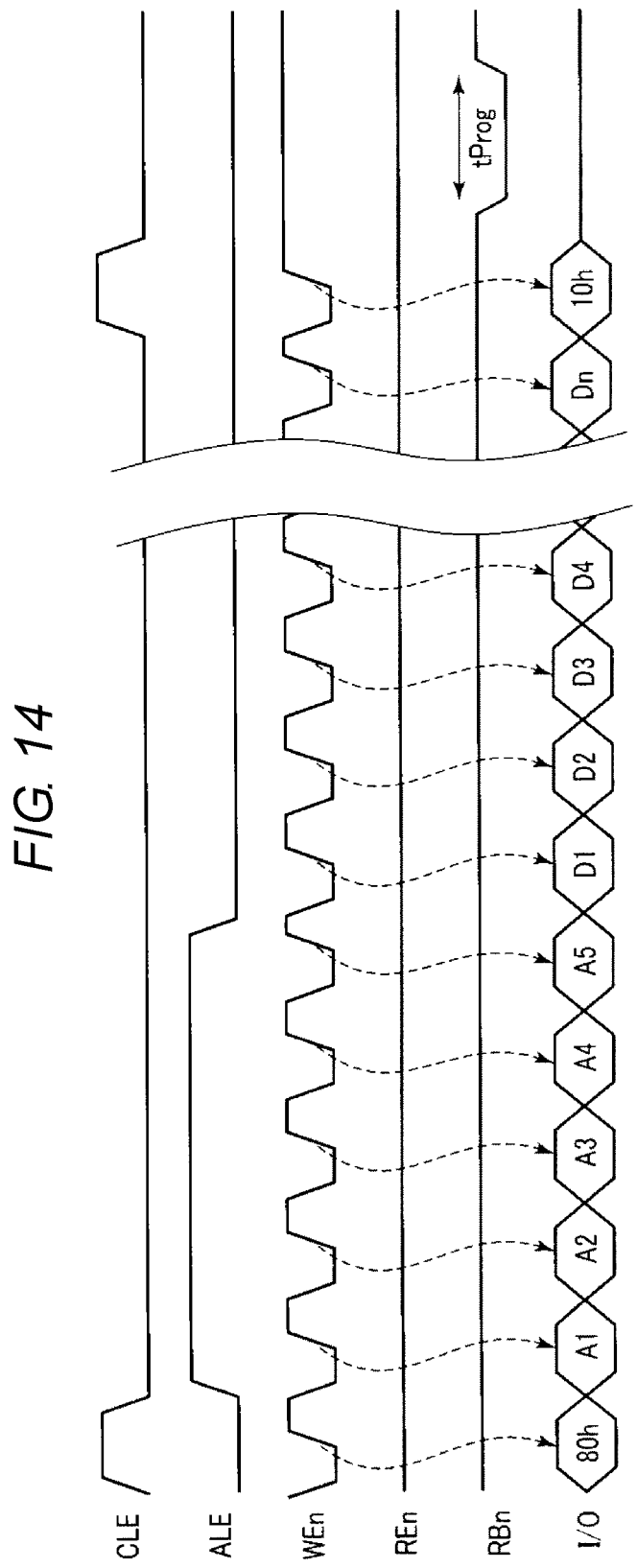
FIG. 14 is a timing diagram illustrating various signals at the time of a writing operation in the memory system according to the first embodiment.

FIG. 14 is a timing diagram of various signals on an NAND bus at the time of writing data into the normal block.

As illustrated in FIG. 14, the controller 200, first, issues a write command "80h" (corresponding to step S14 in FIG. 13) and asserts the signal CLE (a "H" level). Subsequently, the controller 200 issues, for example, addresses (A1 to A5: the column address, the block address, and the page address are included) for five cycles, and asserts the signal ALE (the "H" level). These command and address, are stored in, for example, the registers 150 and 160. Then, from the fact that the normal write command is retained in the register 160, the sequencer 170 confirms that the write access to the normal block is received.

Next, the controller 200 outputs write data D1 to Dn (n is 2 or more of natural number) for a plurality of cycles. During this time, the signals ALE and CLE are negated (a "L" level). The write data D1 to Dn which are received in the NAND type flash memory 100 are retained in the latch circuit in the sense amplifier 140.

Next, the controller 200 issues a write command "10h" and asserts the signal CLE. When the command "10h" is stored in the register 160, the sequencer 170 starts performing the writing operation, and the NAND type flash memory 100 becomes in a busy state (RBn="L"). In addition, the controller 200 asserts the signal WEn whenever the signals of the command, the address, data, or the like are issued. Accordingly, whenever the signal WEn is toggled, the signal is input to the NAND type flash memory 100.

Figure 15:
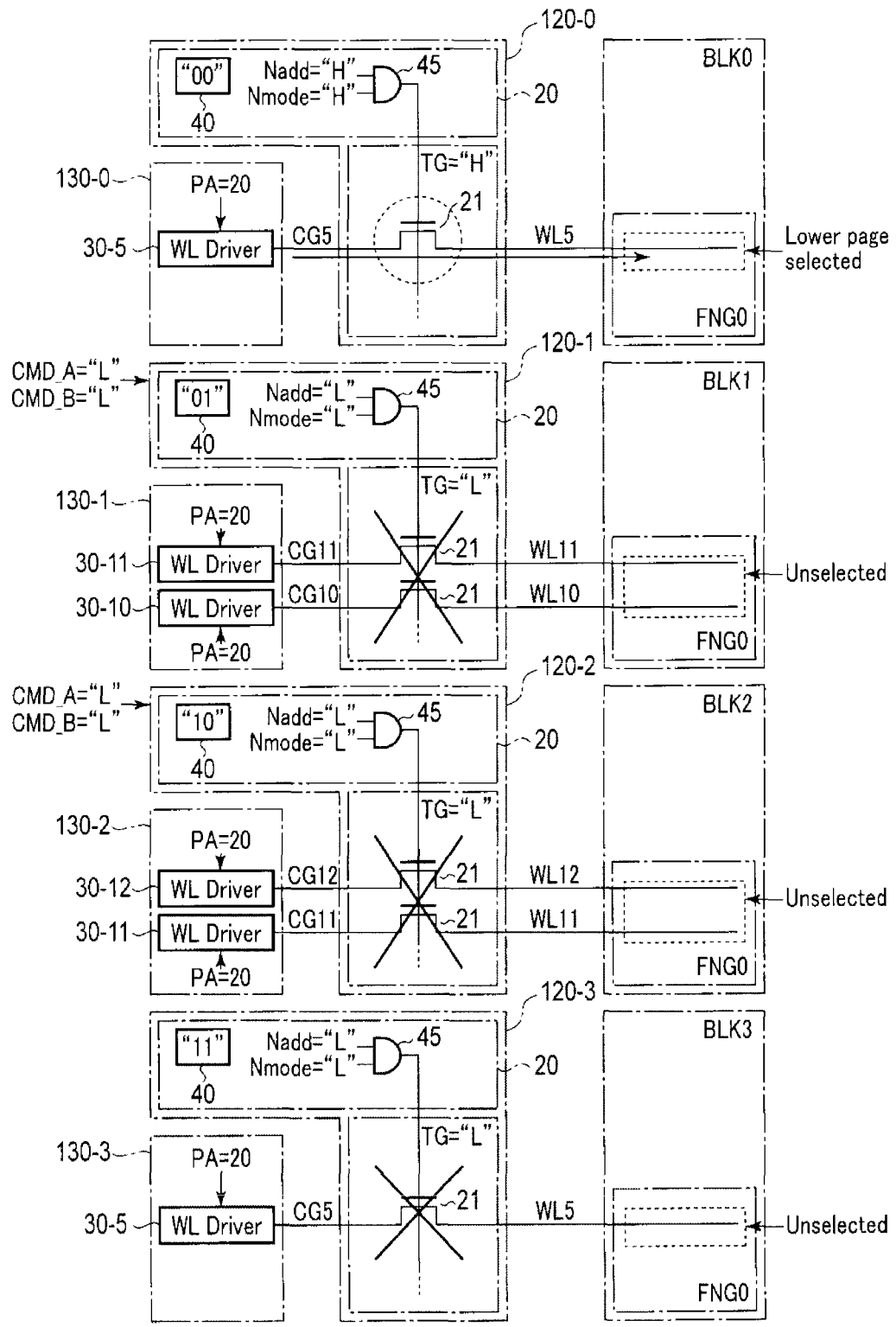
FIG. 15 is a block diagram conceptually illustrating the writing operation in the semiconductor memory device according to the first embodiment.

Next, the operation in the NAND type flash memory 100 will be described with reference to FIG. 15 while particularly focusing on the row decoder 120 and the driver circuit 130. FIG. 15 is a schematic view of a region of the NAND type flash memory 100. In FIG. 15, for the sake of simple description, a case is assumed that one block BLK includes two fingers FNG0 and FNG1, a method of allocating page addresses is the same as that illustrated in FIG. 4 and FIG. 5, and "20" is input as the page address PA.

In FIG. 15, each of the blocks BLK0 to BLK3 corresponds to the normal block, the A-type block, the B-type block, and the bad block. Accordingly, each of the latch circuits 40 of the block decoders 20 which correspond to the blocks BLK0 to BLK3 retains "00", "01", "10", and "11" as the block information.

In addition, the block address BA which designates the block BLK0 is imparted to the row decoders 120-0 to 120-3. Then, the signal of the node Nadd becomes the "H" level in the block decoder 20 of the row decoder 120-0 corresponding to the block BLK0. In addition, since the node Nnorm becomes the "H" level, the node Nmode becomes the "H" level. As a result, the signal line TG becomes the "H" level, and the transistors 21, 22, 24, and 26 are turned on in the row decoder 120-0.

In addition, in the driver circuit 130-0, the SGD driver 31-0 and the WL driver 30-5 which correspond to the page address PA="20" select the select gate line SGD0 and the word line WL5; and other drivers output unselected voltages. As a result, the output voltage of the driver circuit 130-0 is transmitted to the finger FNG0 of the block BLK0 via the row decoder 120-0.

That is, the word line WL5 in the finger FNG0 in the block BLK0 is selected, and then the lower page data corresponding to the word line WL5 is written into the word line WL5.

On the other hand, in the block decoders 20 in the row decoders 120-1 to 120-3 which correspond to the blocks BLK1 to BLK3, the signals of the node Nadd and the node Nmode become "L" level. As a result, the signal line TG becomes the "L" level, and the transistors 21, 22, 24, and 26 in the row decoders 120-1 to 120-3 are turned off.

Accordingly, the output voltage of the driver circuits 130-1 to 130-3 is not transmitted to the blocks BLK1 to BLK3. More specifically, in the driver circuit 130-1, since the WL drivers 30-10 and 30-11 correspond to the page addresses PA="20", but the transistors 21 corresponding to the WL drivers 30-10 and 30-11 are turned off, the word line WL10 and WL11 are in a state of non-select. In addition, in the driver circuit 130-2, the WL drivers 30-11 and 30-12 correspond to the page addresses PA="20", but the word lines WL11 and WL12 are in the state of non-select. The same is true for the driver circuit 130-3.

Figure 16:
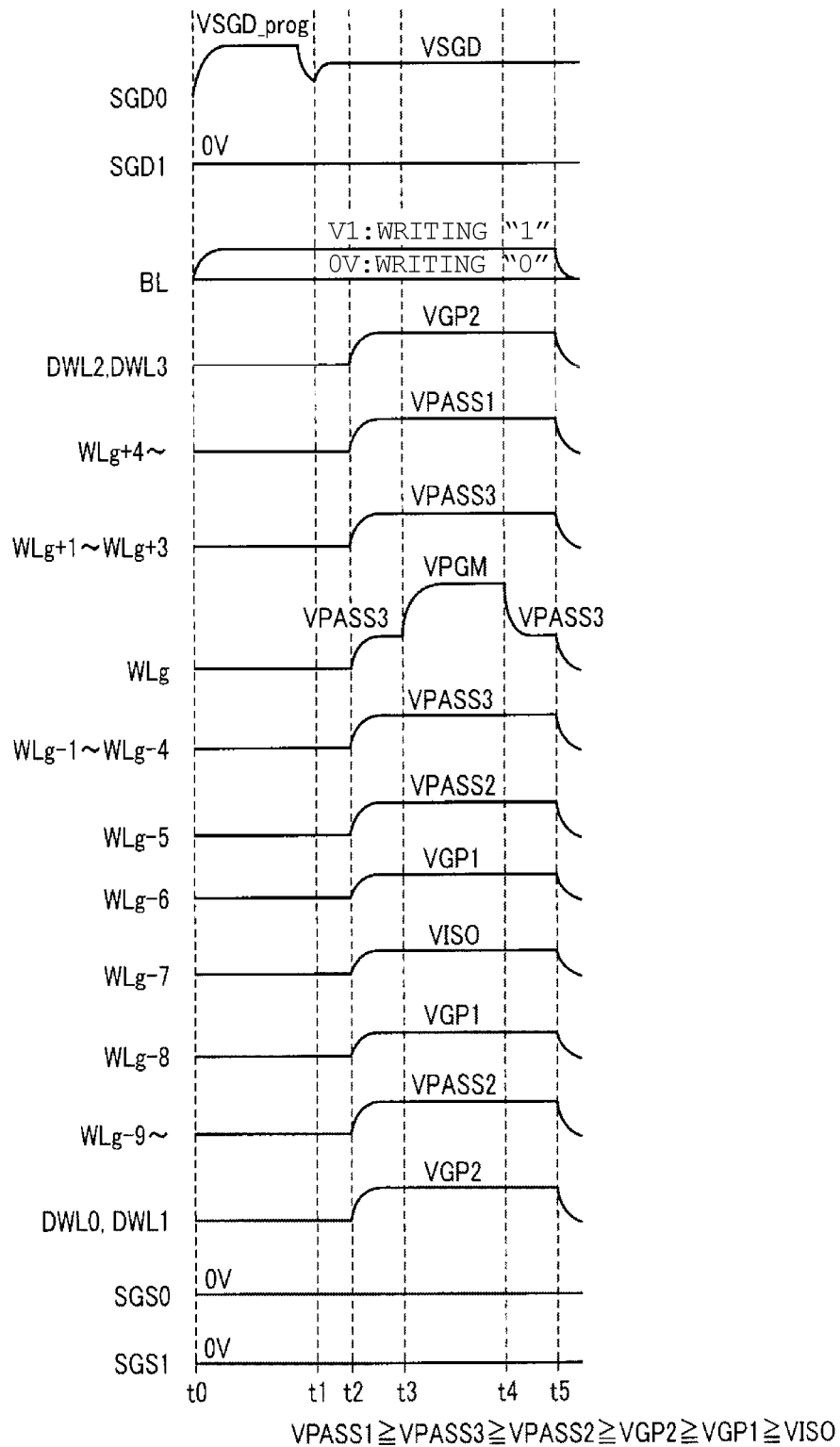
FIG. 16 is a timing diagram illustrating various signals at the time of the writing operation in the semiconductor memory device according to the first embodiment.

Next, the voltages which are applied to the word line WL, the select gate lines SGD and SGS, the dummy word line DWL, and the bit line BL in the block BLK0 will be described with reference to FIG. 16. FIG. 16 is a timing diagram illustrating the voltage of the above-described wiring.

As illustrated in FIG. 16, during a time period t0, the SGD driver 31-0 applies a voltage VSGD_prog to the select gate line SGD0. The voltage VSGD_prog is a voltage causing the select transistor ST1 to be turned on. In addition, the SGD driver 31-1 and SGS drivers 32-0 and 32-1 apply 0 V to the select gate line SGD1 and the select gate lines SGS0 and SGS1.

In addition, the sense amplifier 140 applies 0 V to the bit line BL in which "0" data is written, and applies a positive voltage V1 to the bit line BL in which "1" data is written. Writing "0" data means the writing operation which causes a threshold voltage of the memory cell transistor MT to be increased by injecting electrons to the charge storage layer of the memory cell transistor MT, and thus a threshold voltage level is transitioned to a higher level. On the other hand, writing "1" data means the writing operation which maintains the threshold voltage level of the memory cell transistor MT from being increased by suppressing injection of electrons to the charge storage layer of the memory cell transistor MT (that is, a threshold voltage is substantially unchanged).

Subsequently, during a time period t1, the SGD driver 31-0 applies the voltage VSGD to the select gate line SGD0 (for example, VSGD_prog>VSGD). Meanwhile, the voltage VSGD_prog allows the voltage V1 to be transmitted with respect to the select transistor ST1. On the other hand, the voltage VSGD may transmit 0 V with respect to the select transistor ST1, but cannot transmit the voltage V1 to the select transistor ST1. Accordingly, the select transistor ST1 corresponding to the bit line BL in which "1" data is written is cut off.

Next, during a time period t2, the WL drivers 30-0 to 30-23 and DWL driver 33 apply voltages to the word lines WL0 to WL23 and the dummy word lines DWL0 to DWL3. A voltage VPASS3 is applied to the selected word line WLg (g is an integer between 0 and 23, and an example in FIG. 15 satisfies g=5).

Thereafter, during a time period t3, the WL driver 30-5 corresponding to selected word line WL5 causes the voltage which is applied to the word line WL5 to be increased to the voltage VPGM from the voltage VPASS3. In this way, data is written into the memory cell transistor MT. Meanwhile, the voltage VPASS3 allows the memory cell transistor MT to be turned on regardless of retained data, and a potential of a channel in the NAND string NS which corresponds to the writing of "0" data to be sufficiently increased by capacity coupling. In addition, the voltage VPGM is a high voltage which may inject the electrons to the charge storage layer through FN tunneling.

The voltages VPASS3, VPASS2, VPASS1, VGP1, and VISO are applied to other unselected word lines WL, and the voltage VGP2 is applied to the dummy word line DWL. Similar to the voltage VPASS3, the voltages VPASS1 and VPASS2 allow the memory cell transistor MT to be turned on, and may cause a potential of a channel to be sufficiently increased. The voltage VISO allows, for example, the memory cell transistor MT to be turned off. The voltage VGP2 allows the dummy transistor DT to be turned on, and the voltage VGP1 is an intermediate voltage of the voltage VPASS2 and the voltage VISO.

The voltage VISO is set as a low voltage since the memory cell transistor MT is turned off, and the voltage VPGM is set as very high voltage for writing data. Accordingly, in the example of FIG. 16, by using three types of voltages VPASS (VPASS1 to VPASS3) and the voltage VGP1, the potential difference between the adjacent word lines is set as small as possible. Therefore, as an example, of the relationship between these voltages, an expression of VPASS3>VPASS2>VPASS1>VGP2>VGP1>VISO is established. However, the voltages VPASS1 to VPASS3 may be a voltage satisfying the above-described conditions, but the magnitude relation thereof is not limited. In addition, the voltages VGP1 and VGP2 may have an inverse relationship or may have the same value. In some cases, the voltage VISO and the voltage VGP1, or the voltage VISO and the voltage VGP2 may have the same value.

After data is programmed during the time periods t3 and t4, each wiring is set as 0 V during a time period t5.

Writing Operation with Respect to A-Type Block

Figure 17:
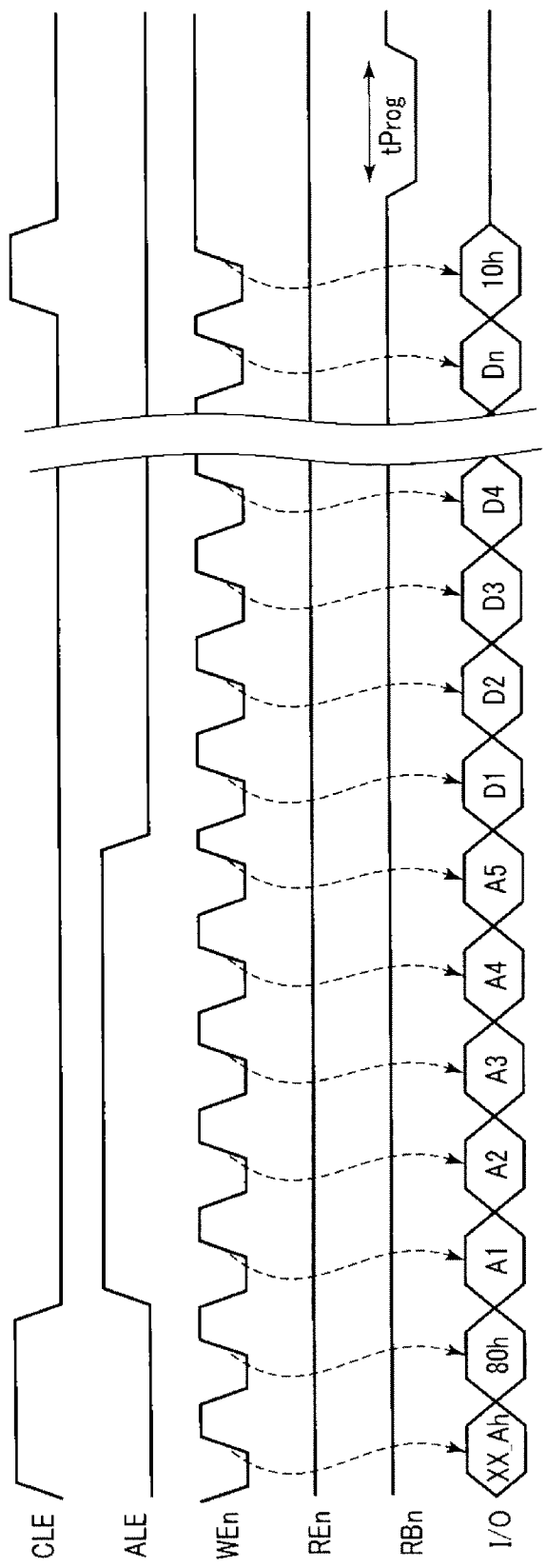
FIG. 17 is a timing diagram illustrating various signals at the time of the writing operation in the memory system according to the first embodiment.

Next, the writing operation of the A-type block will be described with reference to FIG. 17. FIG. 17 corresponds to FIG. 14 which is illustrated in the normal block. Hereinbelow, the description will focus on the differences from the writing operation to the normal block.

As illustrated in FIG. 17, the difference from the writing operation to the normal block illustrated in FIG. 14 is that the controller 200 issues, first, the A mode access command "XX_Ah" (corresponding to step S16 in FIG. 13). Thereafter, the controller 200 issues a normal write command "80h". Then, from the fact that the A mode access command is retained in the register 160, the sequencer 170 confirms that the write access to the A-type block is received.

Figure 18:
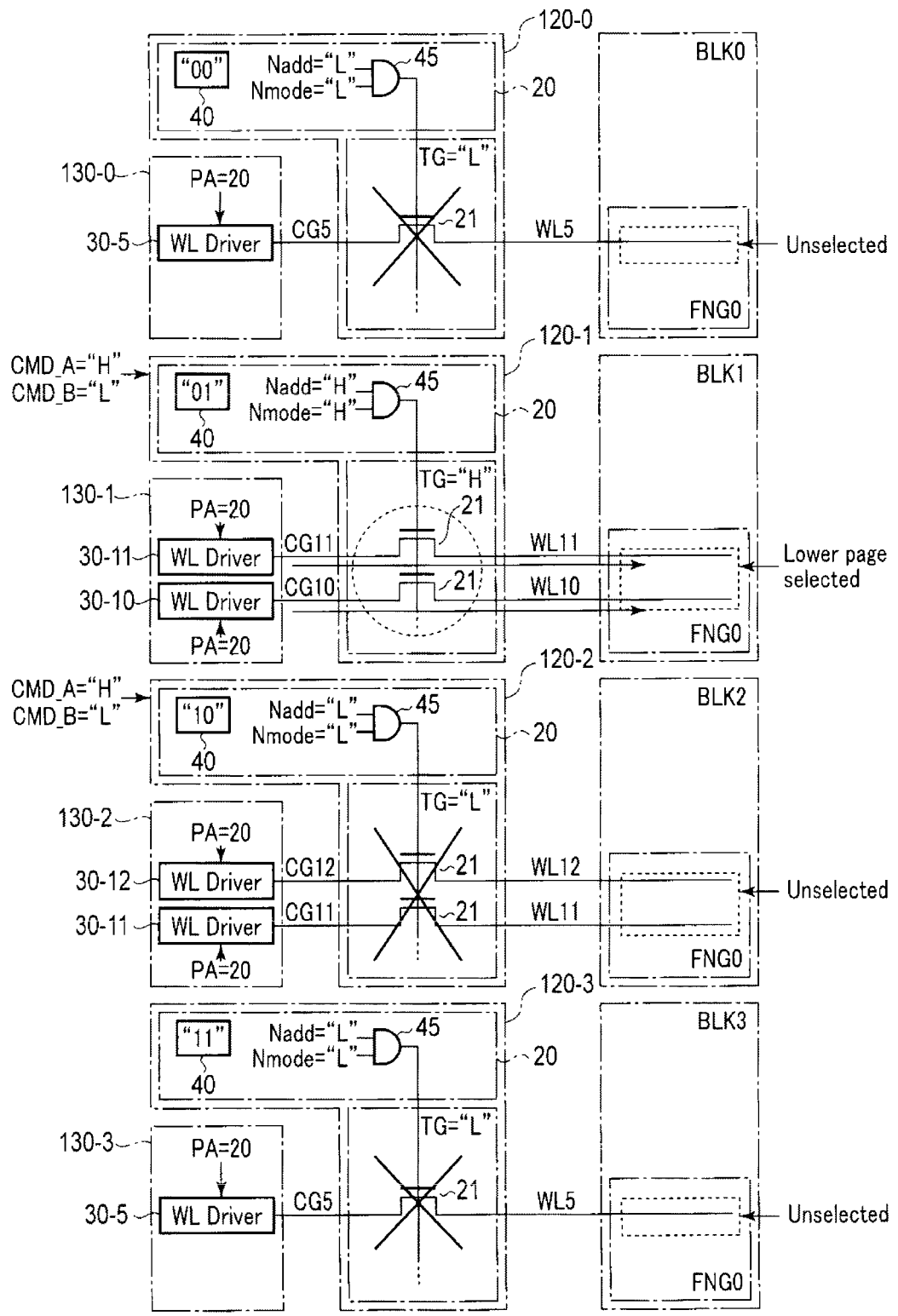
FIG. 18 is a block diagram conceptually illustrating the writing operation in the semiconductor memory device according to the first embodiment.

Next, the operation in the NAND type flash memory 100 will be described with reference to FIG. 18. FIG. 18 corresponds to FIG. 15 described in the normal block.

As illustrated in FIG. 18, block address BA which designates the A-type block BLK1 is imparted to the row decoders 120-0 to 120-3. Then, in the block decoder 20 of the row decoder 120-1 corresponding to block BLK1, the signal of the node Nadd becomes the "H" level.

In addition, the sequencer 170 confirming that the write access to the A-type block is received issues the signal CMD_A (CMD_A="H"), and the issued signal CMD_A is supplied to the row decoders 120-0 to 120-3. As a result, in the block decoder 20 of the row decoder 120-1, since the node N_A becomes the "H" level, the node Nmode becomes the "H" level. Accordingly, the signal line TG becomes "H" level, and the transistors 21, 22, 24, and 26 in the row decoder 120-1 are turned on.

In the driver circuit 130-1, the SGD driver 31-0 corresponding to the page address PA="20", two WL drivers 30-10 and 30-11 select the select gate line SGD0 and two word lines WL10 and WL11, and outputs select voltages, and other drivers output unselected voltages. As a result, the output voltage of the driver circuit 130-1 is transmitted to the finger FNG0 of the block BLK1 via the row decoder 120-1.

That is, two word lines WL10 and WL11 in the finger FNG0 in the block BLK1 are selected, and then the lower page data is allocated to the two word lines WL10 and WL11 is written into the two word lines WL10 and WL11.

Since the signal line TG becomes the "L" level in other row decoders 120-0, 120-2, and 120-3, the word lines WL in the blocks BLK0, BLK2, and BLK3 are in the non-select state.

Figure 19:
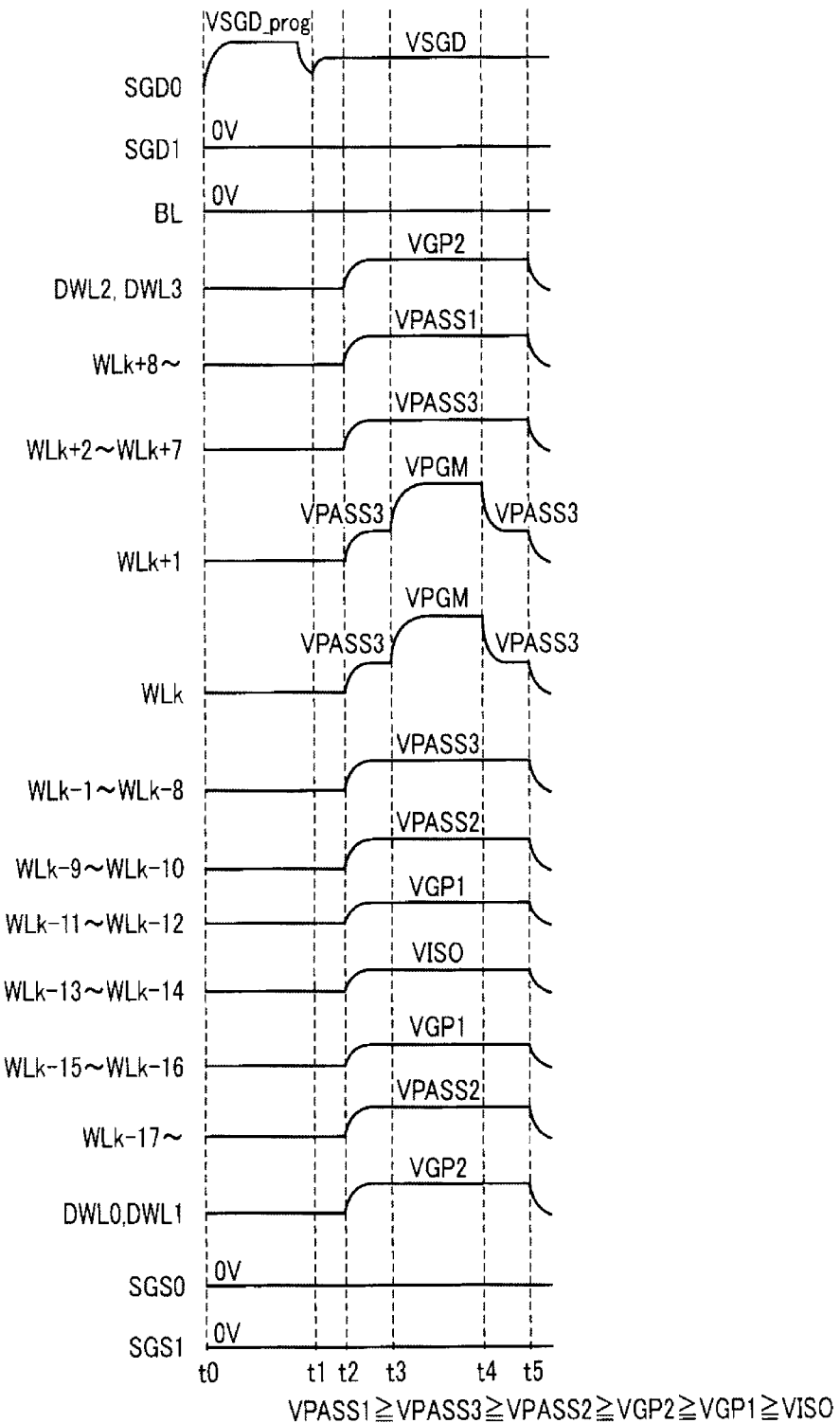
FIG. 19 is a timing diagram illustrating various signals at the time of the writing operation in the semiconductor memory device according to the first embodiment.

Next, the voltages which are applied to the word line WL in the A-type block BLK1, the select gate lines SGD and SGS, the dummy word line DWL, and the bit line BL will be described with reference to FIG. 19. FIG. 19 corresponds to FIG. 16 illustrated in the normal block.

As illustrated in FIG. 19, the difference from the case of the normal block illustrated in FIG. 16 is that the two word lines WLk and WL(k+1) are selected, and the voltage VPGM is applied thereto (k=2g, and (2g+1) is 23 or less). That is, in each of the NAND strings NS, the same data is programmed to two memory cell transistors MTk and MT(k+1) which are connected to two word lines WLk and WL(k+1) which are adjacent to each other.

The same is true for the unselected word line WL, and the same voltage is applied to the adjacent two word lines.

Writing Operation with Respect to B-Type Block

Figure 20:
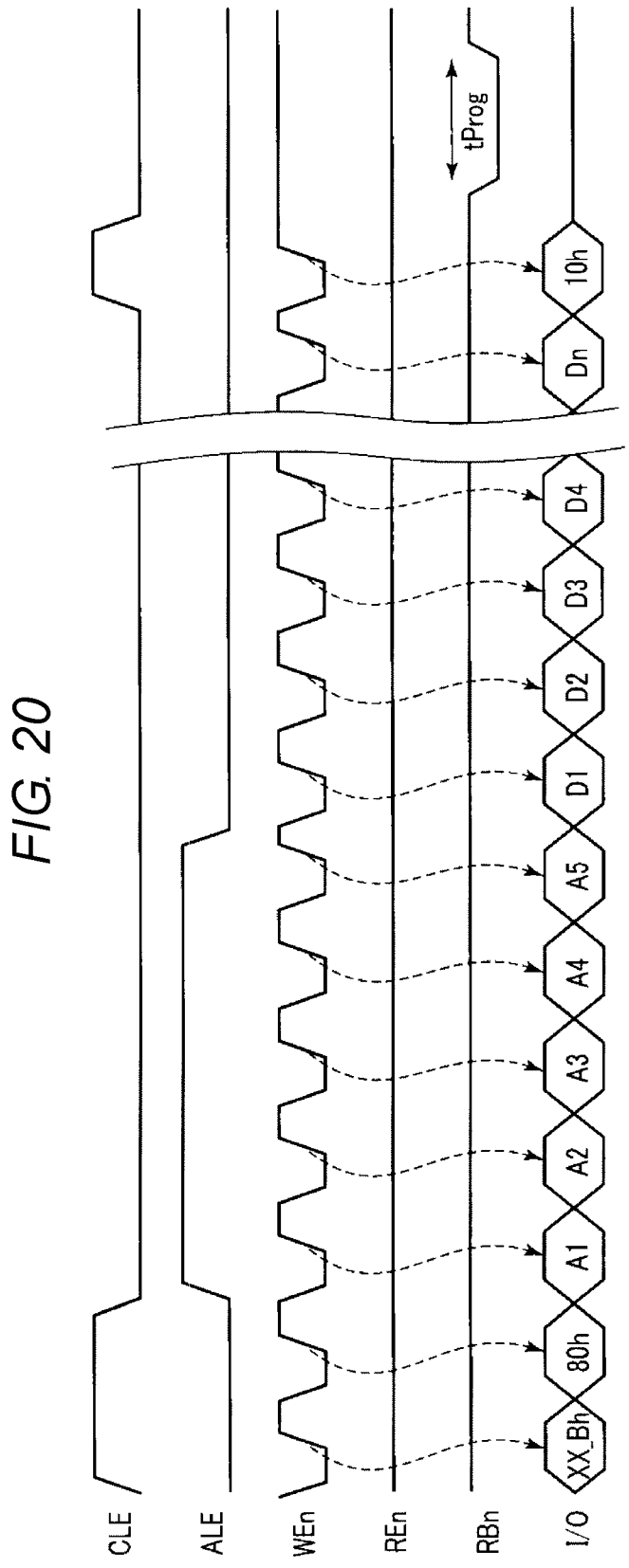
FIG. 20 is a timing diagram illustrating various signals at the time of the writing operation in the memory system according to the first embodiment.

Next, the writing operation of the B-type block will be described with reference to FIG. 20. FIG. 20 corresponds to FIG. 14 illustrating the normal block.

The difference from the writing operation to the normal block is that the controller 200 issues, first, the B mode access command "XX_Bh" (corresponding to step S19 in FIG. 13). Then, from the fact that the B mode access command is retained in the register 160, the sequencer 170 confirms that the write access to the B-type block is received.

Figure 21:
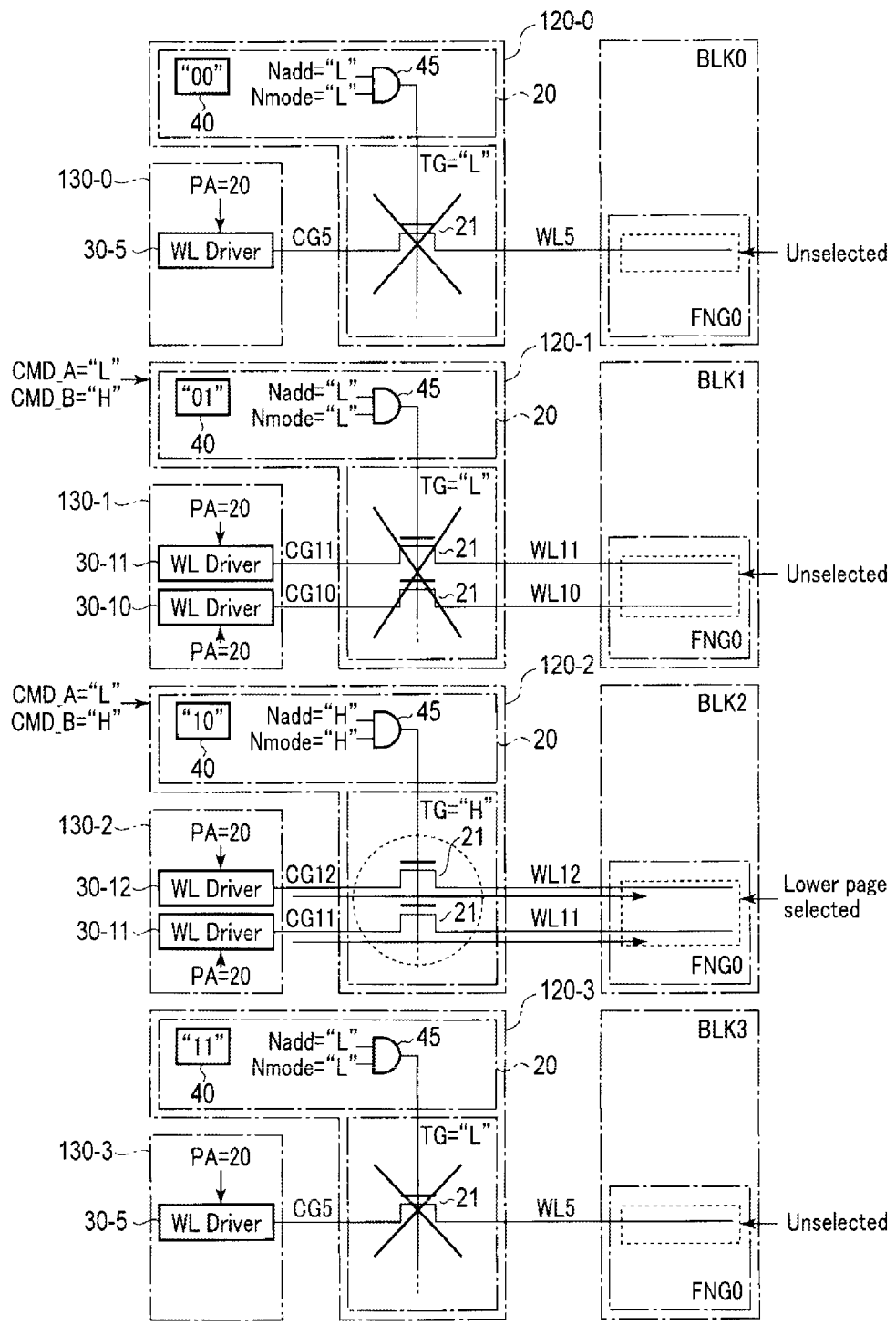
FIG. 21 is a block diagram conceptually illustrating the writing operation in the semiconductor memory device according to the first embodiment.

FIG. 21 corresponds to FIG. 15 which is illustrated in the normal block. As illustrated in FIG. 21, when the block address BA designating the block BLK2 which is the B-type block is imparted to the row decoders 120-0 to 120-3, the signal of the node Nadd becomes the "H" level in the block decoder 20 of the row decoder 120-2.

In addition, the sequencer 170 which confirms that the write access to the B-type block is received issues the signal CMD_B (CMD_B="H"). As a result, the node N_B becomes the "H" level, and the node Nmode becomes the "H" level in the block decoder 20 of the row decoder 120-2. Accordingly, the signal line TG becomes the "H" level, and the transistors 21, 22, 24, and 26 are turned on in the row decoder 120-2.

In the driver circuit 130-2, the SGD driver 31-0 and the two WL drivers 30-11 and 30-12 which correspond to the page address PA="20" select the select gate line SGD0, and the two word lines WL11 and WL12. As a result, the output voltage of the driver circuit 130-2 is transmitted to the finger FNG0 of the block BLK2 via the row decoder 120-2.

That is, two word lines WL11 and WL12 of the finger FNG0 in the block BLK2 are selected, and the allocated lower page data is written into the selected word lines WL11 and WL12.

Since the signal line TG becomes the "L" level in other row decoders 120-0, 120-1, and 120-3, the word line WL in the blocks BLK0, BLK1, and BLK3 is in the non-select state.

Figure 22:
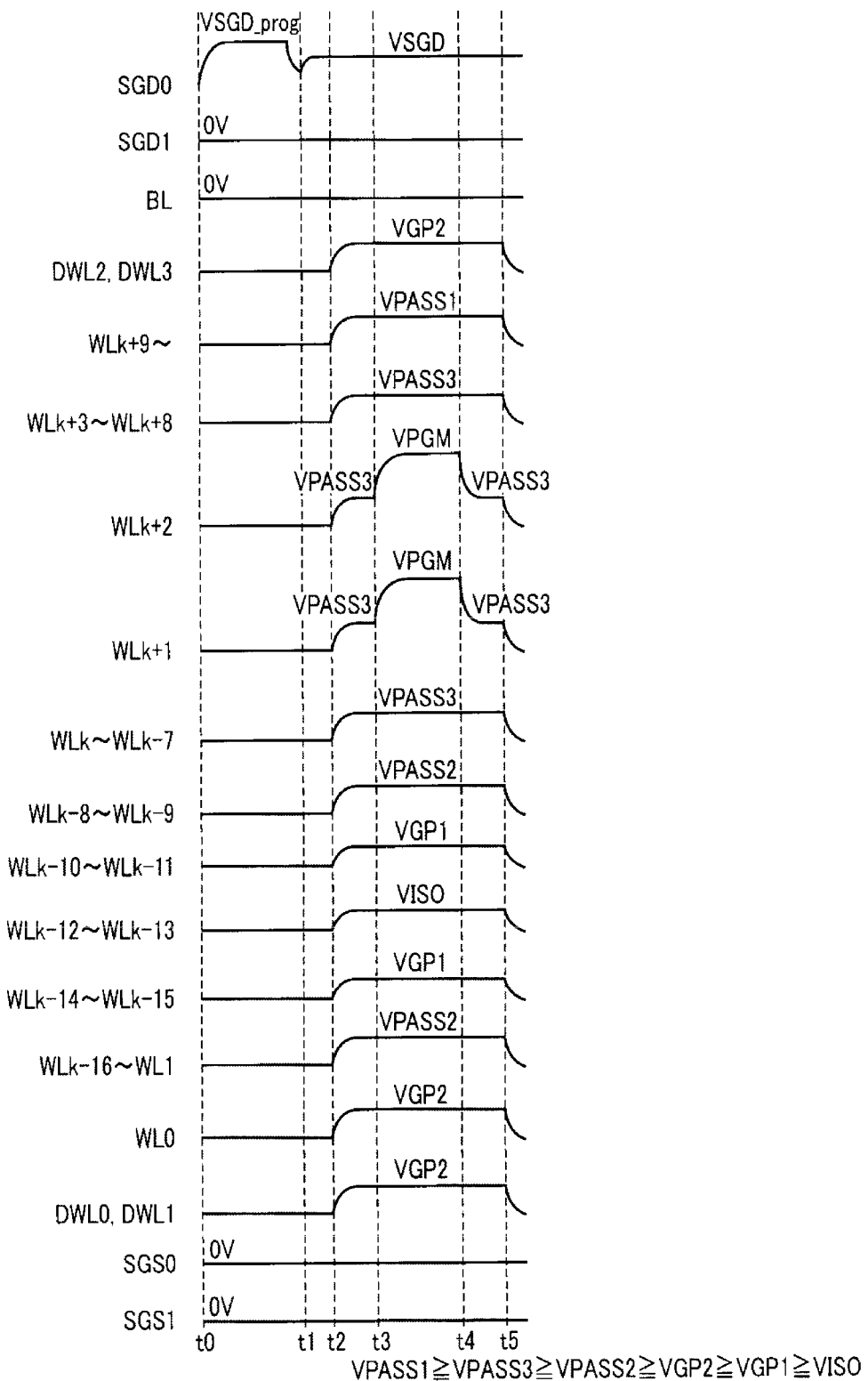
FIG. 22 is a timing diagram illustrating various signals at the time of the writing operation in the semiconductor memory device according to the first embodiment.

Next, the voltages which are applied to the word line WL, the select gate lines SGD and SGS, the dummy word line DWL, and the bit line BL in the B-type block BLK2 will be described with reference to FIG. 22. FIG. 22 corresponds to FIG. 16 which is illustrated in the normal block.

As illustrated in FIG. 22, the difference from the case of the normal block illustrated in FIG. 16 is that two word lines WL(k+1) and WL(k+2) are selected, and the voltages VPGM is applied thereto. That is, in each of the NAND strings NS, the same data is programmed in two memory cell transistors MT(k+1) and MT(k+2) which are connected to the two word lines WL(k+1) and WL(k+2) which are adjacent to each other.

That is, two word lines WL are selected at the same time even in the B-type block as in the A-type block, but the combination of the word lines WL which are selected at the same time is different from that upon selecting the A-type block.

1.2.3 Reading Operation

Next, the reading operation will be described. Hereinbelow, the description will focus on the differences from the writing operation.

Reading Operation with Respect to Normal Block

Figure 23:
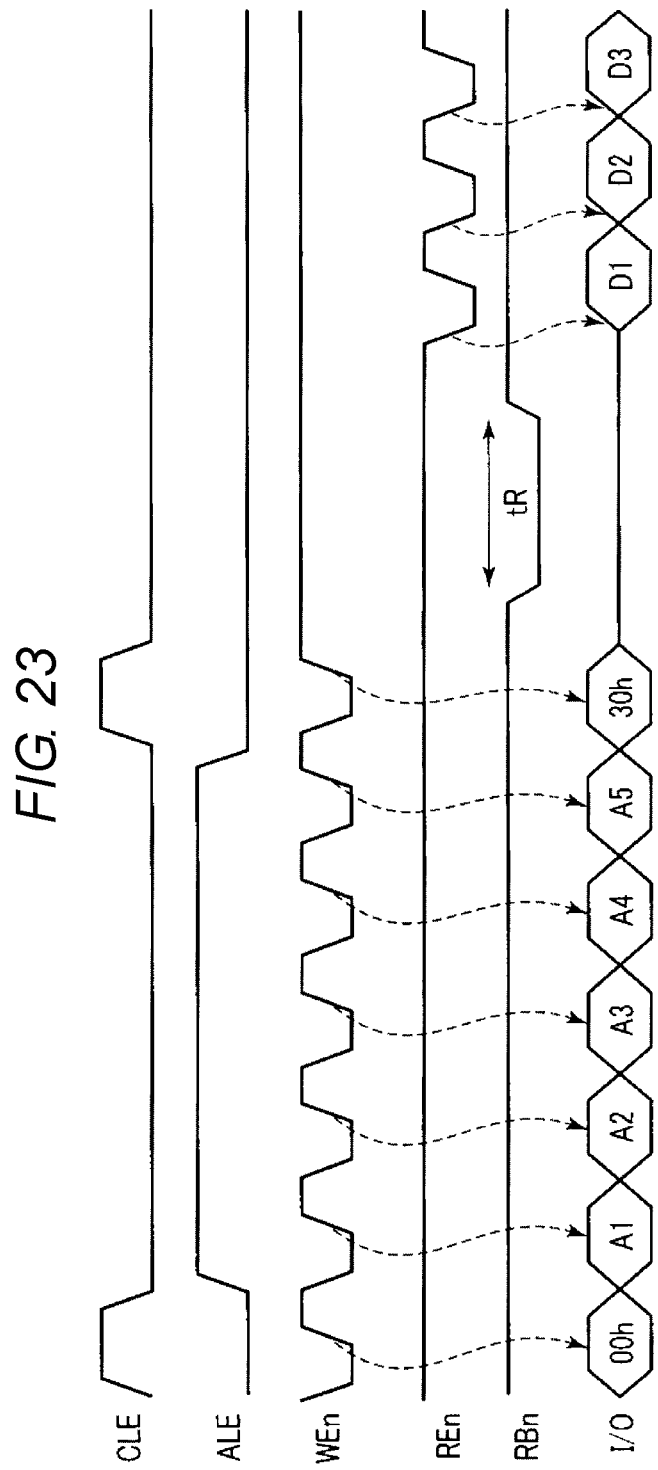
FIG. 23 is a timing diagram illustrating various signals at the time of a reading operation in the memory system according to the first embodiment.

FIG. 23 is a timing diagram illustrating various signals on the NAND bus when data is read from the normal block.

As illustrated in FIG. 23, the controller 200, first, issues a read command "00h" (corresponding to step S14 in FIG. 13), subsequently issues the addresses (A1 to A5), and thereafter, issues a command "30h". Considering the fact that the normal read command is retained in the register 160, the sequencer 170 confirms that the read access to the normal block is received. Further, in response to the reception of the command "30h", the sequencer 170 starts performing the reading operation, and the NAND type flash memory 100 becomes in a busy state (RBn="L").

When the NAND type flash memory 100 is returned to be the ready state (RBn="H"), the controller 200 causes the signal REn to be toggled. In synchronization with the signal REn, the read data is transmitted to the controller 200 from the NAND type flash memory 100.

The operation in the NAND type flash memory 100 is the same as that in FIG. 15, the transistors 21, 22, 24, and 26 are turned on in the row decoder 120-0 corresponding to the normal block BLK0.

Figure 24:
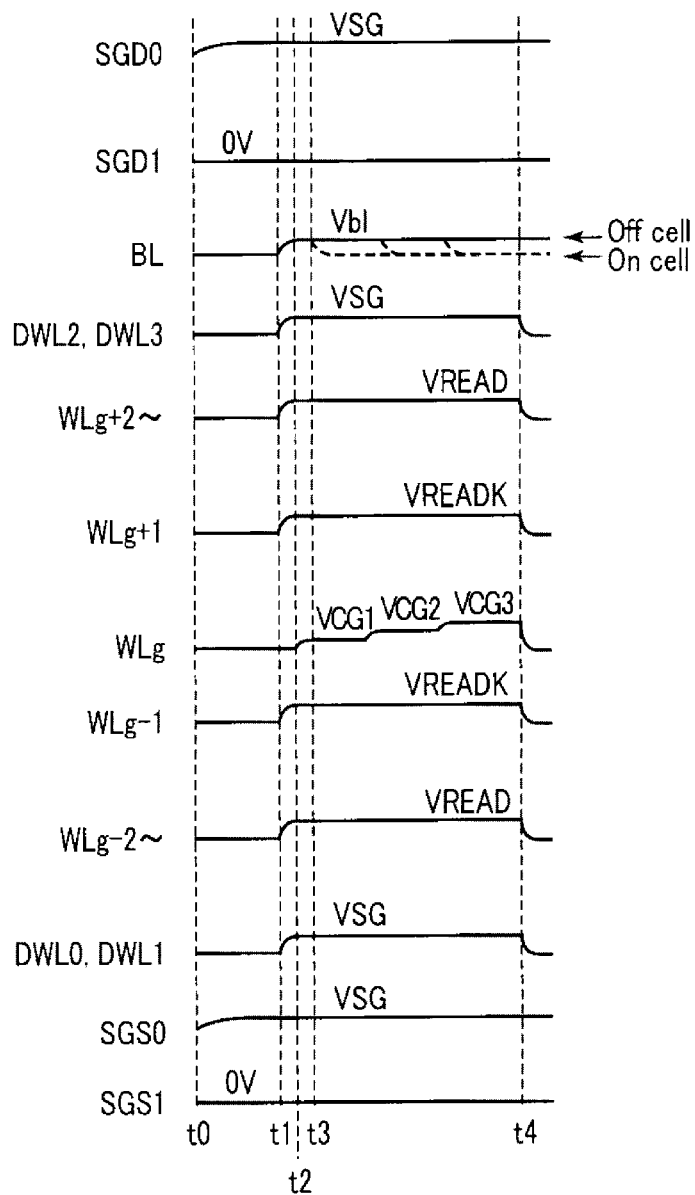
FIG. 24 is a timing diagram illustrating various signals at the time of the reading operation in the semiconductor memory device according to the first embodiment.

FIG. 24 is a timing diagram illustrating the voltages which are applied to the word line WL, the select gate lines SGD and SGS, the dummy word line DWL, and the bit line BL at the time of reading operation with respect to data block BLK0.

As illustrated in FIG. 24, during the time period t0, the SGD driver 31-0 and SGS driver 32-0 apply a voltage VSG to the select gate lines SGD0 and SGS0. The voltage VSG is a voltage causing the select transistor ST1 to be turned on. In addition, the SGD driver 31-1 and the SGS driver 32-1 apply 0 V to the select gate line SGD1 and SGS1.

Next, during the time period t1, the sense amplifier 140 precharges the bit line BL to a voltage Vb1. In addition, the WL driver 30 corresponding to the unselected word line WL applies the voltage VREAD or VREADK to the unselected word line WL. The voltages VREAD and VREADK allow the memory cell transistor MT to be turned on regardless of retained data. The voltage VREADK is applied to the unselected word lines WL(g+1) and WL(g−1) which are adjacent to the selected word line WLg, for example, an expression of VREADK>VREAD is established. Alternatively, an expression of VREADK=VREAD may be established. In addition, when the DWL driver 33 applies the voltage VSG to the dummy word line DWL, the dummy transistor DT is turned on. Note that, the voltages VSG and VREAD may have the same value.

Next, during the time period t2, a WL driver 30-g sequentially applies the read voltages VCG1, VCG2, and VCG3 to the selected word line WLg. When the memory cell transistor MT which is connected to the selected word line WLg is turned on due to the applying of the read voltage, a cell current flows from the bit line BL toward the source line SL in the NAND string NS. It is possible to determine data by sensing the aforementioned current by the sense amplifier 140.

Read Operation with Respect to A-Type Block

Next, the reading operation from the A-type block will be described. Hereinbelow, the description will focus on the differences from the reading operation from the normal block.

Figure 25:
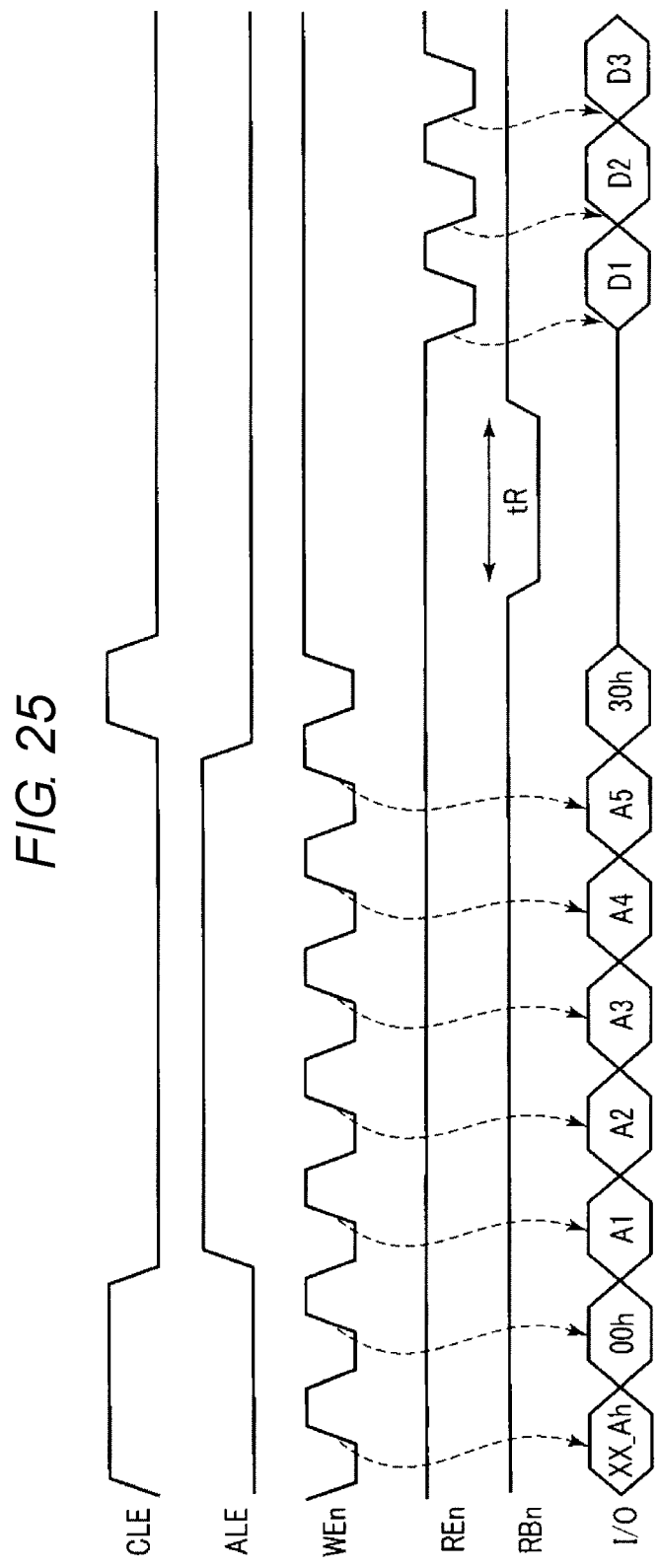
FIG. 25 is a timing diagram illustrating various signals at the time of the reading operation in the memory system according to the first embodiment.

FIG. 25 is a timing diagram of various signals on the NAND bus, and corresponds to FIG. 23 illustrating in the normal block. The difference from the case at the time of reading data from the normal block illustrated in FIG. 23 is that the controller 200 issues the A mode access command "XX_Ah" before issuing the command "00h". This is the same as the writing operation to the A-type block. Others are as illustrated in FIG. 23.

The operation of the NAND type flash memory 100 is the same as that in FIG. 18 described at the time of the writing operation. That is, when the sequencer 170 issues the signal CMD_A, the signal line TG in the row decoder 120-1 becomes the "H" level.

Figure 26:
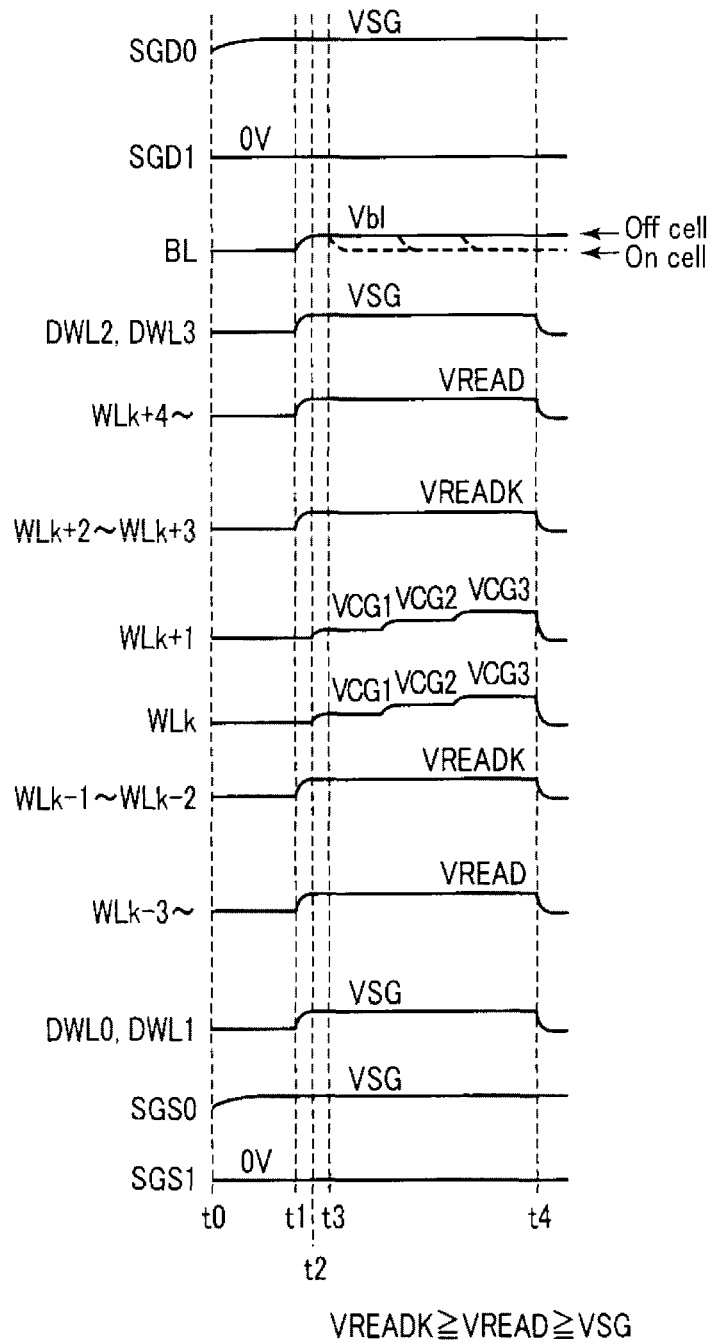
FIG. 26 is a timing diagram illustrating various signals at the time of the reading operation in the semiconductor memory device according to the first embodiment.

Next, the voltages which are applied to the word line WL, the select gate lines SGD and SGS, the dummy word line DWL, and the bit line BL in the A-type block BLK1 will be described with reference to FIG. 26. FIG. 26 corresponds to FIG. 24 which is described in the normal block.

As illustrated in FIG. 26, the difference from the case of the normal block is that the two word lines WLk and WL(k+1) are selected similarly at the time of writing operation, and the voltages VCG1 to VCG3 are applied thereto (k=2g, and (2g+1) is 23 or less). That is, in each of the NAND strings NS, the same data is read at the same time from two memory cell transistors MTk and MT(k+1) which are connected to two word lines WLk and WL(k+1) which are adjacent to each other.

Reading Operation with Respect to B-Type Block

Next, the reading operation from the B-type block will be described. Hereinbelow, the description will focus on the differences from the writing operation to the normal block.

A timing diagram of various signals on the NAND bus at the time of accessing the B-type block BLK2 corresponds to a timing diagram in which the A mode access command "XX_Ah" is replaced with the B mode access command "XX_Bh" in FIG. 25.

In addition, the operation of the NAND type flash memory 100 is the same as in FIG. 21 described at the time of the writing operation. That is, when the sequencer 170 issues the signal CMD_B, the signal line TG in the row decoder 120-2 becomes the "H" level.

Figure 27:
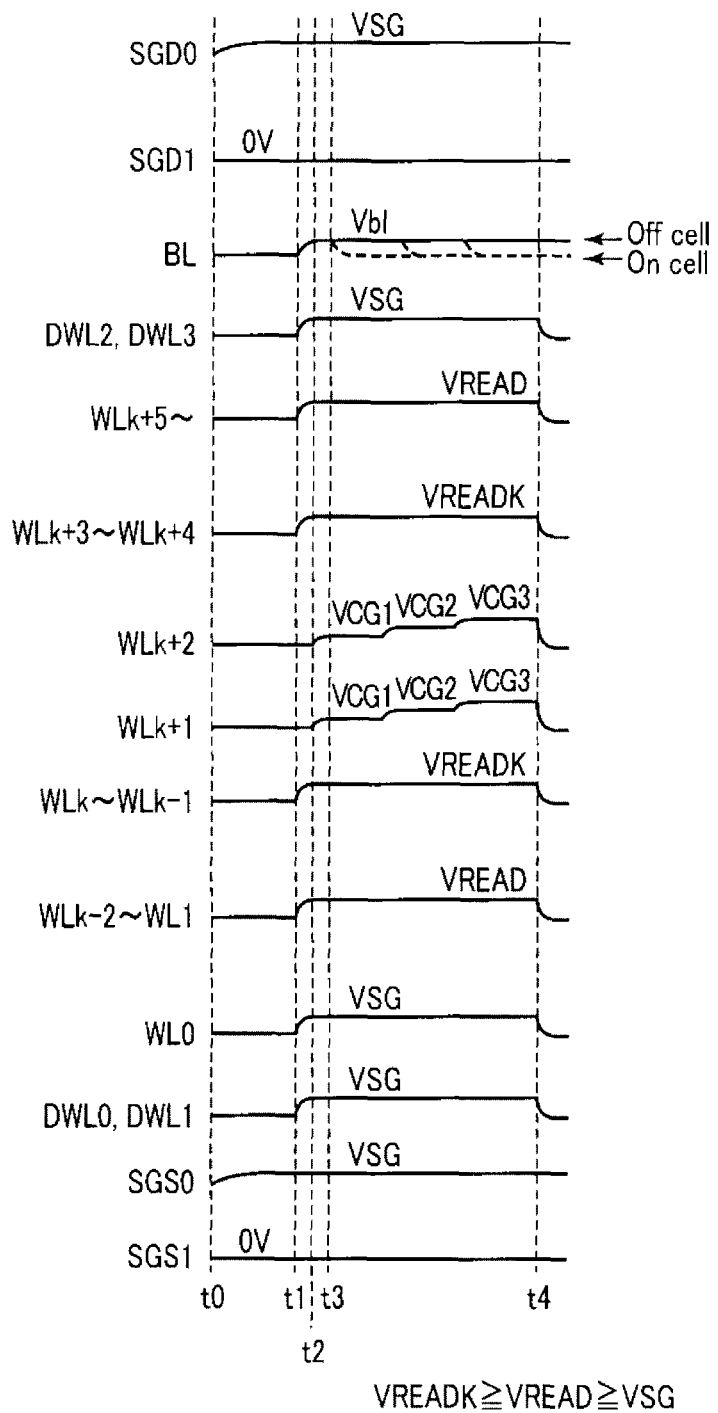
FIG. 27 is a timing diagram illustrating various signals at the time of the reading operation in the semiconductor memory device according to the first embodiment.

Next, the voltages which are applied to the word line WL, the select gate lines SGD and SGS, the dummy word line DWL, and the bit line BL in the B-type block BLK2 will be described with reference to FIG. 27. FIG. 27 corresponds to FIG. 24 which is described in the normal block.

As illustrated in FIG. 27, the difference from the case of the normal block illustrated in FIG. 24 is that two word lines WL(k+1) and WL(k+2) are selected, and the voltages VCG1 to VCG3 are applied thereto. That is, in each of the NAND strings NS, the same data is read at the same time from two memory cell transistors MT(k+1) and MT(k+2) which are connected to two word lines WL(k+1) and WL(k+2) which are adjacent to each other.

1.2.4 Erase Verifying Operation

Next, the erase verifying operation will be described. The erase verifying is an operation for confirming whether or not a threshold voltage of the memory cell transistor MT is sufficiently reduced through the erasing operation. In addition, the erase verifying operation is substantially the same operation as the reading operation except that data is read from a plurality of word lines WL. Note that, hereinbelow, an example of a case in which data is erased by a block unit will be described.

Erase Verifying Operation with Respect to Normal Block

Figure 28:
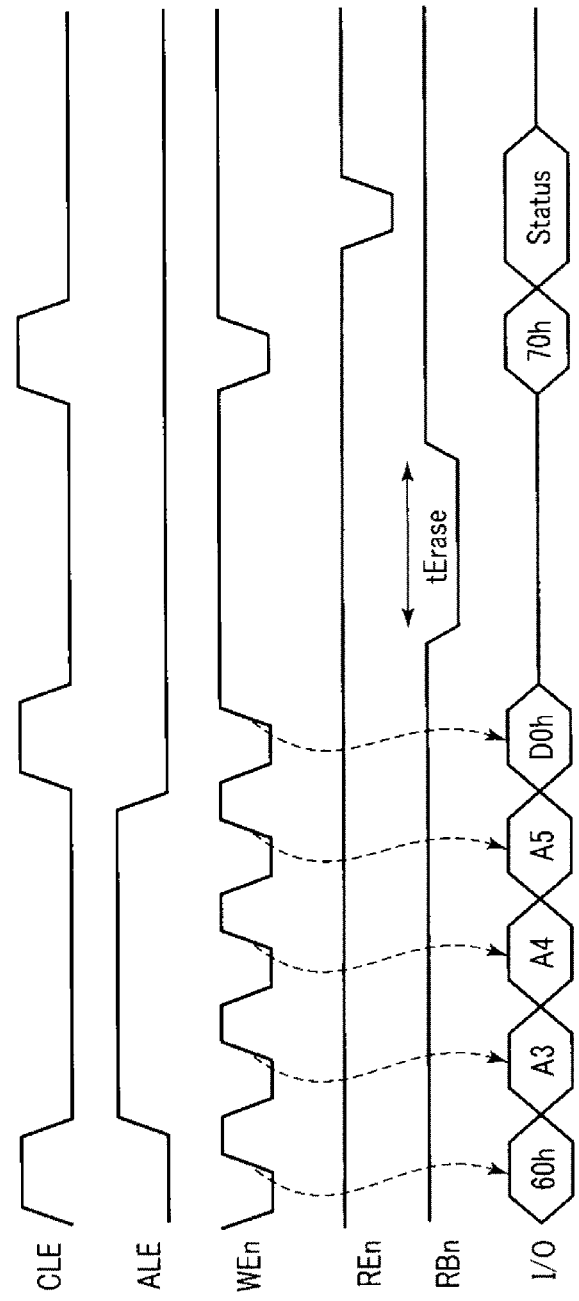
FIG. 28 is a timing diagram illustrating various signals at the time of an erase verifying operation in the memory system according to the first embodiment.

FIG. 28 is a timing diagram of various signals on the NAND bus when performing the erase verifying with respect to the normal block.

As illustrated in FIG. 28, the controller 200, first, issues a normal erase command "60h" (corresponding to step S14 in FIG. 13), subsequently, issues block addresses (A3 to A5) of the block BLK to be erased, and thereafter, issues a command "D0h". Considering the fact that the erase command is retained in the register 160, the sequencer 170 confirms that the erase access to the normal block is received. Then, in response to the reception of the command "D0h", the sequencer 170 starts performing the erasing operation, and the NAND type flash memory 100 becomes in a busy state (RBn="L"). During this busy state, in the NAND type flash memory 100, the erasing operation and the erase verifying operation are performed with respect to data.

When the NAND type flash memory 100 is returned to be the ready state, the controller 200 issues a status read command "70h", and asserts the signal REn. In synchronization with the signal REn, status information indicating whether or not the erasing operation is correctly completed is transmitted to the controller 200 from a status register (not illustrated in FIG. 1) of the NAND type flash memory 100.

The operation of the row decoder 120 in the NAND type flash memory 100 is the same as that in the writing operation illustrated in FIG. 15, and the transistors 21, 22, 24, and 26 are turned on in the row decoder 120-0 corresponding to the normal block BLK0.

Figure 29:
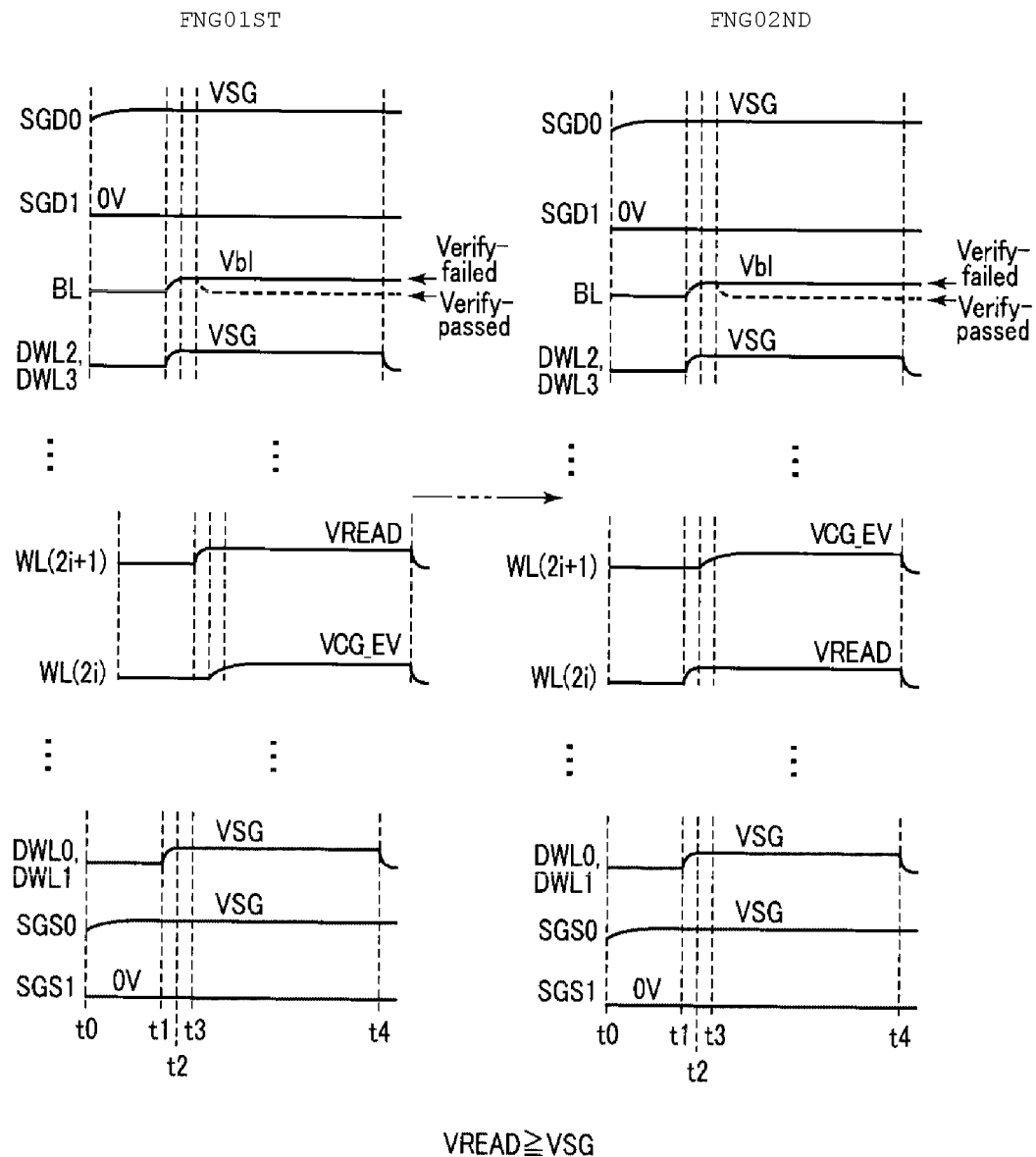
FIG. 29 is a timing diagram illustrating various signals at the time of the erase verifying operation in the semiconductor memory device according to the first embodiment.

FIG. 29 is a timing diagram illustrating the voltages applied to the word line WL, the select gate lines SGD and SGS, the dummy word line DWL, and the bit line BL at the time of the erase verifying operation with respect to the block BLK0.

As described above, since data is erased by a block BLK unit, the erase verifying operation is performed with respect to the fingers FNG0 and FNG1 which are included in the block BLK to be erased. In addition, the erase verifying operation with respect to each of the fingers FNG is performed twice. FIG. 29 illustrates a first erase verifying operation and a second erase verifying operation with respect to the finger FNG0.

As illustrated in the left side of FIG. 29, in the first erase verifying operation, the memory cell transistor MT which is connected to the even-number word line WL is set as an erase verifying target. That is, the WL driver 30-2$i$ ($i$ is an integer between 0 and 11) selects each of the word lines WL2$i$ (=WL0, WL2, WL4, WL6, . . . ), and applies the erase verifying voltage VCG_EV to the selected word line WL2$i$. The voltage VCG_EV is a voltage which becomes a standard when determining whether or not the threshold voltage of the memory cell transistor MT reaches an erasing level. In addition, the WL drivers 30-(2$i$++1) apply the voltage VREAD to each of the word lines WL(2$i$+1) (=WL1, WL3, WL5, WL7, . . . ).

Others are the same as those at the time of the reading operation. In this state, when the current flows to the source line SL from the entire bit line BL, it is determined that data of the memory cell transistor MT which is connected to the even-number word line WL2$i$ is erased.

In the second erase verifying operation, as illustrated in the right side of FIG. 29, the memory cell transistor MT which is connected to the odd-number word line WL is set as the erase verifying target. That is, the WL drivers 30-(2i+1) (i is an integer between 0 and 11) select each of the word line WL(2i+1) (=WL1, WL3, WL5, WL7, . . . ), and apply the erase verifying voltage VCG_EV to the selected word line WL (2i+1). In addition, the WL driver 30-2i applies the voltage VREAD to each of the word lines WL2i (=WL0, WL2, WL4, WL6, . . . ).

Others are the same as those at the time of the reading operation. In this state, when the current flows to the source line SL from the entire bit line BL, it is determined that data of the memory cell transistor MT which is connected to the odd-number word line WL(2i+1) is erased.

Subsequently, the erase verifying operation is performed with respect to the finger FNG1. A different point from the erase verifying operation with respect to the finger FNG0 is that the voltage VSG is applied to the select gate lines SGD1 and SGS1 instead of the select gate lines SGD0 and SGS0, and others are the same as the erase verifying operation.

Erase Verifying Operation with Respect to A-Type Block

Next, the erase verifying operation with respect to the A-type block will be described. Hereinbelow, the description will focus on the differences from the erase verifying operation with respect to the normal block.

Figure 30:
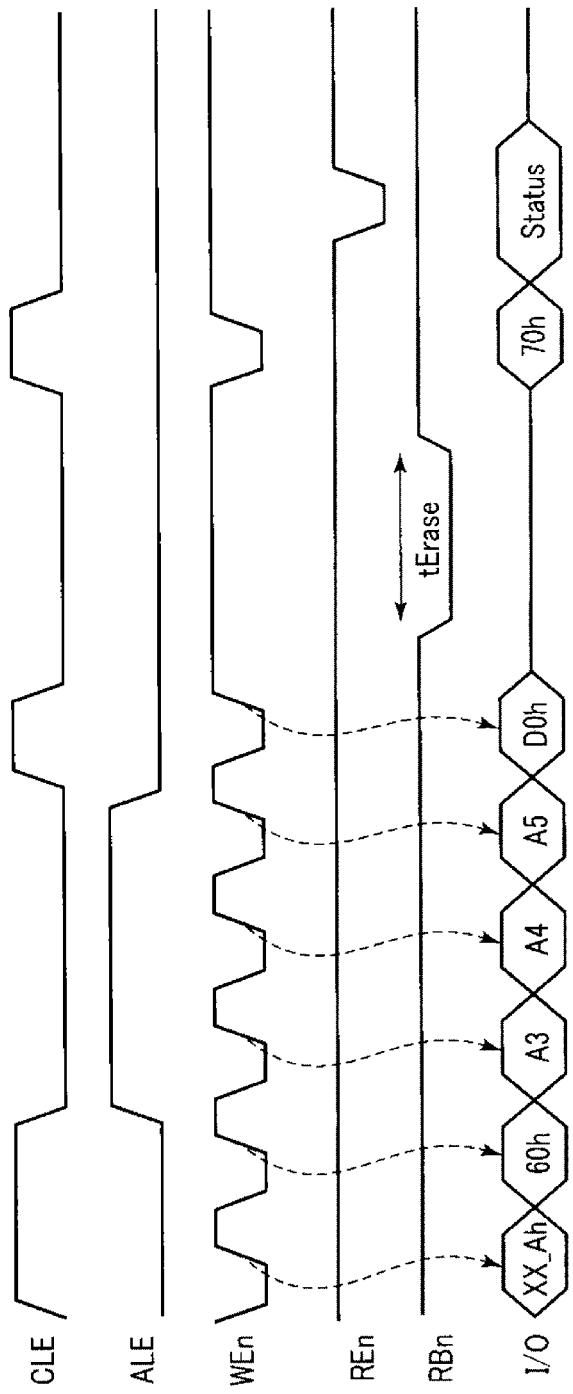
FIG. 30 is a timing diagram illustrating various signals at the time of the erase verifying operation in the memory system according to the first embodiment.

FIG. 30 is a timing diagram of various signals on the NAND bus and corresponds to FIG. 28. The difference from the case at the time of the erase verifying operation in the normal block illustrated in FIG. 28 is that the controller 200 issues the A mode access command "XX_Ah" before issuing a command "60h". This is the same at the time of the writing operation and the reading operation. Others are as illustrated in FIG. 28.

The operation of the row decoder 120 in the NAND type flash memory 100 is the same as that in FIG. 18 described at the time of the writing operation. That is, when the sequencer 170 issues the signal CMD_A, the signal line TG in the row decoder 120-1 becomes the "H" level.

Figure 31:
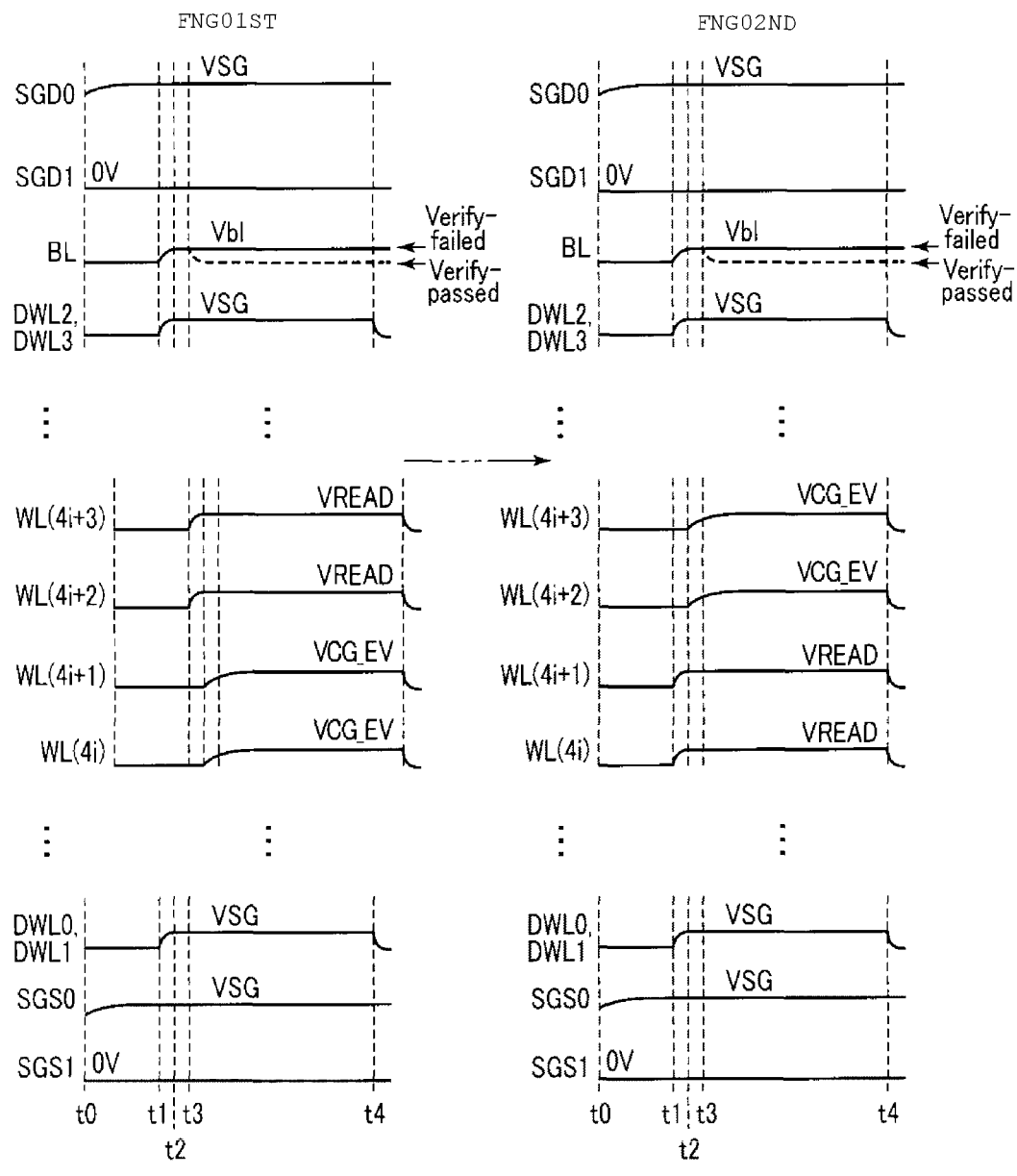
FIG. 31 is a timing diagram illustrating various signals at the time of the erase verifying operation in the semiconductor memory device according to the first embodiment.

FIG. 31 is a timing diagram illustrating the voltages which are applied to the word line WL, the select gate lines SGD and SGS, the dummy word line DWL, and the bit line BL at the time of the erase verifying operation with respect to the A-type block BLK1, and corresponds to FIG. 29.

Similar to the normal block BLK0, also in the case of the A-type block BLK1, the erase verifying operation with respect to each of the fingers FNG is performed twice. FIG. 31 illustrates the first erase verifying operation and the second erase verifying operation with respect to the finger FNG0. The difference from the case of the normal block BLK0 is that the word line WL is selected or unselected by two-line unit in the A-type block BLK1.

As illustrated in the left side of FIG. 31, in the first erase verifying operation, the memory cell transistor MT which is connected to any one of the even-number word lines WL, and the memory cell transistor MT which is connected to the odd-number word line WL which is adjacent to the even-number word line WL on the drain side are set to be the erase verifying targets.

That is, the WL drivers 30-4i and 30-(4i+1) (i is an integer between 0 and 5) select each of the word lines WL4i and the word line WL(4i+1), and apply the erase verifying voltage VCG_EV to these word lines WL4i and WL(4i+1). More specifically, the voltage VCG_EV is applied to the word lines WL0, WL1, WL4, WL5, WL8, WL9, WL12, WL13 . . . .

In addition, the WL drivers 30-(4i+2) and 30-(4i+3) apply the voltage VREAD to each of the word line WL(4i+2) and the word line WL(4i+3). More specifically, the voltage VREAD is applied to the word lines WL2, WL3, WL6, WL7, WL10, WL11, WL14, WL15 . . . .

Others are the same as those at the time of the reading operation.

In the second erase verifying operation, as illustrated in the right side of FIG. 31, the word lines WL which is unselected in the first erase verifying operation is set as the erase verifying target. That is, the WL drivers 30-(4i+2) and 30-(4i+3) (i is an integer between 0 and 5) select each of the word line WL(4i+2) and the word line WL(4i+3), and apply the erase verifying voltage VCG_EV to these word lines WL(4i+2) and WL(4i+3). That is, the voltage VCG_EV is applied to the word lines WL2, WL3, WL6, WL7, WL10, WL11, WL14, WL15, and . . . .

In addition, the WL drivers 30-4i and 30-(4i+1) apply the voltage VREAD to each of the word line WL(4i) and the word line WL(4i+1). That is, the voltage VREAD is applied to the word lines WL0, WL1, WL4, WL5, WL8, WL9, WL12, WL13 . . . .

Others are the same as those at the time of the reading operation. Subsequently, the erase verifying operation is performed with respect to the finger FNG1.

Erase Verifying Operation with Respect to B-Type Block

Next, the erase verifying operation with respect to the B-type block will be described. Hereinbelow, the description will focus on the differences from the erase verifying operation with respect to the A-type block BLK1.

A timing diagram of various signals on the NAND bus corresponds to a timing diagram in which the A mode access command "XX_Ah" is replaced with the B mode access command "XX_Bh" in FIG. 30.

In addition, the operation of the row decoder 120 in the NAND type flash memory 100 is the same as that in the writing operation illustrated in FIG. 21. That is, when the sequencer 170 issues the signal CMD_B, the signal line TG in the row decoder 120-2 becomes the "H" level.

Figure 32:
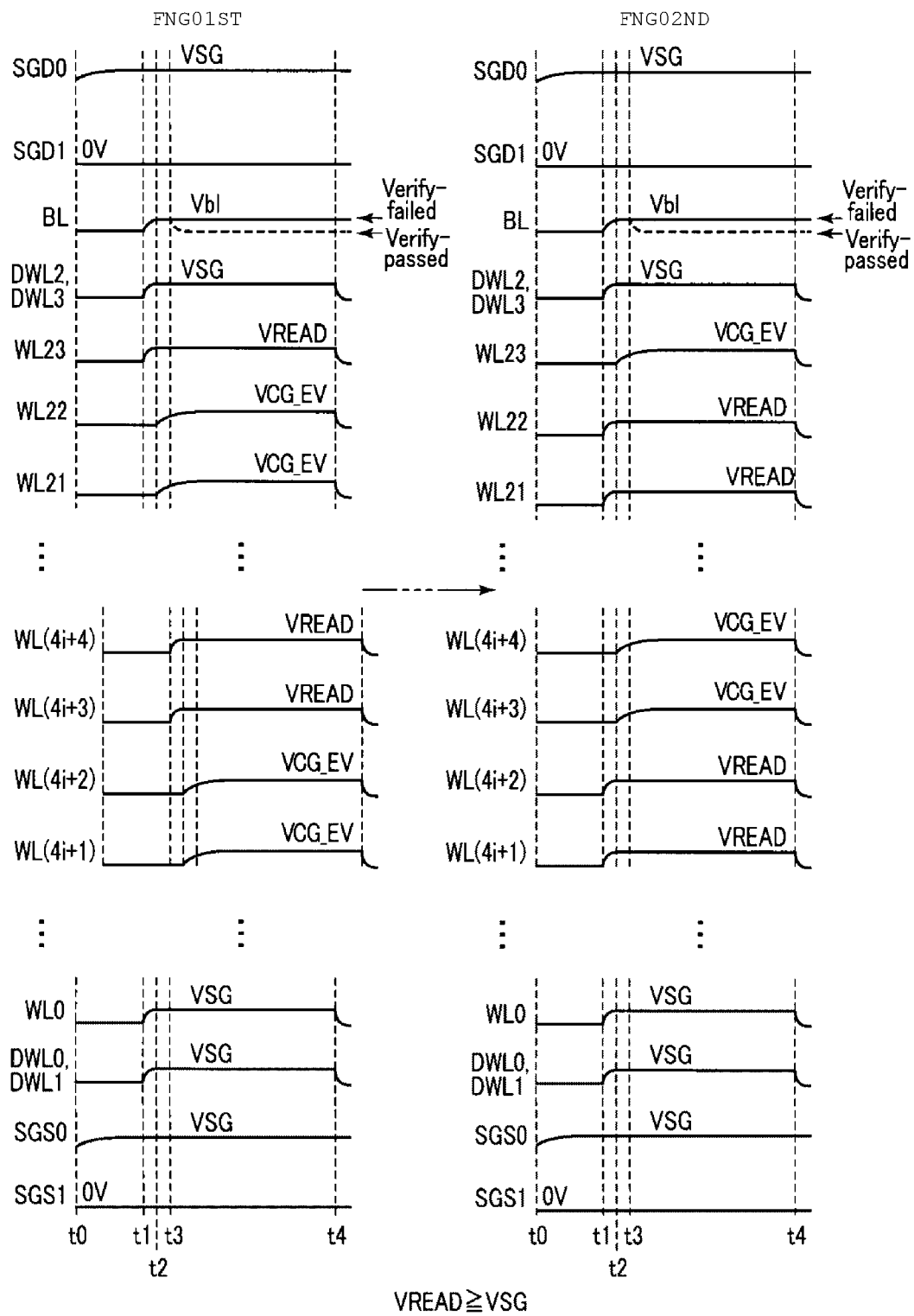
FIG. 32 is a timing diagram illustrating various signals at the time of the erase verifying operation in the semiconductor memory device according to the first embodiment.

FIG. 32 is a timing diagram illustrating the voltages which are applied to the word line WL, the select gate lines SGD and SGS, the dummy word line DWL, and the bit line BL at the time of the erase verifying operation with respect to the B-type block BLK2, and corresponds to FIG. 29.

The difference from the case of the A-type BLK1 is that in the erase verifying operation of the B-type block BLK2, the selected two word lines WL, which are the memory cell transistor MT which is connected to any one of the even-number word lines WL, and the memory cell transistor MT which is connected to the odd-number word lines WL which are adjacent to each other on the source side, are set as the erase verifying targets.

As illustrated in the left side of FIG. 32, in the first erase verifying operation, the WL drivers 30-(4i+1), 30-(4i+2) (i is an integer between 0 and 4), 30-21, and 30-22 select each of the word lines WL(4i+1), WL(4i+2), WL21, and WL22, and apply the erase verifying voltage VCG_EV to these word lines WL(4i+1), WL(4i+2), WL21, and WL22. That is, the voltage VCG_EV is applied to the word line WL1, WL2, WL5, WL6, WL9, WL10, WL13, WL14 . . . , WL21, and WL22.

In addition, the WL drivers 30-(4i+3), 30-(4i+4), and 30-23 apply the voltage VREAD to each of the word line WL (4i+3) (=WL3, WL7, WL11, WL15, . . . ), the word lines WL(4i+4) (=WL4, WL8, WL12, WL16, . . . ), and WL23. That is, the voltage VREAD is applied to the word lines WL3, WL4, WL7, WL8, WL11, WL12, WL15, WL16, . . . , and WL23.

In addition, the WL driver 30-0 applies the voltage VSG to the word line WL0.

Others are the same as those at the time of the reading operation.

In the second erase verifying operation, as illustrated in the right side of FIG. 32, the word lines WL which is unselected in the first erase verifying operation is set to be the erase verifying target. That is, the WL drivers 30-(4i+3), 30-(4i+4) (i is and integer between 0 and 4), and 30-23 select each of the word line WL(4i+3), the word lines WL(4i+4), and WL23, and apply the erase verifying voltage VCG_EV to these word lines WL(4i+3), WL(4i+4), and WL23. In addition, the WL drivers 30-(4i+1), 30-(4i+2), 30-21, and 30-22 apply the voltage VREAD to each of the word line WL(4i+1), the word lines WL(4i+2), WL21, and WL22.

In addition, the WL driver 30-0 applies the voltage VSG to the word line WL0.

Others are the same as those at the time of the reading operation. Subsequently, the erase verifying operation is performed with respect to the finger FNG1.

1.3 Effects According to Exemplary Embodiment

With a configuration according to the exemplary embodiment, it is possible to efficiently reduce defects. The effects will be described below.

Figure 33:
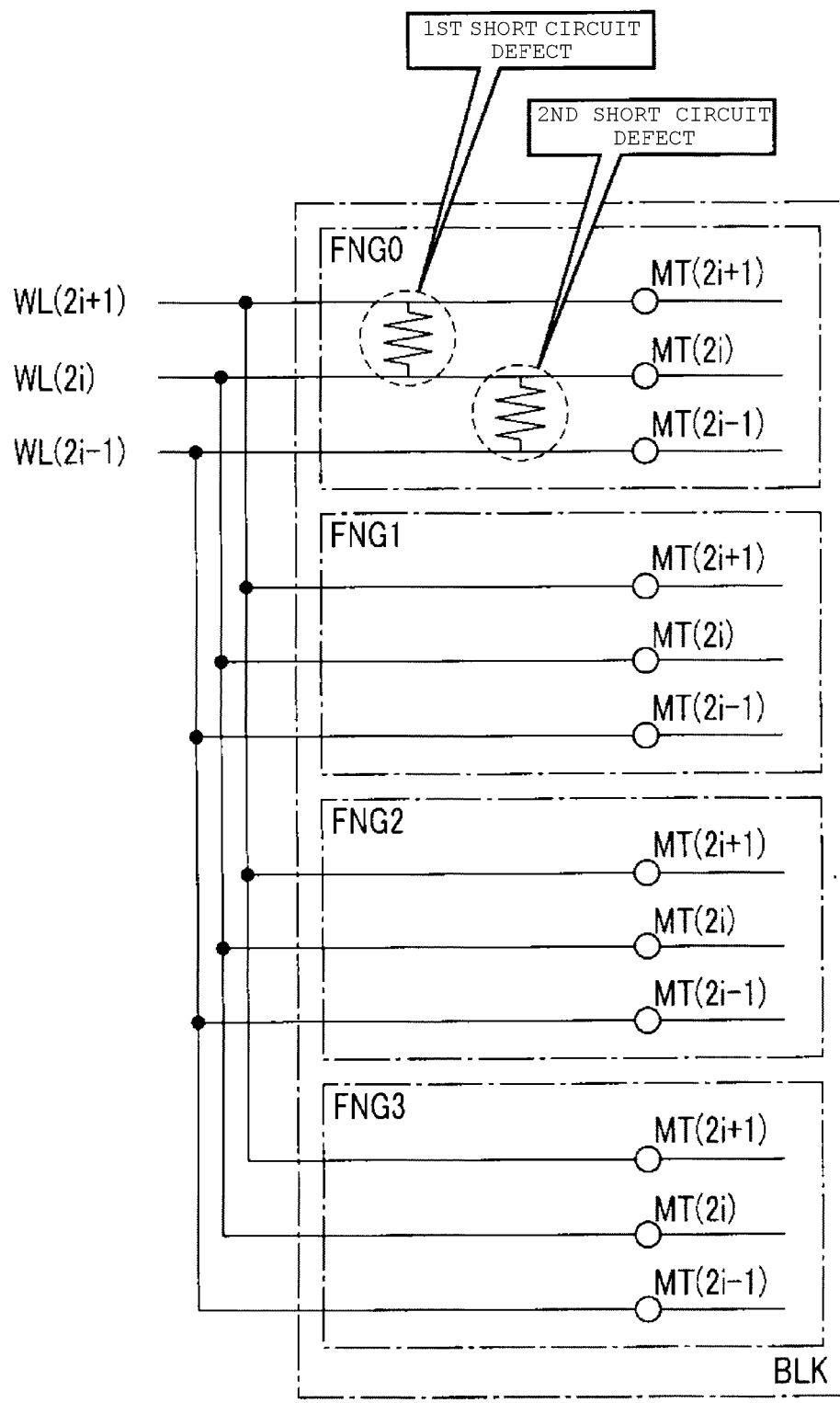
FIG. 33 is a circuit diagram illustrating a memory cell array.

FIG. 33 is a diagram schematically illustrating a memory cell array of a three-dimensional stacked NAND type flash memory. As one of the types of defects which may occur in the NAND type flash memory, there is a short circuit of the word lines WL which are adjacent to each other (hereinafter, simply referred to as a short circuit defect). Unless particular measures are taken, a block BLK in which the short circuit defect occurs is registered in the bad block, and the entire region cannot be used any more.

However, the block BLK in the three-dimensional stacked flash memory is an assembly of the plurality of fingers FNG, and the memory capacity for one block BLK is very large. Accordingly, the bad block caused by a few short circuit defects makes the manufacturing efficiency of the NAND type flash memory to be deteriorated.

There are two types of the short circuit defects in response to the position as illustrated in FIG. 33. One is a short circuit defect between a certain even-number word line WL(2i) and an odd-number word line WL(2i+1) which is adjacent to the even-number word line WL(2i) on the drain side. This is referred to as a first short circuit defect. The other one is a certain even-number word line WL(2i) and an odd-number word line WL(2i+1) which is adjacent to the even-number word line WL(2i) on the source side. This is referred to as a second short circuit defect.

Here, in the exemplary embodiment, in the block BLK in which the first short circuit defect occurs, a certain even-number word line WL(2i) and an odd-number word line WL(2i+1) which is adjacent to the even-number word line WL(2i) in the drain side are controlled as one set. That is, the row type control circuit including the row decoder 120 and the driver circuit 130 commonly controls two word lines WL(2i) and WL(2i+1), and treats these two word lines WL(2i) and WL(2i+1) as one word line. In other words, the same data is retained in each of the memory cell transistors MT(2i) and MT(2i+1) in such a manner that one memory cell transistor MT is formed of these two memory cell transistors MT(2i) and MT(2i+1).

Figure 34:
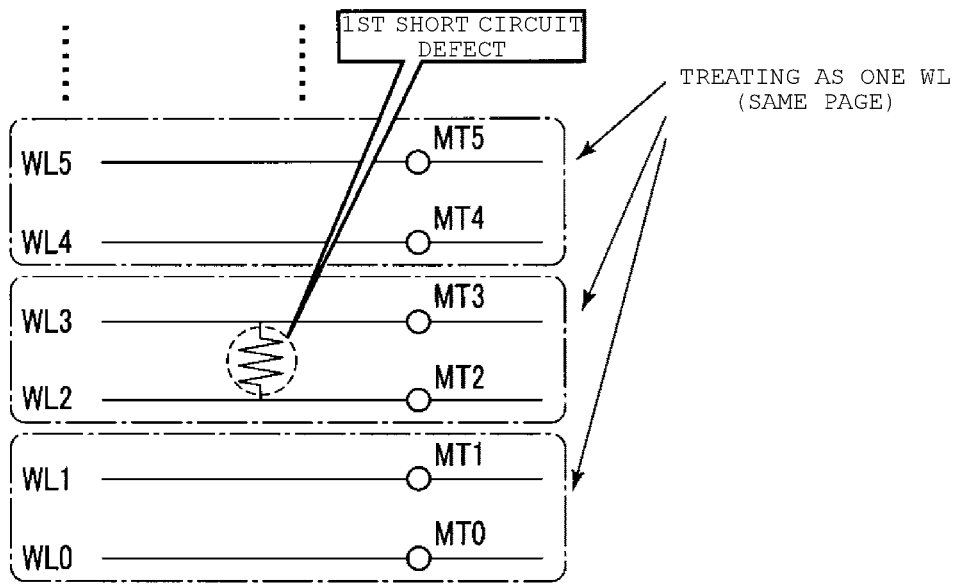
FIG. 34 is a circuit diagram illustrating the memory cell array in the semiconductor memory device according to the first embodiment.

This state is illustrated in FIG. 34. FIG. 34 illustrates an example of a case where the short circuit defect occurs between the word lines WL2 and WL3. In this case, the row type control circuit treats the word lines WL0 and WL1 as one word line, and treats the word lines WL2 and WL3 as one word line, and the same is true for the following the word lines. Therefore, even the word lines WL2 and WL3 in which the short circuit defect occurs may be treated as a normal word line. The block BLK treated as described above is the A-type block.

In the exemplary embodiment, in the block BLK in which the first short circuit defect occurs, a certain even-number word line WL(2i) and an odd-number word line WL(2i−1) which is adjacent to the even-number word line WL(2i) on the source side are controlled as one set. That is, the row type control circuit commonly controls two word lines WL(2i) and WL(2i−1), and treats these two word lines WL(2i) and WL(2i−1) as one word line.

Figure 35:
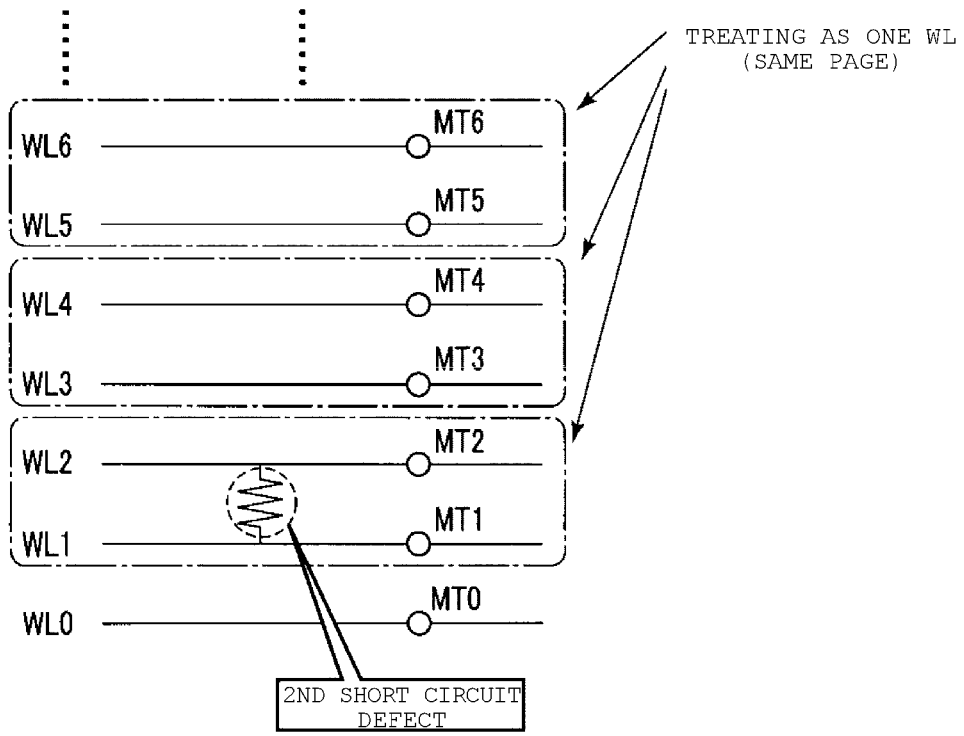
FIG. 35 is a circuit diagram illustrating the memory cell array in the semiconductor memory device according to the first embodiment.

This state is illustrated in FIG. 35. FIG. 35 illustrates an example of a case where the short circuit defect occurs between the word lines WL1 and WL2. In this case, the row type control circuit treats the word lines WL1 and WL2 as one word line. Therefore, the word lines WL1 and WL2 in which the short circuit defect occurs may be treated as a normal word line. The block BLK treated as described above is the B-type block.

According to the exemplary embodiment described above, the row type control circuit controls the block BLK in which the short circuit defect is detected, for every two word lines WL. More specifically, the row type control circuit controls the two word lines WL, in which the short circuit defect is detected, to have the same potentials. In this case, the set of the two word lines WL which are controlled in the same way is changed in response to the position of the short circuit defect. For this reason, the page numbers (a memory capacity) are reduced to be half of that in the case of the normal block, but the block BLK in which the short circuit defect exists may be used without being the bad block. In other words, it is possible to efficiently reduce the short circuit defects, and as a result, it is possible to improve the manufacturing efficiency of the NAND type flash memory.

Meanwhile, in the manufacturing process of the NAND type flash memory, it is possible to detect whether the short circuit defect occurred during the process is the first short circuit defect or the second short circuit defect through a defect detection test. Further, according to the exemplary embodiment, there is no need to specify the position where the short circuit defect occurs as long as it is possible to detect whether the short circuit defect is the first short circuit defect or the second short circuit defect. Therefore, it is possible to realize the exemplary embodiment through a simple test method.

2. Second Embodiment

Next, a semiconductor memory device and a memory system according to the second embodiment will be described. The exemplary embodiment relates to a method of reading block information by the controller 200 in the first embodiment. Hereinbelow, the description will focus on the differences from the first embodiment.

As a method of obtaining the block information by the controller 200, the controller 200 may read the block table, which is read at the time of the power-on read operation, from the NAND type flash memory 100. In addition, as another method, the block information may be read from the latch circuit 40 of the block decoder 20. In the exemplary embodiment, the latter method will be described.

2.1 Method of Reading Block Information

The method of reading block information from the block decoder 20 will be described with reference to FIG. 36. The reading of the block information is performed after the NAND type flash memory 100 is turned on, and, for example, before the first access to the NAND type flash memory 100. In addition, the reading of the block information may be performed while there is no access command from the host apparatus 300.

In addition, the controller 200 retains the block table, for example, in the internal memory 220. Each entry of the block table retains the normal block data "00" for each block as an initial value. In addition, the block table of the internal memory 220 is updated by reading the block information by using the method described below.

As illustrated in the drawings, when the NAND type flash memory 100 is turned on, the controller 200 erases data of the entire blocks BLK in the NAND type flash memory 100 (step S30). As a result, in the memory cell array 110, all bits of data in the region accessible by the controller 200 are set to "1".

Next, the controller 200 performs a first check. That is, the controller 200 accesses the first block BLK among the blocks to be a target for reading the block information at the normal mode (step S31). Specifically, the normal access command is issued so as to read data from the target block BLK without issuing the A mode access command and the B mode access command in the first embodiment. The reading operation at the normal mode is as described with reference to FIG. 15, FIG. 23, and FIG. 24 in the first embodiment.

Meanwhile, the controller 200 reads the first one byte of data (the column address CA="00") on the first page (the page address PA="00") in the target block BLK from the NAND type flash memory 100. Since data in the block BLK is erased in step S30, all bits of the read data is "1", that is, "FFh" is supposed to be read in hexadecimal. Accordingly, the controller 200 determines whether or not "FFh" is correctly read (step S32).

When "FFh" is correctly read (YES in step S32), the controller 200 reads the first one byte of data (the column address CA="00") on the last page (the page address PA="95") in the target block BLK from the NAND type flash memory 100. In addition, the controller 200 determines whether or not "FFh" is correctly read (step S33).

When "FFh" is correctly read (YES in step S33), the controller 200 determines that the corresponding block BLK is the normal block. Accordingly, the block information is determined to be "00", and block information is read from the next block BLK (NO in step S34, and step S35).

When "data" is not correctly read at least one of step S32 and step S33 (NO in step S32 and NO in step S33), the corresponding block BLK is likely to be the block BLK which is not accessible by the normal access command, that is, the A-type block, the B-type block, or the bad block. Thus, the controller 200 performs a next second check. That is, the controller 200 issues the A mode access command described in the first embodiment. Due to this, data is read from the target block BLK by accessing the NAND type flash memory 100 at the A mode (step S36). The reading operation at the A mode is as described with reference to FIG. 18, FIG. 25, and FIG. 26 in the first embodiment. Note that, the case where data is not correctly read includes a case where data other than "FFh" is read, or a case where the reading operation is failed.

The controller 200 reads the first one byte of data on the first page in the target block BLK from the NAND type flash memory 100 and determines whether or not "FFh" is correctly read as read data (step S37)

When "FFh" is correctly read (YES in step S37), the controller 200 reads the first one byte of data on the last page (the page address PA="47") in the target block BLK from the NAND type flash memory 100. In addition, the controller 200 determines whether or not "FFh" is correctly read (step S38).

Through the second check, the upper bit of the block information is determined. That is, when "data" is not correctly read at least one of step S37 and step S38 (NO in step S37 and NO in step S38), the corresponding block BLK is likely to be the block BLK which is not accessible by the A mode access command, that is, the B-type block, or the bad block. Thus, the controller 200 rewrites the upper bit of the block information in the corresponding block BLK to "1" (step S39).

On the other hand, when "FFh" is correctly read (YES in step S37 and YES in step S38), the controller 200 determines that the corresponding block BLK is the A-type block. Accordingly, the upper bit of the block information on the corresponding block is determined to be "0".

Subsequently, the controller 200 performs a third check. That is, the controller 200 issues the B mode access command described in the first embodiment. Due to this, the controller 200 reads data from the target block BLK by accessing the NAND type flash memory 100 at the B mode (step S40). The reading operation at the B mode is as described with reference to FIG. 21 and FIG. 27 in the first embodiment.

The controller 200 reads the first one byte of data on the first page in the target block BLK from the NAND type flash memory 100 and determines whether or not "FFh" is correctly read as read data (step S41).

When "FFh" is correctly read (YES in step S41), the controller 200 reads the first one byte of data on the last page (the page address PA="47") in the target block BLK from the NAND type flash memory 100. In addition, the controller 200 determines whether or not "FFh" is correctly read (step S42).

Through the third check, the lower bit of the block information is determined. That is, when "FFh" is not correctly read at least one of step S41 and step S42 (NO in step S41 and NO in step S42), the corresponding block BLK is likely to be the block BLK which is not accessible by the B mode access command, that is, the A-type block, or the bad block. Thus, the controller 200 rewrites the lower bit of the block information in the corresponding block BLK to "1" (step S43).

On the other hand, when "FFh" is correctly read (YES in step S41 and YES in step S42), the controller 200 determines that the corresponding block BLK is the B-type block. Accordingly, the lower bit of the block information on the corresponding block is determined to be "0".

Through the above-described second check and third check, the upper bit and the lower bit of the block information on the A-type block, the B-type block, and the bad block are determined.

2.2 Specific Example of Method of Reading Block Information

Next, the specific example of the method of reading block information will be described with reference to FIG. 37 to FIG. 40. Each of FIG. 37 to FIG. 40 illustrates the flow of the operation for determining the normal block, the A-type block, the B-type block, and the bad block. In addition, a circle which is added to an arrow from the row decoder 120 to block BLK represents that the transistor 21 is turned on and a proper voltage for reading data is transmitted to the block BLK from the row decoder 120, and an X mark represents that the transistor 21 is turned off, and a proper voltage is not transmitted to the block BLK from the row decoder 120.

2.2.1 Case of Normal Block

First, a case where the block to be checked is the normal block will be described with reference to FIG. 37.

Figure 37:
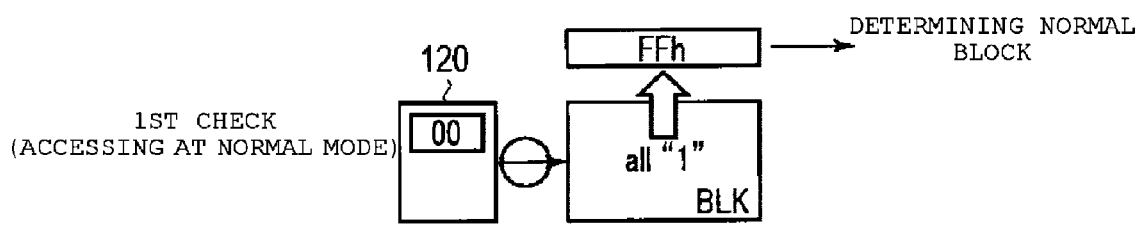
FIG. 37 is a block diagram illustrating the semiconductor memory device according to the second embodiment.

As illustrated in FIG. 37, in the case of the normal block, the corresponding row decoder 120 retains "00" as the block information. Accordingly, it is possible to correctly read data through read access at the normal mode in step S31. As a result, at the time of completing the first check, it is determined that the corresponding block is the normal block.

2.2.2 Case of A-Type Block

Next, a case where the block to be checked is the A-type block will be described with reference to FIG. 38.

Figure 38:
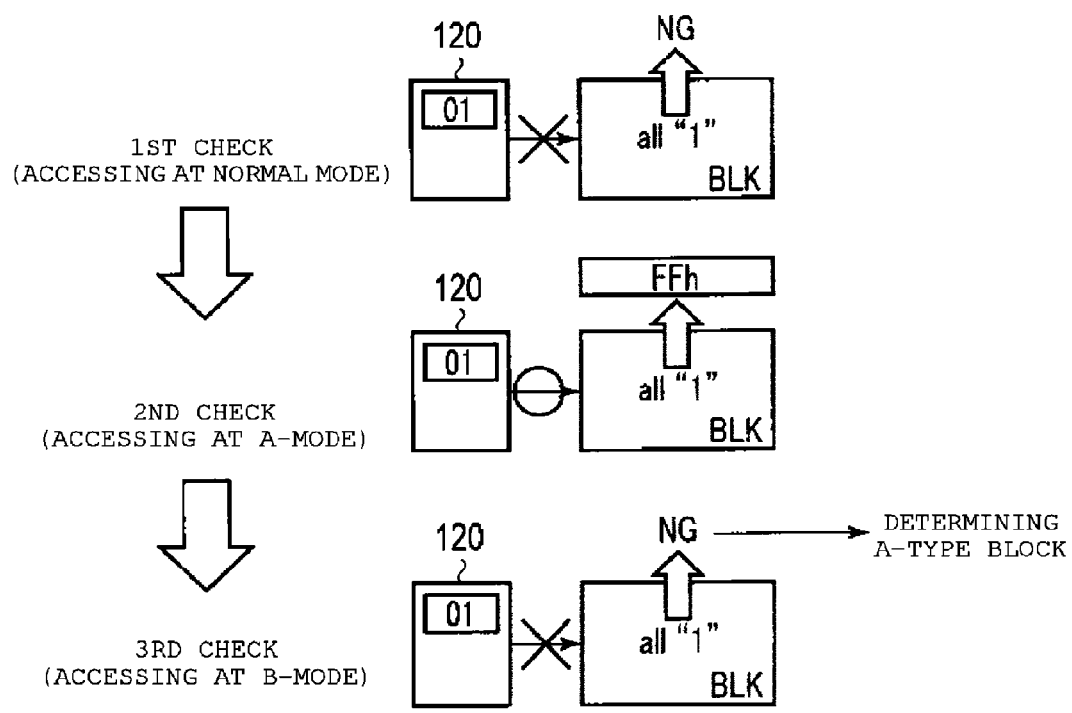
FIG. 38 is a block diagram illustrating the semiconductor memory device according to the second embodiment.

As illustrated in FIG. 38, in the case of the A-type block, the corresponding row decoder 120 retains "01" as the block information. Accordingly, it is not possible to correctly read data in the first check (the read access at the normal mode). More specifically, since the select gate lines SGD and SGS are set to be 0 V, all bits of the read page data become "0".

Next, in the second check (the read access at the A mode), the signal CMD_A is issued by the sequencer 170, and thus it is possible to correctly read data. In addition, in the third check (the read access at the B mode), it is not possible to correctly read data. As a result, the corresponding block is determined to be the A-type block.

2.2.3 Case of B-Type Block

Next, a case where the block to be checked is the B-type block will be described with reference to FIG. 39.

Figure 39:
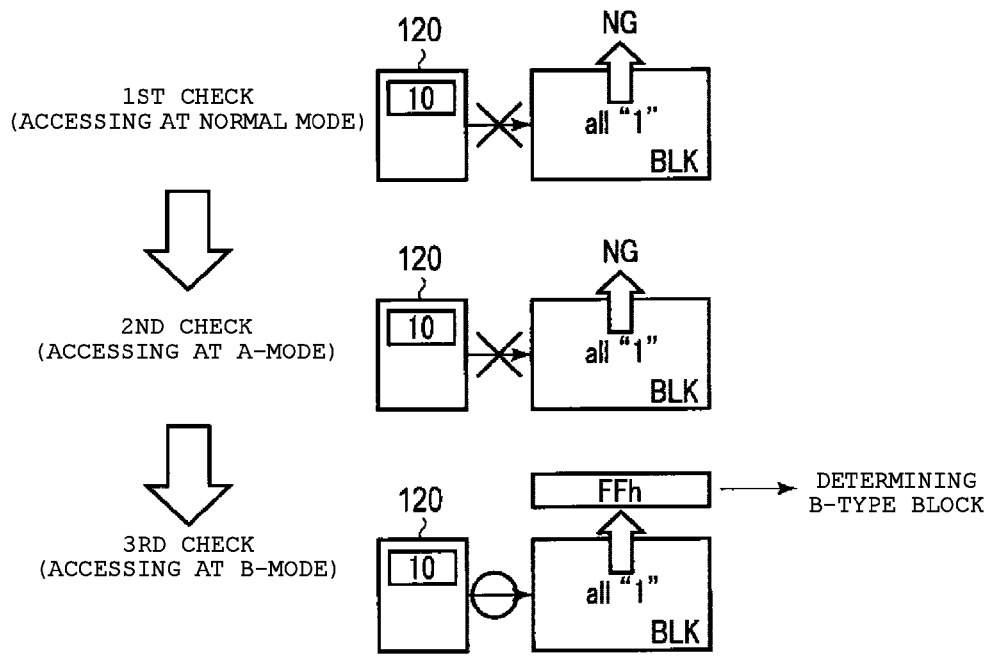
FIG. 39 is a block diagram illustrating the semiconductor memory device according to the second embodiment.

As illustrated in FIG. 39, in the case of the B-type block, the corresponding row decoder 120 retains "10" as the block information. Accordingly, in the first check and second check, it is not possible to correctly read data. In the third check, since the signal CMD_B is issued by the sequencer 170, it is possible to correctly read data. As a result, the corresponding block is determined to be the B-type block.

2.2.4 Case of Bad Block

Next, the case where the block to be checked is the bad block will be described with reference to FIG. 40.

Figure 40:
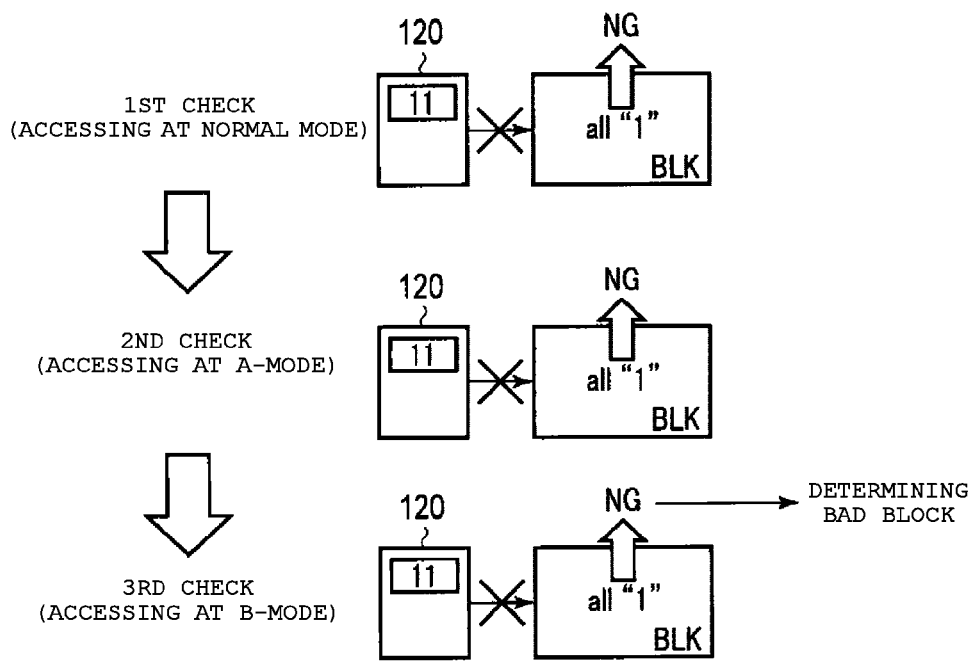
FIG. 40 is a block diagram illustrating the semiconductor memory device according to the second embodiment.

As illustrated in FIG. 40, in the case of the bad block, the corresponding row decoder 120 retains "11" as the block information. Accordingly, the row decoder 120 does not select the corresponding block BLK even through the access methods of the normal mode, the A mode, and the B mode. Therefore, it is not possible to correctly read data through all of the first check to the third check. As a result, the corresponding block is determined as the bad block.

2.3 Effects According to Exemplary Embodiment

As a method of reading the block information from the NAND type flash memory 100 by the controller 200, for example, it is possible to use the method described in the exemplary embodiment.

3. Modification Example or the Like

As described above, the semiconductor memory device according to the exemplary embodiment includes the first block and the second block (the normal BLK and the A-type BLK), and the row control circuit (R/D and Driver). The first block and the second block (the normal BLK and the A-type BLK) are provided with a plurality of memory cell transistors which are capable of saving data. The row control circuit (R/D and Driver) controls the first block at the first mode at the time of the writing and reading data, and controls the second block at the second mode. Each of the first block and the second block includes the first word line (WLn+1) and the second word line (WLn−1), and the third word line (WLn) which is positioned between the first word line (WLn+1) and the second word line (WLn−1). The row control circuit may independently control potentials of the first to third word lines in each of the first block and the second block. In addition, the row control circuit selects the third word line (WLn) and does not select both of the first word line and the second word line (WLn+1 and WLn−1) at the first mode (the normal BLK control). Further, the row control circuit selects both of the first word line and the third word line (WLn and WLn+1), and does not select the second word line (WLn−1) at the second mode (the A-type BLK control).

With such a configuration, even in a case where the short circuit defect occurs in the word line, the word line may be treated as a usable block without causing the block BLK to be the bad block.

Meanwhile, the exemplary embodiment is not limited to the above-described embodiments, various modifications may be employed. For example, in the above-described embodiments, FIG. 33 illustrates the example of two types of short circuit in the word line. However, it is not necessarily limited to the short circuits in the word lines which are adjacent to each other, and for example, the above-described embodiments are applicable to a short circuit defect which occurs between the word line WL(2$i$−1) and WL(2$i$+1) in FIG. 33. Further, the short circuit may occur not only between two word lines, but also, between three or more of word lines, for example. In this case, the same page addresses are allocated to each of the three word lines WL in which the short circuits occurs. In addition, with an increase in the types of the short circuit defects, the block information is also not limited to 2-bit data illustrated in FIG. 10, but may be 3-bit or higher data.

Figure 36:
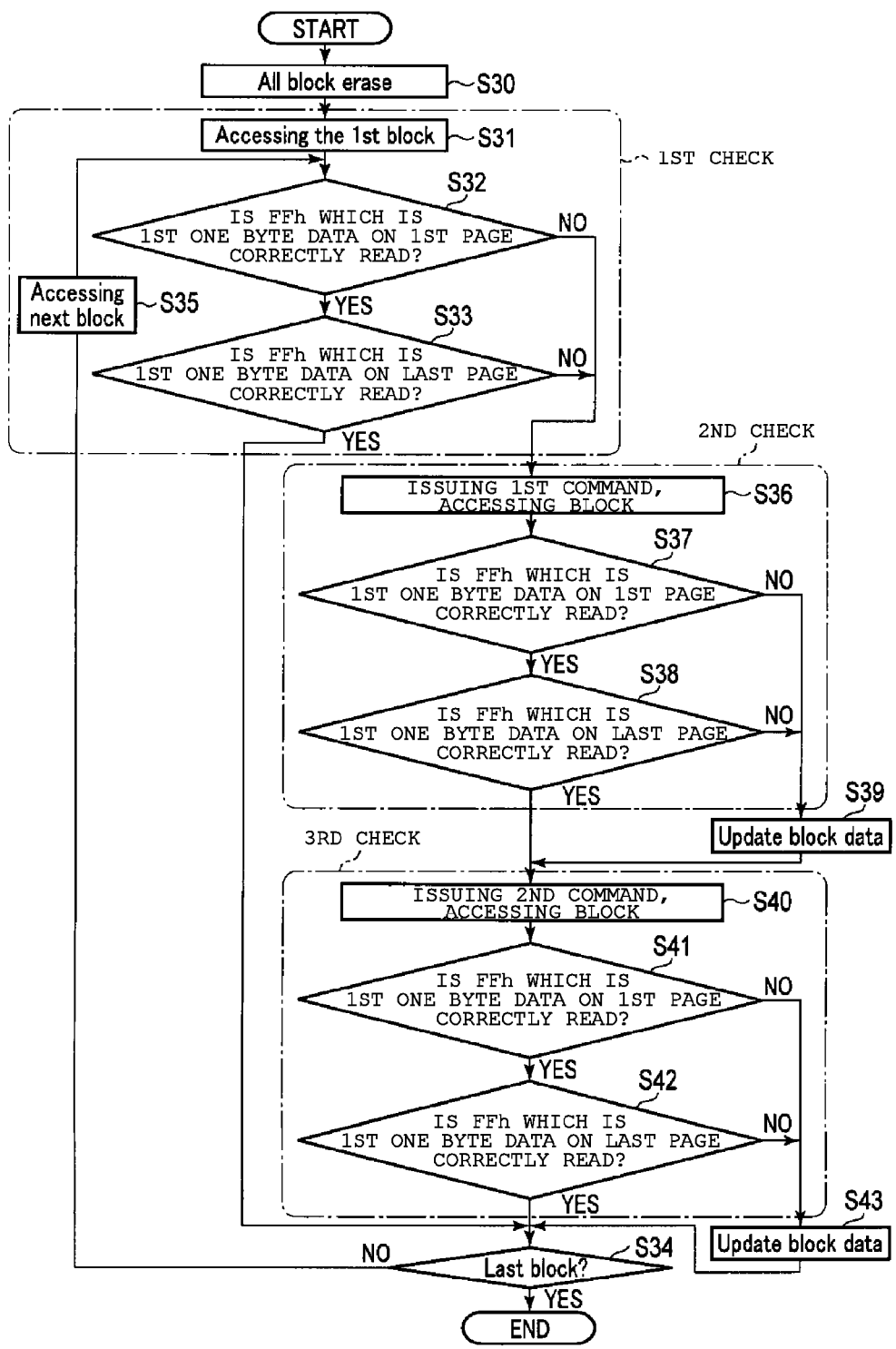
FIG. 36 is a flow chart illustrating a method of reading block information in a semiconductor memory device according to a second embodiment.

Moreover, a flow chart illustrated in FIG. 36 in the second embodiment is also properly modified. For example, in the example of FIG. 36, when checking the block BLK, data read from two pages of the first page and the last page is checked. However, the page number is not necessarily limited to two pages, but data may be read from one of the two pages or three or more pages. In addition, FIG. 36 illustrates an example of checking the first 1 byte data on each page, but this is merely an example. For example, the check for whether or not all bits on one page are "1" may be performed, or the check for less than 1 or 2 or more bytes of data may be performed. In addition, the procedure of the first check to the third check may be properly changed. Further, in the example of FIG. 36, when data is correctly read in the second check, the corresponding block BLK is determined to the A-type block.

Figure 41:
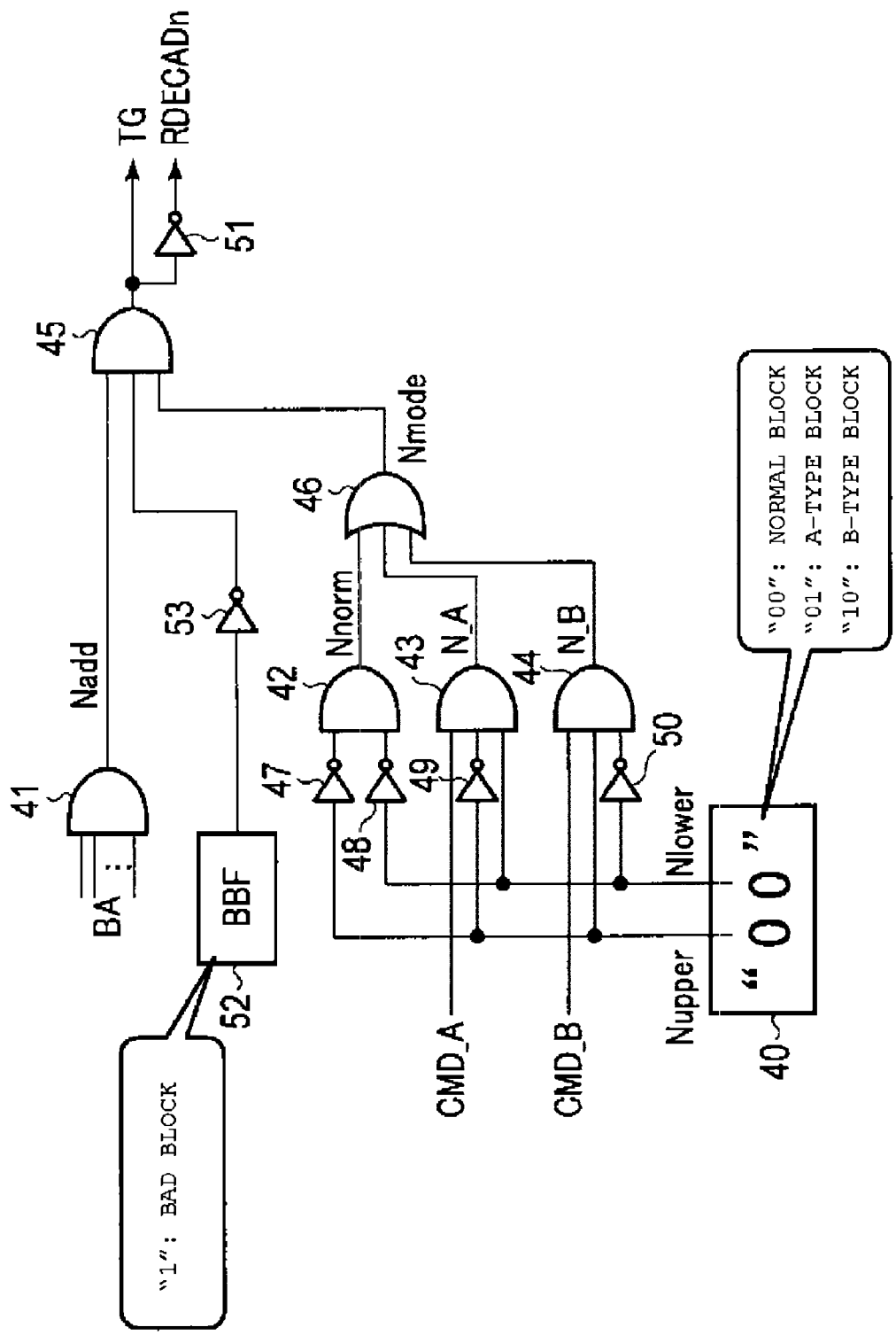
FIG. 41 is a circuit diagram illustrating a block decoder included in a semiconductor memory device according to a modification of the first embodiment and the second embodiment.

Moreover, the configuration of the block decoder 20 is not limited to that illustrated in FIG. 12. For example, in FIG. 12, in addition to the latch circuit 40, the latch circuit which retains a bad block flag indicating the bad block may be provided. Such an example is illustrated in FIG. 41. As illustrated in FIG. 41, the block decoder 20 is further provided with a latch circuit 52 and an inverter 53. The latch circuit 52 retains "1" when the corresponding block BLK is the bad block. Accordingly, in the block decoder 20 corresponding to the bad block, the signal line TG is constantly kept as "L" level.

In addition, the method of allocating page addresses illustrated in FIG. 4 to FIG. 9 is merely an example, other allocating methods may also be applicable. For example, first, the page address may be allocated corresponding to the entire word lines WL of the finger FNG0 and then the page address may be allocated to the word line WL of the finger FNG1.

In addition, the embodiments describe the example of the NAND type flash memory in which the memory cells are the three-dimensionally stacked, but the embodiments are also applicable to a flat-type NAND flash memory in which the memory cells are two-dimensionally arrayed on the semiconductor substrate. The embodiments are also applicable to an FG type in which the charge storage layer is formed of a conductive film without limited to a MONOS type in which the charge storage layer is formed on the insulating film. In addition, the example of the case where one memory cell transistor MT retains 2-bit data is described, but one memory cell transistor MT may retain 1-bit data or 3-bit or more of data.

The procedure of each step in the flow chart illustrated in the above-described embodiments is merely an example, and thus the procedure may be properly changed.

When one memory cell transistor MT retains 2-bit data, the threshold voltage thereof, one out of four types of levels is obtained in response to the retained data. In a case of four types of levels in an order of ascending: an erasing level, an A level, a B level, and a C level, at the time of the reading operation at the A level, the voltage which is applied to the selected word line is, for example, in a range of 0 V to 0.55 V. However, the voltage value is not limited thereto, but may be in a range of 0.1 V to 0.24 V, 0.21 V to 0.31 V, 0.31 V to 0.4 V, 0.4 V to 0.5 V, or 0.5 V to 0.55 V. At the time of the reading operation at the B level, the voltage which is applied to the selected word line is, for example, in a range of 1.5 V to 2.3 V. However, the voltage value is not limited thereto, but may be in a range of 1.65 V to 1.8 V, 1.8 V to 1.95 V, 1.95 V to 2.1 V, or 2.1 V to 2.3 V. At the time of the reading operation at the B level, the voltage which is applied to the selected word line is, for example, in a range of 3.0 V to 4.0 V. However, the voltage value is not limited thereto, but may be in a range of 3.0 V to 3.2 V, 3.2 V to 3.4 V, 3.4 V to 3.5 V, 3.5 V to 3.6 V, 3.6 V to 4.0 V. A reading operation time (tR) may be in a range of, for example, 25 µs to 38 µs, 38 µs to 70 µs, or 70 µs to 80 µs.

The writing operation includes a program operation and verifying operation. In the writing operation, the voltage which is firstly applied to the word line selected at the time of program operation is in a range of, for example, 13.7 V to 14.3 V. However, the voltage value is not limited thereto, but the voltage, which is firstly applied to the selected word line at the time of the writing operation for the odd-number word line, and may be in a range of 13.7 V to 14.0 V, or 14.0 V to 14.6 V, and the voltage, which is firstly applied to the selected word line at the time of the writing operation for the even-number word line may have different values. When the program operation is assumed to be an incremental step pulse program (ISPP), about 0.5 V of voltage may be applied as a step up voltage. The voltage which is applied to the unselected word line is in a range of, for example, 6.0 V to 7.3 V. However, the voltage value is not limited thereto, but may be in a range of 7.3 V to 8.4 V, or may be 6.0 V or lower. A path voltage which is applied to the word line may be differentiated depending on whether the unselected word line is the odd-number word line or the even-number word line. A writing operation time (tProg) may be in a range of, for example, 1,700 µs to 1,800 µs, 1,800 µs to 1,900 µs, or 1,900 µs to 2,000 µs.

In the erasing operation, the voltage which is firstly applied to a well which is disposed on the upper portion of the semiconductor substrate, and on which the memory cells are arranged on the upper side thereof, is in a range of, for example, 12V to 13.6 V. However, the voltage value is not limited thereto, but may be in a range of 13.6 V to 14.8 V, 14.8 V to 19.0V, 19.0V to 19.8V, or 19.8V to 21 V. An erasing operation time (tErase) may be in a range of, for example, 3,000 µs to 4,000 µs, 4,000 µs to 5,000 µs, and 4,000 µs to 9,000 µs.

In addition, the memory cell may have, for example, the following structure. The memory cell includes a charge accumulation film which is disposed on the semiconductor substrate such as a silicon substrate via a tunnel insulating film having the film thickness of 4 nm to 10 nm. The charge accumulation film may be a stacked structure of silicon nitride (SiN) film having the film thickness of 2 nm to 3 nm, an insulating film such as a silicon oxynitride (SiON) film, and a polysilicon (Poly-Si) film having the film thickness of 3 nm to 8 nm. The Polysilicon film may contain metal, for example, ruthenium (Ru). The memory cell includes the insulating film on the charge accumulation film. This insulating film includes, for example, a silicon oxide ($SiO_2$) film having the film thickness of 4 nm to 10 nm, which is interposed between a lower layer High-k film having the film thickness of 3 nm to 10 nm, and an upper layer High-k film having the film thickness of 3 nm to 10 nm. Examples of materials of the High-k film include hafnium oxide (HfO) and the like. In addition, the film thickness of the silicon oxide film may be greater than the film thickness of the High-k film. A control electrode having the film thickness of 30 nm to 70 nm is provided on the insulating film via a film having a film thickness of 3 nm to 10 nm. Here, examples of such a film include a metal oxide film formed of tantalum oxide (TaO), a metal nitride film formed of tantalum nitride (TaN), and the like. As the control electrode, tungsten (W) or the like may be used. It is possible to dispose an air gap between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a block of memory cells including a first memory cell, a second memory cell, and a third memory cell;
a first word line electrically connected to a gate of the first memory cell;
a second word line extending adjacent to the first word line and electrically connected to a gate of the second memory cell;
a third word line extending adjacent to the second word line and electrically connected to a gate of the third memory cell;
a driver configured to supply voltages to the first, second, and third word lines; and
a control circuit coupled to the driver and configured to access the block in a normal mode, a first mode, and a second mode for performing an operation on the block, wherein
when the control circuit accesses the second memory cell of the block in the first mode, the control circuit causes the driver to supply a voltage to the first word line that is the same as a voltage supplied by the driver to the second word line throughout the operation being performed on the block, and when the control circuit accesses the second memory cell of the block in the second mode, the control circuit causes the driver to supply a voltage to the second word line that is the same as a voltage supplied by the driver to the third word line throughout the operation being performed on the block, and when the control circuit accesses the second memory cell of the block in the normal mode, the control circuit causes the driver to supply a voltage to the second word line that is different from a voltage supplied by the driver to the first word line and different from a voltage supplied to the third word line by the driver during at least a part of the operation being performed on the block, the control circuit accesses the block in the normal mode in response to receiving a normal access command, the control circuit accesses the block in the first mode in response to receiving a first access command that is directly followed by the normal access command, and the control circuit accesses the block in the second mode in response to receiving a second access command that is directly followed by the normal access command.

2. The device according to claim 1, wherein
the block of memory cells includes a memory string which includes the first, second, and third memory cells electrically connected in series, the first and second memory cells being adjacent memory cells in the memory string and the second and third memory cells being adjacent memory cells in the memory string.

3. The device according to claim 2, wherein
the first, second, and third memory cells are stacked one above the other on a substrate.

4. The device according to claim 1, further comprising:
a memory region storing a block table that indicates whether the block is to be accessed in the normal mode, the first mode, or the second mode.

5. The device according to claim 4, wherein the block table further indicates whether or not the block is a bad block.

6. The device according to claim 1, wherein
when the control circuit accesses the second memory cell of the block in the first mode, a voltage supplied to the third word line by the driver differs from a voltage supplied to the first and second word lines by the driver during the operation, and when the control circuit accesses the second memory cell of the block in the second mode, a voltage supplied to the first word line by the driver is different from the voltage supplied to the second and third word lines by the driver, at least partially during the operation.

7. The device according to claim 1, wherein the operation includes a read operation.

8. The device according to claim 1, wherein the operation includes a write operation.

9. The device according to claim 8, wherein
the first memory cell, the second memory cell, and the third memory cell are connected to a same bit line, when the control circuit accesses the second memory cell of the block in the first mode, the same data are written in the first memory cell and the second memory cell, and when the control circuit accesses the second memory cell of the block in the second mode, the same data are written in the second memory cell and the third memory cell.

10. The device according to claim 1, wherein the operation includes an erase operation.

11. The device according to claim 1, wherein
a data capacity of the block in the first mode and in the second mode is half a data capacity of the block in the normal mode.

12. The device according to claim 1, wherein
the control circuit is further configured to carry out a first check operation to read data from predetermined memory cells of the block in the normal mode, and set an access mode of the block as the normal mode when data are successfully read from the predetermined memory cells during the first check operation.

13. The device according to claim 12, wherein
the control circuit is further configured to carry out a second check operation to read data from the predetermined memory cells of the block in the first mode, and a third check operation to read data from the predetermined memory cells of the block in the second mode.

14. The device according to claim 13, wherein
the control circuit sets the access mode of the block as the first mode, when data are not successfully read from the predetermined memory cells during the first check operation and the third check operation, and are successfully read from the predetermined memory cells during the second check operation.

15. The device according to claim 14, wherein
the control circuit sets the access mode of the block as the second mode, when data are not successfully read from the predetermined memory cells during the first check operation and the second check operation, and are successfully read from the predetermined memory cells during the third check operation.

16. The device according to claim 15, wherein
the control circuit sets the block as a bad block, when data are not successfully read from the predetermined memory cells during any one of the first check operation, the second check operation, and the third check operation.

* * * * *